United States Patent
Margulies et al.

(10) Patent No.: US 12,239,013 B2
(45) Date of Patent: *Feb. 25, 2025

(54) ORGANIC ELECTROLUMINESCENT DEVICES

(71) Applicant: Universal Display Corporation, Ewing, NJ (US)

(72) Inventors: Eric A. Margulies, Ewing, NJ (US); Zhiqiang Ji, Ewing, NJ (US); Nicholas J. Thompson, Ewing, NJ (US); Geza Szigethy, Newtown, PA (US); Michael S. Weaver, Ewing, NJ (US); Jerald Feldman, Wilmington, DE (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/364,552

(22) Filed: Aug. 3, 2023

(65) Prior Publication Data

US 2023/0380265 A1 Nov. 23, 2023

Related U.S. Application Data

(63) Continuation of application No. 16/158,406, filed on Oct. 12, 2018, now Pat. No. 11,910,702.

(60) Provisional application No. 62/582,359, filed on Nov. 7, 2017.

(51) Int. Cl.

| | |
|---|---|
| H10K 85/30 | (2023.01) |
| H10K 50/11 | (2023.01) |
| H10K 50/125 | (2023.01) |
| H10K 50/13 | (2023.01) |
| H10K 50/17 | (2023.01) |
| H10K 50/18 | (2023.01) |
| H10K 50/81 | (2023.01) |
| H10K 50/82 | (2023.01) |
| H10K 50/15 | (2023.01) |
| H10K 50/16 | (2023.01) |
| H10K 101/10 | (2023.01) |
| H10K 101/30 | (2023.01) |

(52) U.S. Cl.
CPC ........... *H10K 85/351* (2023.02); *H10K 50/11* (2023.02); *H10K 50/125* (2023.02); *H10K 50/131* (2023.02); *H10K 50/171* (2023.02); *H10K 50/18* (2023.02); *H10K 50/81* (2023.02); *H10K 50/82* (2023.02); *H10K 85/342* (2023.02); *H10K 85/346* (2023.02); *H10K 85/348* (2023.02); *H10K 85/371* (2023.02); *H10K 50/15* (2023.02); *H10K 50/16* (2023.02); *H10K 2101/10* (2023.02); *H10K 2101/30* (2023.02)

(58) Field of Classification Search
None
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

(Continued)

*Primary Examiner* — Robert S Loewe
(74) *Attorney, Agent, or Firm* — DUANE MORRIS LLP

(57) ABSTRACT

Provided is an OLED structure includes an organic layer having a primary phosphorescent emitter and a first host; where one of the following conditions is true: (1) the organic layer further includes a secondary emitter; or (2) the OLED further includes a second organic layer where the second organic layer includes a secondary emitter. The primary phosphorescent emitter has a peak emission wavelength $\lambda$max that is $\geq 600$ nm and $\leq 750$ nm; the secondary emitter has a peak emission wavelength $\lambda$max that is $\geq 750$ nm; the primary phosphorescent emitter is capable of transferring energy to the secondary emitter; the first host has a lowest excited state triplet energy T1 that is at least 0.1 eV higher than that of the primary phosphorescent emitter; the primary phosphorescent emitter has the formula $Pt(L^1)_m$; $L^1$ can represent one or more ligands that are the same or different; each $L^1$ is independently monodentate or multidentate; and m represents a maximum possible number of ligands $L^1$ that can coordinate to Pt.

18 Claims, 3 Drawing Sheets

(56) References Cited

U.S. PATENT DOCUMENTS

| | | |
|---|---|---|
| 6,687,266 B1 | 2/2004 | Ma et al. |
| 6,835,469 B2 | 12/2004 | Kwong et al. |
| 6,921,915 B2 | 7/2005 | Takiguchi et al. |
| 7,038,370 B2 | 5/2006 | Mueller-Mach et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 9,911,936 B2 | 3/2018 | Seo et al. |
| 9,978,960 B2 | 5/2018 | Inoue et al. |
| 10,535,830 B2 | 1/2020 | Sasaki et al. |
| 2001/0053462 A1 | 12/2001 | Mishima |
| 2002/0034656 A1 | 3/2002 | Thompson et al. |
| 2002/0125818 A1 | 9/2002 | Sato et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137264 A1 | 7/2004 | Kathirgamanathan et al. |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0074630 A1 | 4/2005 | Kanno et al. |
| 2005/0112407 A1 | 5/2005 | Ogasawara et al. |
| 2005/0238919 A1 | 10/2005 | Ogasawara |
| 2005/0242715 A1 | 11/2005 | Inoue et al. |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0159955 A1 | 7/2006 | Inoue et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0122655 A1 | 5/2007 | Deaton et al. |
| 2007/0190359 A1 | 8/2007 | Knowles et al. |
| 2007/0241667 A1 | 10/2007 | Ohsawa et al. |
| 2007/0273270 A1 | 11/2007 | Jinde |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0076922 A1 | 3/2008 | Inoue et al. |
| 2008/0106190 A1 | 5/2008 | Yabunouchi et al. |
| 2008/0113216 A1 | 5/2008 | Inoue et al. |
| 2008/0124572 A1 | 5/2008 | Mizuki et al. |
| 2008/0220265 A1 | 9/2008 | Xia et al. |
| 2008/0284318 A1 | 11/2008 | Deaton |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2009/0322217 A1 | 12/2009 | Inoue et al. |
| 2010/0133434 A1 | 6/2010 | Meng et al. |
| 2011/0082296 A1 | 4/2011 | Inoue et al. |
| 2011/0245495 A1 | 10/2011 | Inoue et al. |
| 2012/0091923 A1 | 4/2012 | Kastner-Jung et al. |
| 2012/0095226 A1 | 4/2012 | Inoue et al. |
| 2013/0037785 A1 | 2/2013 | Fujita et al. |
| 2013/0168654 A1 | 7/2013 | Fujita et al. |
| 2014/0077172 A1 | 3/2014 | So et al. |
| 2014/0091287 A1 | 4/2014 | Sago |
| 2014/0138663 A1 | 5/2014 | Aratani et al. |
| 2017/0271611 A1 | 9/2017 | Li et al. |
| 2018/0018917 A1 | 1/2018 | Yoo et al. |
| 2018/0261791 A1 | 9/2018 | Yoo et al. |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

(56) References Cited

OTHER PUBLICATIONS

Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Chen, Zhu-Qi et al., "Efficient near-infrared organic light-emitting diodes based on multimetallic assemblies of lanthanides and iridium complexes" Organic Electronics, 2010, pp. 369-376, vol. 11.
Katkova, Marina A. et al., "Near-infrared electroluminescent lanthanide [Pr(III), Nd(III), Ho(III), Er(III), Tm(III), and Yb(III)] N,O-chelated complexes for organic light-emitting devices" J. Mater. Chem, 2011, pp. 16611-16620, vol. 21.
Yang, Yixing et al., "Efficient near-infrared organic light-emitting devices based on low-gap fluorescent oligomers" Journal of Applied Physics, 2009, pp. 044509-1 to 044509-7, vol. 106.
Za'aba, N. K. et al., "A Study on Lanthanide Complexes as a Potential Organic Light Emitting Devices" AIP Conference Proceedings, 2009, 1150, pp. 291-298.
Yan, Fei, et al., "Sensitized infrared electrophosphorescence based on divalent copper complex by an iridium (III) complex." Organic Electronics 10.7 (2009): 1408-1411. (Year: 2009).
Nagata et al., "Near-Infrared Electrophosphorescence up to 1.1 μm using a Thermally Activated Delayed Fluorescence Molecule as Triplet Sensitizer." Advanced materials 29, No. 5 (2017): 1604265. (Year: 2017).

(56) References Cited

OTHER PUBLICATIONS

Li et al. "Near-infrared to visible organic upconversion devices based on organic light-emitting field effect transistors." ACS applied materials & interfaces 9, No. 41 (2017): 36103-36110. (Year: 2017).

ORGANIC ELECTROLUMINESCENT DEVICES

CROSS-REFERENCE TO RELATED APPLICATIONS

This application is continuation of co-pending U.S. patent application Ser. No. 16/158,406, filed on Oct. 12, 2018, which claims priority under 35 U.S.C. § 119(e) to U.S. Provisional Application No. 62/582,359, filed Nov. 7, 2017, the entire contents of which are incorporated herein by reference.

FIELD

The present invention relates to organic light emitting diodes.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted Ir(ppy)$_3$, which has the following structure:

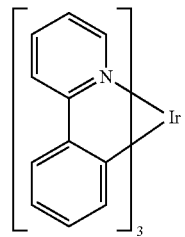

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

Near-infrared (NIR) OLEDs may have a number of applications including imaging, night vision, and medical therapies. While making use of phosphorescence in OLEDs offers a mechanism for greatly improving device efficiencies, fluorescent emitters and lanthanide based emitters may offer some unique advantages in the regime of NIR energy excitons such as shorter excited state lifetimes, higher emission quantum yields, and narrow lineshape emission.

In order to combine the efficiency benefit of phosphorescent OLED materials with the advantages of other emitters, we add to a phosphorescent OLED device structure a secondary NIR emitter wherein the primary phosphorescent emitter acts as a sensitizer to the secondary NIR emitter. The secondary NIR emitter can be a lanthanide complex, an organic fluorophore or a doublet emitter. In this configuration, the emissive layer (EML) of the phosphorescent OLED having a primary phosphorescent emitter dopant may be uniformly or non-uniformly (gradient, bands of varied concentration, etc.) co-doped with the secondary NIR emitter. Alternatively, the secondary NIR emitter can be provided as a separate discrete layer within or adjacent to the EML to which energy transfer may occur.

An OLED comprising an anode, a cathode, and a first organic layer disposed between the anode and the cathode is disclosed. The first organic layer comprises a primary phosphorescent emitter and a first host, and where one of the following conditions is true: (1) the first organic layer further comprises a secondary emitter; or (2) the OLED further comprises a second organic layer disposed between the anode and the cathode, where the second organic comprises a secondary emitter. The phosphorescent emitter has a peak emission wavelength λmax that is ≥600 nm and ≤750 nm. The secondary emitter has a peak emission wavelength λmax that is ≥750 nm. The first host has a lowest excited state triplet energy T1 that is at least 0.1 eV higher than that of the phosphorescent emitter.

A consumer product comprising the OLED is also disclosed.

BRIEF DESCRIPTION OF THE DRAWINGS

The drawings are schematic and the structures in the drawings do not represent dimensions to scale.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
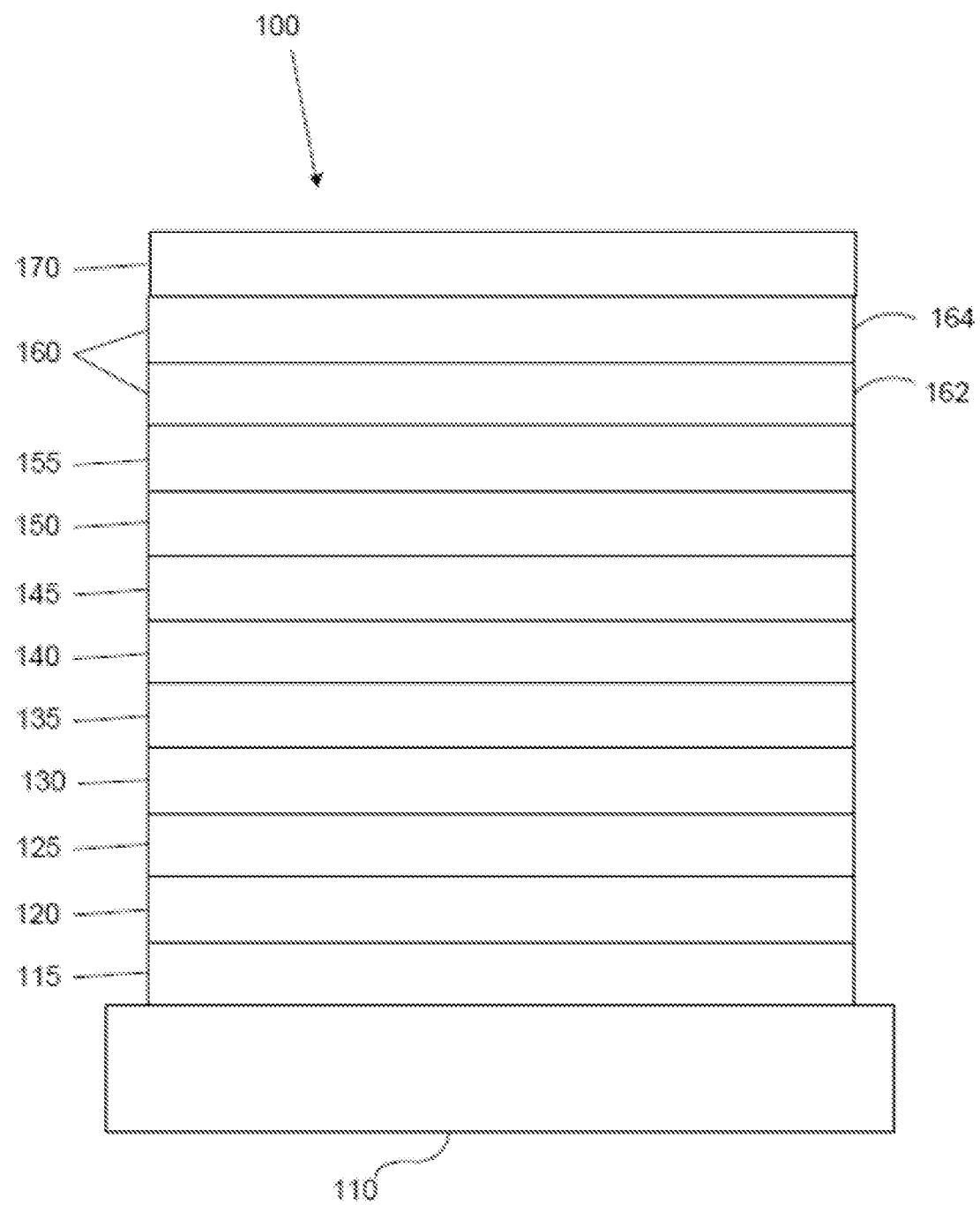
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
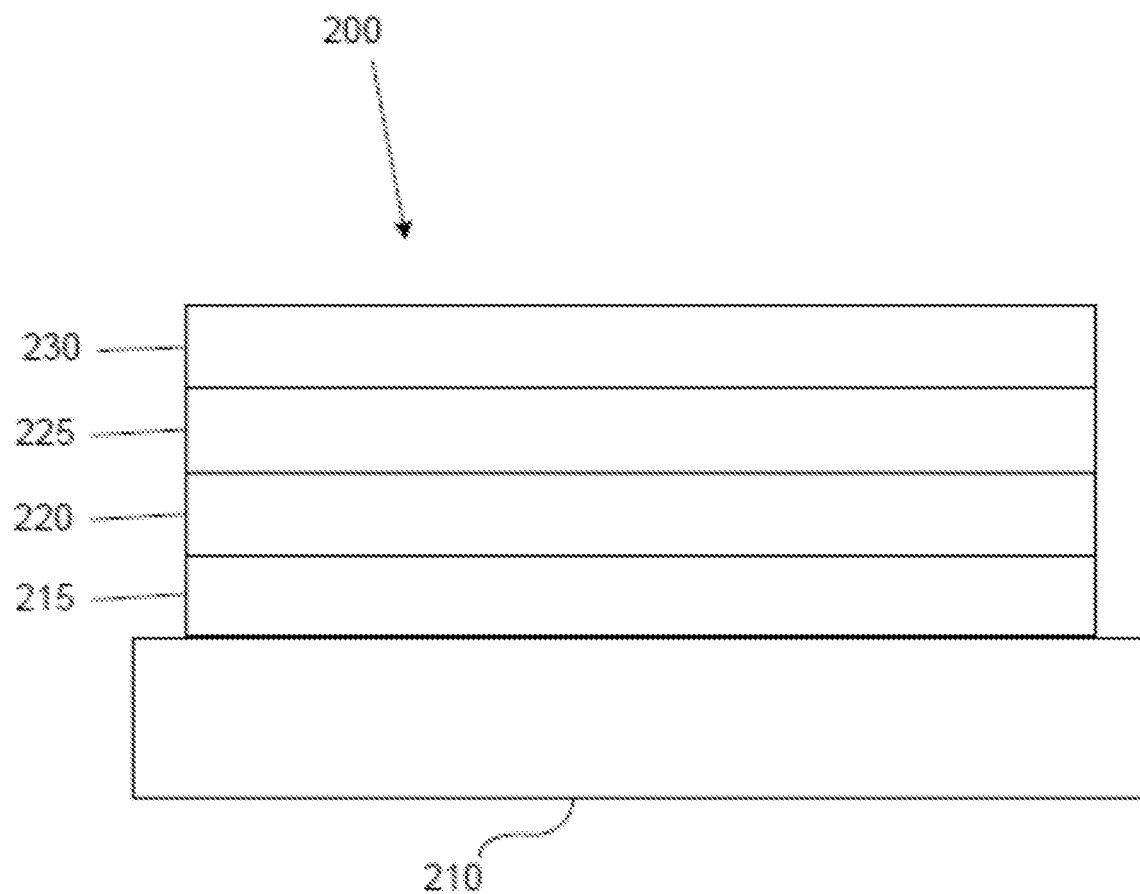
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," or "halide" as used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —O$R_s$ radical.

The terms "sulfanyl" or "thio-ether" are used interchangeably and refer to a —S$R_s$ radical.

The term "sulfinyl" refers to a —S(O)—$R_s$ radical.

The term "sulfonyl" refers to a —$SO_2$—$R_s$ radical.

The term "phosphino" refers to a —P($R_s$)$_3$ radical, wherein each $R_s$ can be same or different.

The term "silyl" refers to a —Si($R_s$)$_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si and Se, preferably, O, S or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si and Se, preferably, O, S or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring hetero-aromatic groups and polycyclic aromatic ring systems that include at least one heteroatom. The heteroatoms include, but are not limited to O, S, N, P, B, Si and Se. In many instances, O, S or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted or substituted with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed. (Reviews)* 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the OLED disclosed herein, the organometallic based primary phosphorescent emitter acts as a charge trap and thus a preferential site for the formation of excitons. These excitons then transfer their energy to the secondary NIR emitter by either Forster or Dexter energy transfer, depending on the emission mode of the secondary NIR emitter.

When the secondary NIR emitter is comprised of a lanthanide ligand field emitter, direct Dexter energy transfer from the primary phosphorescent emitter to the ligand and/or the f-orbitals of the lanthanide complex ultimately results in a lanthanide f-orbital centered exciton which may act as the effective emission state. In this OLED structure, the energy transfer of the primary phosphor exciton to the secondary NIR emitter must be an energetically favorable process. As such, the primary phosphorescent emitter may have an excited state energy in the visible, preferably in the red (600 nm$\leq \lambda_{max} \leq$750 nm), range.

More specifically, regarding the case where the secondary NIR emitter is a lanthanide compound, and the emissive layer comprises at least three components including host material(s), the first transition metal phosphorescent compounds ($M^1L^1_n$) as the primary phosphorescent emitter, and the second transition metal compounds ($M^2L^2_n$) as the secondary NIR emitter. The first metal $M^1$ is selected from a group consisting of Os, Ir, Pd, Pt, Cu, Ag, and Au and the second metal $M^2$ is selected from lanthanide elements. The first transition metal phosphorescent compound will have a lowest triplet excited state energy T1 that is equal to or higher in energy than the energy of the emissive f-f transition, $E_{(f-f)}$, of the second transition metal compound. The exciton formed on the first transition metal compound will transfer energy, most likely through a Dexter process, forming the excited state of the second transition metal compound. This device architecture enables a complete or near complete energy transfer from the primary emitter to the secondary NIR emitter. The lanthanide compound, the second transition metal compound, acts as the emitter in the OLED device.

The energy of the emissive f-f transition, $E_{(f-f)}$, of the lanthanide compounds are shown in Table 1. In the last column of Table 1, the f-f transition energy is given in nms which is also the emission wavelength.

TABLE 1

| Ln metal | f-f transition | | | |
| --- | --- | --- | --- | --- |
| | Excited state | Final state | $E_{(f-f)}$ (eV) | $E_{(f-f)}$ (nm) |
| Gd | $^6P_{7/2}$ | $^8S_{7/2}$ | 3.97 | 312 |
| Tb | $^5D_4$ | $^7F_6$ | 2.25 | 551 |
| Dy | $^4F_{9/2}$ | $^6H_{13/2}$ | 2.18 | 569 |
| Sm | $^4G_{5/2}$ | $^6H_{5/2}$ | 2.10 | 590 |
| Eu | $^5D_0$ | $^7F_0$ | 2.02 | 614 |
| Ho | $^5F_5$ | $^5I_8$ | 1.28 | 969 |
| Yb | $^2F_{5/2}$ | $^2F_{7/2}$ | 1.22 | 1016 |
| Nd | $^4F_{3/2}$ | $^4I_{11/2}$ | 1.17 | 1060 |
| Pr | $^1G_4$ | $^3H_6$ | 0.95 | 1305 |
| Er | $^4I_{13/2}$ | $^4I_{15/2}$ | 0.81 | 1531 |

When the secondary NIR emitter is comprised of a NIR fluorophore (such as cyanine, phthalocyanine, porphyrin, rhodamine or other classes of NIR emitters) the primary phosphor must preferably transfer its energy to the secondary NIR emitter via Forster energy transfer to avoid populating the fluorophore triplet state which would result in wasted non-emissive excited states. This condition requires the optimization of (i) the spectral overlap between the emission spectrum of the primary phosphorescent emitter and the absorption spectrum of the secondary NIR emitter and (ii) steric (molecular) and/or device optimization of the binary emitter system to prevent unwanted Dexter energy transfer.

In most cases, the spectral overlap condition of the primary phosphorescent emitter and the secondary NIR emitter would require a red phosphorescent emitter for the primary phosphorescent emitter. A secondary NIR (fluorescent) emitter with a relatively small (<50 nm) Stokes shift, such as a cyanine dye, with an absorption $\lambda_{max}$ between 750 nm and 850 nm and absorption tailing into the red (600-650 nm) is expected to be appropriately matched with a red phosphorescent emitter (emission $\lambda_{max}$ in this regime) for efficient Forster energy transfer. However, for any given NIR emitter the primary phosphorescent red emitter may require optimization for efficient energy transfer. It is preferred that the primary phosphorescent emitter emission $\lambda_{max}$ be shifted from the secondary NIR emitter's absorption $\lambda_{max}$ by less than 200 nm, and more preferably less than 150 nm.

In the case of a fluorescent emitter as the secondary NIR emitter, additional molecular and/or device precautions may need to be taken to avoid Dexter energy transfer in order to prevent detrimental formation of fluorophore triplet excitons. Such precautions may include large bulky substituents (iso-propyl, neo-pentyl, tert-butyl, adamantyl, etc.) on either primary or secondary emitter to increase primary-to-secondary emitter distance and minimize wavefunction overlap necessary for Dexter energy transfer. Such bulky substituents are particularly useful on the secondary NIR emitter so as to not disrupt charge transport, voltage, and other device properties of the EML and to electronically isolate the secondary NIR emitter from the EML system. Bulky substituents may be particularly impactful in preventing Dexter energy transfer when added directly to the $\pi$-system of the emitter so as to prevent $\pi$-orbital overlap.

As the rate of Dexter energy transfer is proportional to $e^{-r}$ where r is the donor-acceptor radius (the distance between two adjacent a primary phosphorescent emitter to a secondary NIR emitter, in this case), this process may also be mitigated by decreased doping of the secondary NIR emitter or selective doping of the secondary NIR emitter away from the charge recombination zone (e.g. preferentially on ETL side of EML). These device structures would increase effective emitter distance and reduce the rate of unwanted Dexter energy transfer.

Decreasing the rate of Dexter energy transfer through physically separating the two emitters can be achieved through three strategies: (A) spatially isolating the primary and secondary emitters by restricting the emitters to separate layers during device fabrication; (B) judicious choice of emitter doping percentages or concentrations to statistically minimize the probability of the primary and secondary emitters being within the Dexter energy transfer radius; and (C) by introducing enough non-conjugated steric bulk to one or both of the emitters to sterically prevent the emitters from being within the Dexter energy transfer radius.

In case (A), the physical separation arises from the inclusion of the primary and secondary emitters in different layers of the device. Here, the two emissive layers (one containing the primary phosphorescent emitter material and the other containing the secondary NIR emitter material) are separated by one or more layers of host or transport materials to achieve an interlayer separation distance of greater than 1 nm, more preferably greater than 2 nm, and more preferably greater than 4 nm.

In cases (B) and (C), the primary and secondary emitters are doped in the same layer and the physical separation between the primary and secondary emitters can be described by the distance between the aromatic π-systems of the two emitters, i.e. the donor-acceptor radius r. In order to minimize Dexter energy transfer, r is preferably greater than 8 Å, more preferably greater than 10 Å, and more preferably greater than 12 Å.

In case (C), where this is achieved by controlling the composition of a co-doped layer, the distance, r, should be predominantly governed by the concentration of the most abundant of the two dopants. Assuming a uniform distribution of dopants within the host matrix and a hexagonal close packed structure, the concentration of both dopants should be less than 10%, more preferably less than 5%, and more preferably less than 3%. It is also advantageous to have one dopant less abundant than the majority dopant.

In case (C), where the intramolecular separation arises from pendant steric bulk on one or both dopants, the spacing afforded by the steric bulk can be roughly described by the difference in distance from the dopant's center of mass to: (a) the farthest aromatic carbon or heteroatom in the dopant; and (b) the farthest non-aromatic atom in the dopant. When only one of the two dopants has this pendant steric bulk, this difference in radial distances, d, is representative of the inter-molecular distance afforded by the bulk. When both dopants have pendant steric bulk, the intermolecular distance is roughly equal to the sum $d_1+d_2$, wherein $d_1$ is the difference in distance from the first dopant's center of mass to (a) and (b), and $d_2$ is the difference in distance from the second dopant's center of mass to (a) and (b). In order to prevent Dexter energy transfer, d or $d_1+d_2$ should be greater than 8 Å, more preferably greater than 10 Å, and more preferably greater than 12 Å.

In the case of a secondary NIR emitter wherein the excited state is a spin ½ doublet state, energy transfer to this emitter may proceed through either Dexter or Forster mechanisms as the doublet emitter does not suffer from the formation of exciton states with spin-forbidden emission. As such, a doublet emitter may be included in a device structure that promotes either Dexter or Forster energy transfer.

An OLED comprising an anode, a cathode, and a first organic layer disposed between the anode and the cathode is disclosed. The first organic layer comprises a primary phosphorescent emitter and a first host, and where one of the following conditions is true: (1) the first organic layer further comprises a secondary emitter; or (2) the OLED further comprises a second organic layer disposed between the anode and the cathode, where the second organic layer comprises a secondary emitter. The phosphorescent emitter has a peak emission wavelength λmax that is ≥600 nm and ≤750 nm. The secondary emitter has a peak emission wavelength λmax that is ≥750 nm. The first host has a lowest excited state triplet energy T1 that is at least 0.1 eV higher than that of the phosphorescent emitter.

In embodiments where condition (1) is true, the emissive layer comprises at least three components including host material(s), the primary phosphorescent emitter that is a first transition metal compound ($M^1L^1_n$), and the secondary NIR emitter comprised of one of the following: a second transition metal compound ($M^2L^2_n$), an organic fluorophore, or an organic doublet emitter. In the case of the secondary NIR emitter being a second transition metal compound, the metal $M^2$ is selected from lanthanide elements. The disclosed OLED is useful especially for NIR application. The primary phosphorescent emitter acting as a sensitizer to the secondary NIR emitter refers to the fact that the primary phosphorescent emitter acts as an exciton formation site to make use of the advantageous properties of a phosphorescent OLED stack and allow for incorporation in a larger OLED based display. Where the primary phosphorescent emitter and the secondary NIR emitters are co-doped in an OLED's EML, the energy transfer from the primary phosphorescent emitter sensitizer to the secondary NIR emitter proceeds through a Dexter energy transfer mechanism. Where the primary phosphorescent emitter and the secondary NIR emitter are provided in separate layers, the energy transfer from the primary phosphorescent emitter sensitizer to the secondary NIR emitter proceeds through a Forster energy transfer mechanism and unwanted Dexter energy transfer is reduced.

In some embodiments of the OLED, the condition (1) is true, and the first organic layer is the only layer containing the secondary emitter. In some embodiments of the OLED, the condition (2) is true, and the second organic layer is the only layer containing the secondary emitter.

In some embodiments of the OLED, the condition (2) is true and the second organic layer further comprises a second host.

In some embodiments of the OLED, the secondary emitter has a peak absorption wavelength and the difference between the peak emission wavelength $\lambda_{max}$ of the phosphorescent emitter and the peak absorption wavelength $\lambda_{max}$ of the secondary emitter is less than 200 nm.

In some embodiments of the OLED, the secondary emitter has a peak absorption wavelength and the difference between the peak emission wavelength $\lambda_{max}$ of the phosphorescent emitter and the peak absorption wavelength $\lambda_{max}$ of the secondary emitter is less than 150 nm.

In some embodiments where the condition (2) is true, the first organic layer and the second organic layer are separated by one or more additional organic layers. In some embodiments, at least one of the additional organic layers can include a third host. In some embodiments, the first, second, and third hosts can be the same or different from each other.

Figure 3:
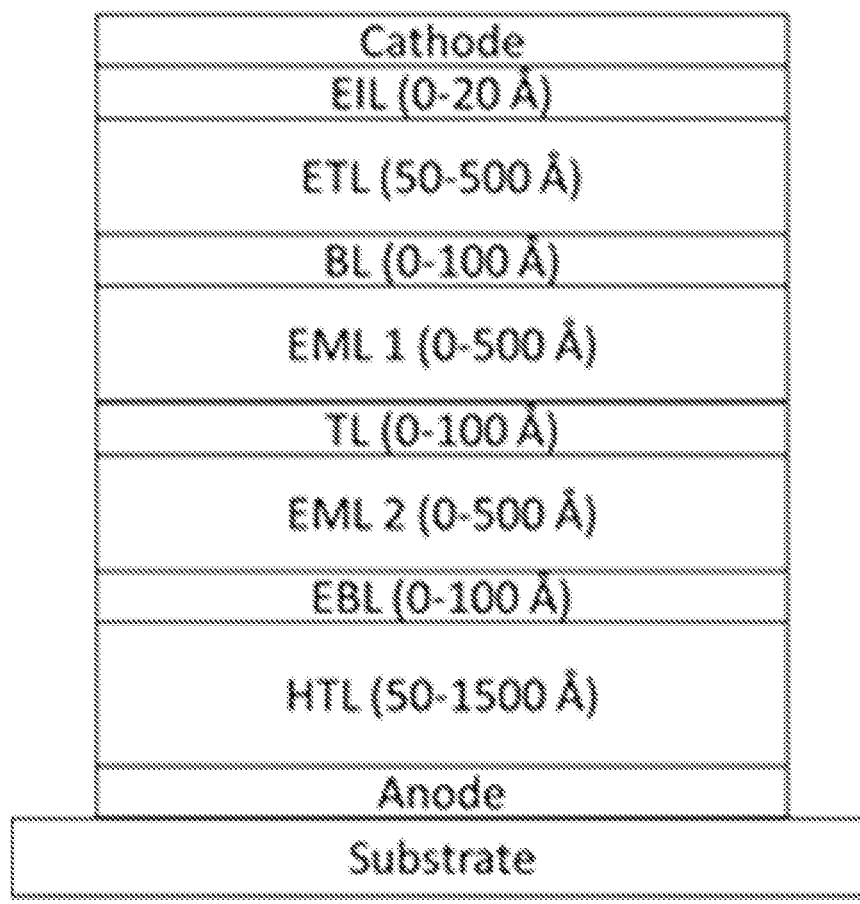
FIG. 3 shows an example OLED stack incorporating separate emissive layers to physically separate the primary and secondary emitters.

In some embodiments where the condition (2) is true, and the first organic layer and the second organic layer are separated by one or more additional organic layers, at least one of the additional organic layers comprises a charge transport material. In some embodiments, the separation between the first organic layer and the second organic layer is ≥1 nm. In some embodiments, the separation between the first organic layer and the second organic layer is ≥2 nm. In some embodiments, the separation between the first organic layer and the second organic layer is ≥4 nm. FIG. 3 shows an example of such an OLED stack 300. In the OLED stack 300, the first organic layer containing the primary emitter is the EML 1 and the second organic layer containing the secondary NIR emitter is the EML 2. The one or more additional organic layers, such as a charge transport material layer, separating the first organic layer and the second organic layer is shown in the OLED stack 300 as TL layer of 0-100 Å thick. In FIG. 3, the thicknesses of EML 1 and EML 2 are labeled as (0-500 Å) to show the maximum thickness of 500 Å. For example, in the embodiment where the OLED has both EML 1 (containing the primary emitter) and EML 2 (containing the secondary NIR emitter), their thicknesses would be something greater than 0 and up to 500 Å thick. The thicknesses of the EIL (electron injection layer), ETL (electron transport layer), BL (hole blocking layer), TL (charge transport layer), and EBL (electron blocking layer) are shown with a thickness range with the bottom end of the range as "0" because these functional layers are optional layers and in some embodiments of the OLED stack, one or more of these layers do not exist. The HTL (hole transport layer) has a thickness range of 50-1500 Å. The OLED further comprises a second organic layer comprising a secondary emitter.

In some embodiments of the OLED where the condition (1) is true, concentration of the phosphorescent emitter and concentration of the secondary emitter in the first organic layer are different. In some embodiments, concentration of the phosphorescent emitter and concentration of the secondary emitter in the first organic layer are each ≤10 wt. %. In some embodiments, concentration of the phosphorescent emitter and concentration of the secondary emitter in the first organic layer are each ≤5 wt. %. In some embodiments, concentration of the phosphorescent emitter and concentration of the secondary emitter in the first organic layer are each ≤3 wt. %. In some embodiments, an average intermolecular distance between the phosphorescent emitter and the secondary emitter is ≥8 Å. In some embodiments, an average intermolecular distance between the phosphorescent emitter and the secondary emitter is ≥10 Å. In some embodiments, an average intermolecular distance between the phosphorescent emitter and the secondary emitter is ≥12 Å.

In some embodiments of the OLED, the phosphorescent emitter has the formula $M^1L^1_m$; where $M^1$ is selected from the group consisting of Os, Ir, Pd, Pt, Cu, Ag, and Au; where $L^1$ can represent one or more ligands that are the same or different; where each $L^1$ is independently monodentate or multidentate; and where m represents a maximum possible number of ligands $L^1$ that can coordinate to $M^1$.

In some embodiments of the OLED, the secondary emitter has the formula $M^2L^2_n$, where $M^2$ is selected from the group consisting of the lanthanide metals, where $L^2$ represents one or more ligands that are the same or different, where each $L^2$ is independently monodentate or multidentate, and where n represents a maximum possible number of $L^2$ ligands that can coordinate to $M^2$.

In some embodiments of the OLED, the secondary emitter is selected from the group consisting of a fluorescent emitter, a thermally activated delayed fluorescence emitter, and an emitter containing an unpaired electron in its ground state.

In some embodiments of the OLED where the phosphorescent emitter has the formula $M^1L^1_m$ as defined above, $M^1$ is selected from the group consisting of Pt and Ir. In some embodiments, where the phosphorescent emitter has the formula $M^1L^1_m$ as defined above, the phosphorescent emitter has a formula of $M^1(L_A)_x(L_B)_y(L_C)_z$; wherein $L_A$, $L_B$, and $L_C$ are each a bidentate ligand; and wherein x is 1, 2, or 3; y is 0, 1, or 2; z is 0, 1, or 2; and x+y+z is the oxidation state of the metal M.

In some embodiments of the OLED wherein the secondary emitter has the formula $M^2L^2_n$ as defined above, the phosphorescent emitter has a lowest triplet energy, T1, that is the same or higher than the energy of the emissive f-f transition, $E_{f-f}$, of the secondary emitter. In some embodiments, $M^2$ is selected from the group consisting of Eu, Nd, Yb, and Er.

In some embodiments of the OLED where the phosphorescent emitter has a formula of $M^1(L_A)_x(L_B)_y(L_C)_z$ as defined above, the phosphorescent emitter has a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein $L_A$, $L_B$, and $L_C$ are different from each other.

In some embodiments of the OLED where the phosphorescent emitter has a formula of $M^1(L_A)_x(L_B)_y(L_C)_z$ as defined above, the phosphorescent emitter has a formula of $Pt(L_A)(L_B)$; and wherein $L_A$ and $L_B$ can be same or different. In some embodiments, $L_A$ and $L_B$ are connected to form a tetradentate ligand. In some embodiments, $L_A$ and $L_B$ are connected at two places to form a macrocyclic tetradentate ligand.

In some embodiments of the OLED where the phosphorescent emitter has a formula of $M^1(L_A)_x(L_B)_y(L_C)_z$ as defined above, $L_A$, $L_B$, and $L_C$ are each independently selected from the group consisting of:

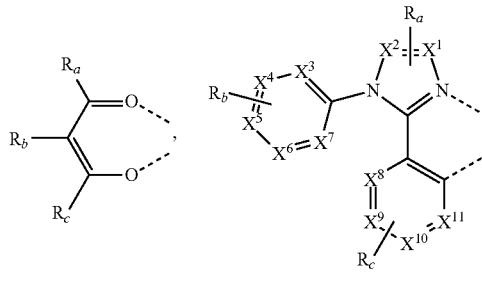

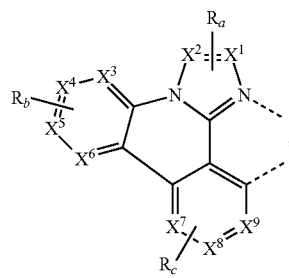

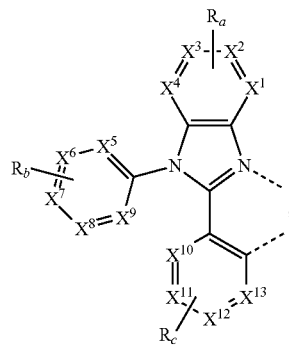

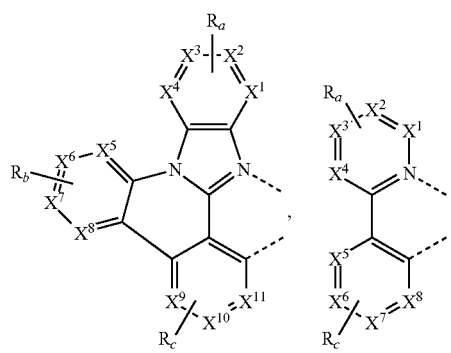

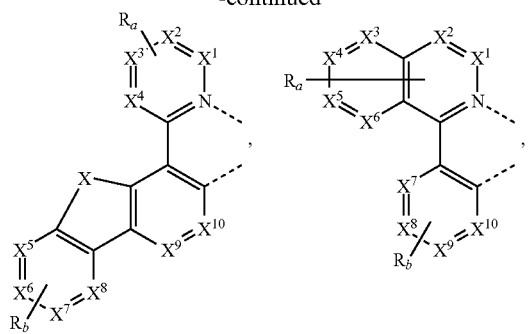

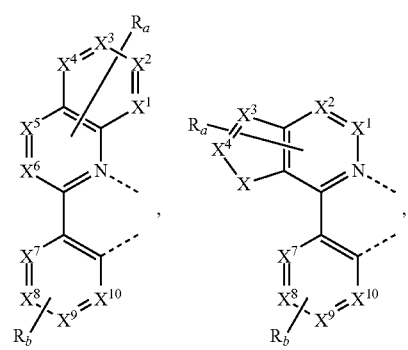

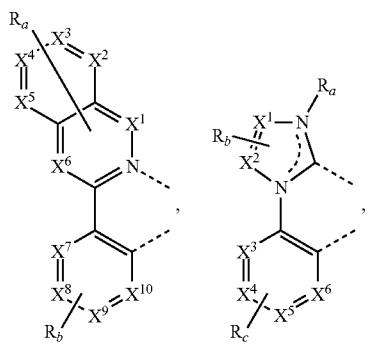

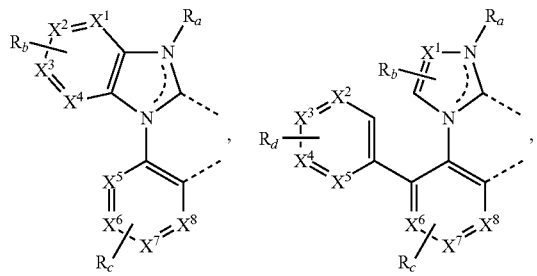

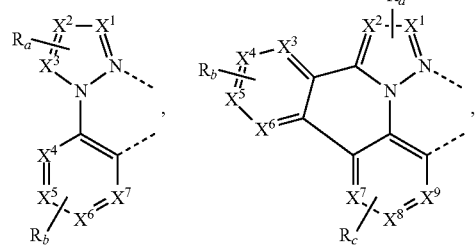

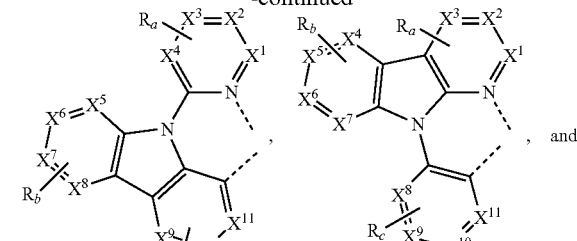

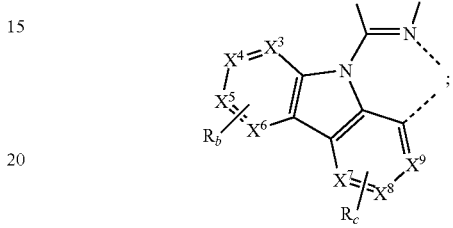

wherein each $X^1$ to $X^{13}$ are independently selected from the group consisting of carbon and nitrogen; wherein X is selected from the group consisting of BR', NR', PR', O, S, Se, C=O, S=O, SO$_2$, CR'R", SiR'R", and GeR'R"; wherein R' and R" are optionally fused or joined to form a ring; wherein each $R_a$, $R_b$, $R_c$, and $R_d$ can represent from mono substitution to the possible maximum number of substitution, or no substitution; wherein R', R", $R_a$, $R_b$, $R_c$, and $R_d$ are each independently a hydrogen or a substitutent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, benzonitrile, isonitrile, sulfanyl, sulfinyl, sulfonyl, phosphino, and combinations thereof; and wherein any two adjacent substitutents of $R_a$, $R_b$, $R_c$, and $R_d$ are optionally fused or joined to form a ring or form a multidentate ligand. In some embodiments, $L_A$ and $L_B$ are each independently selected from the group consisting of:

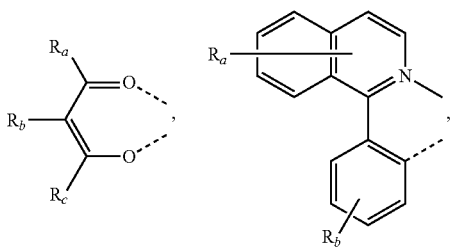

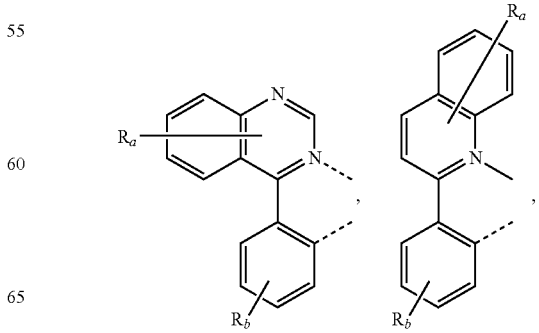

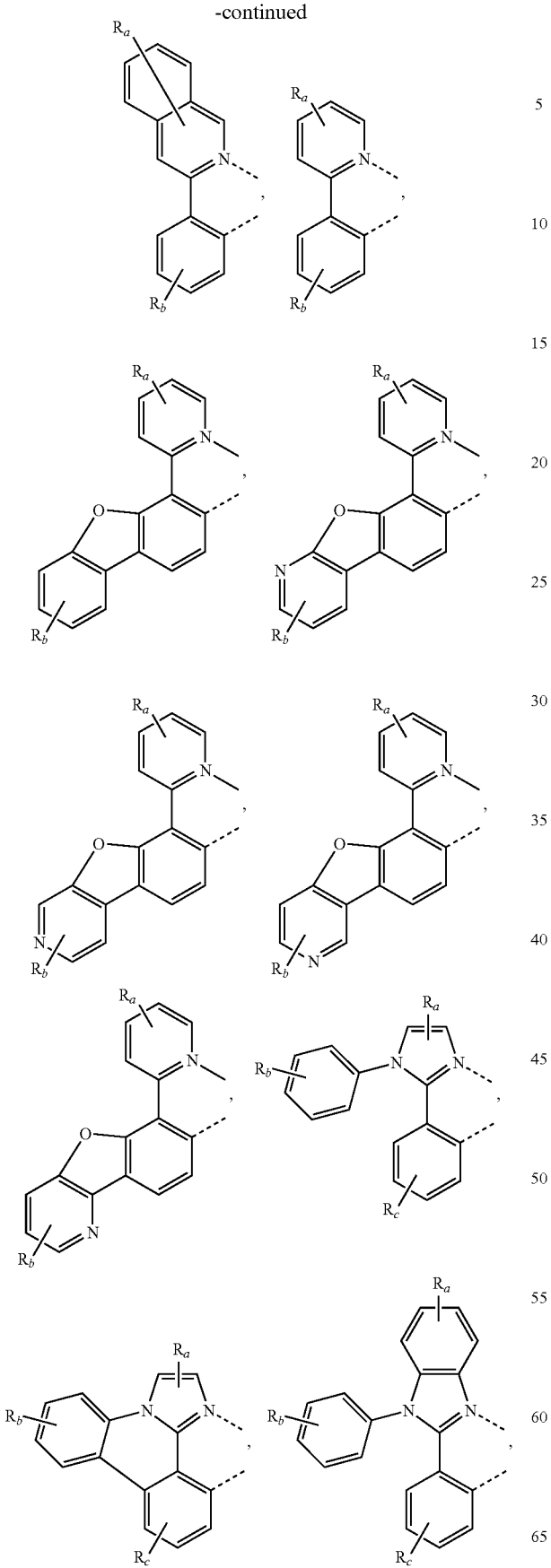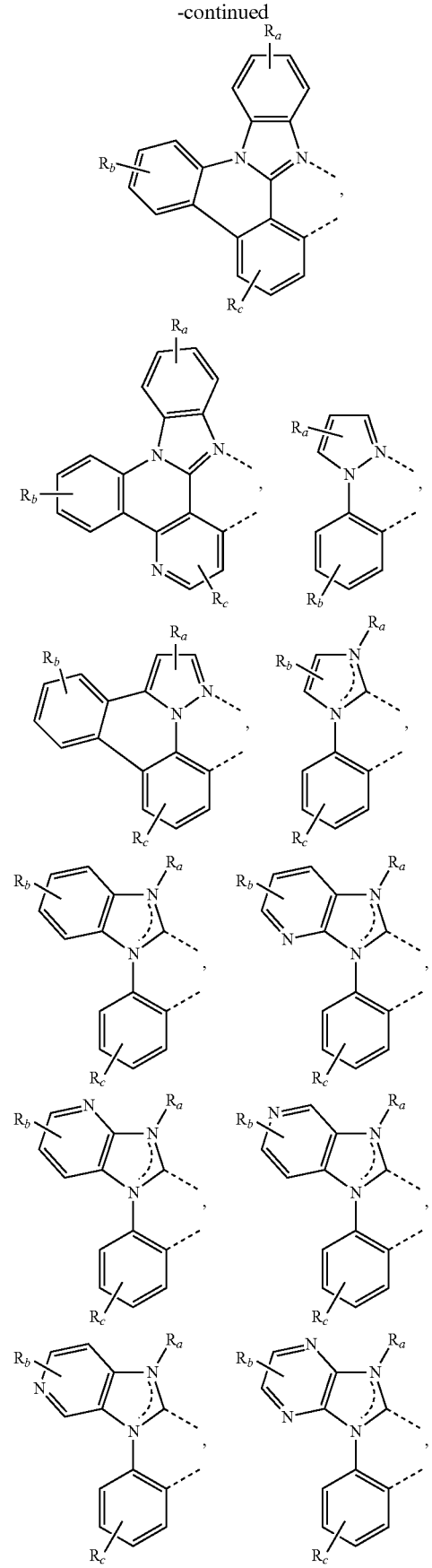

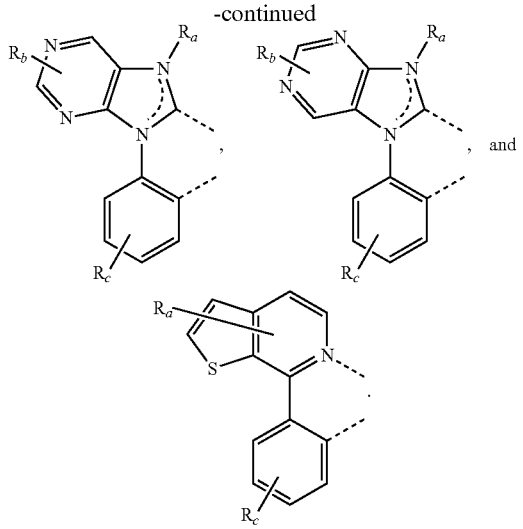
In some embodiments of the OLED, where the secondary emitter is a fluorescent emitter selected from the group consisting of:
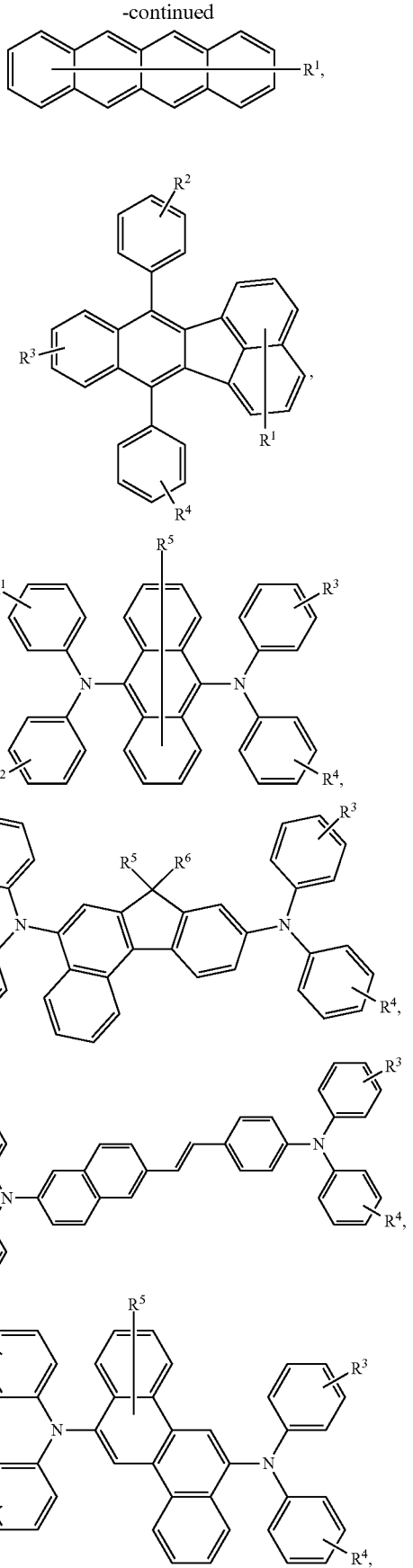

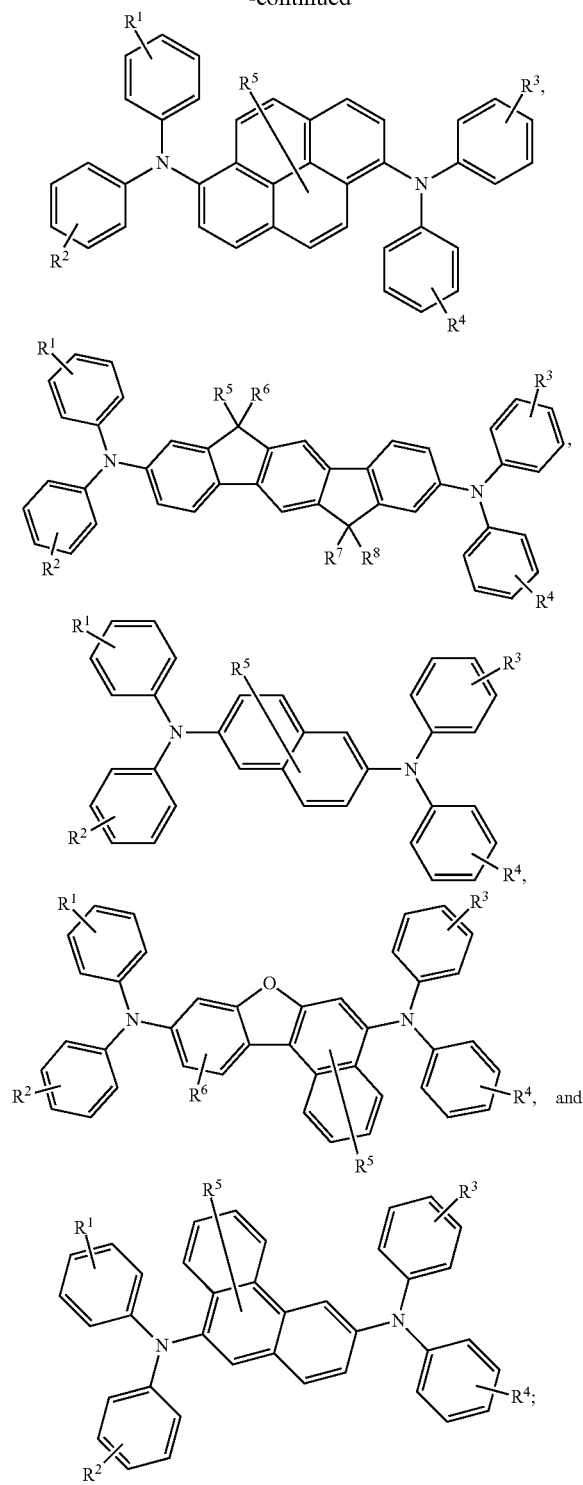

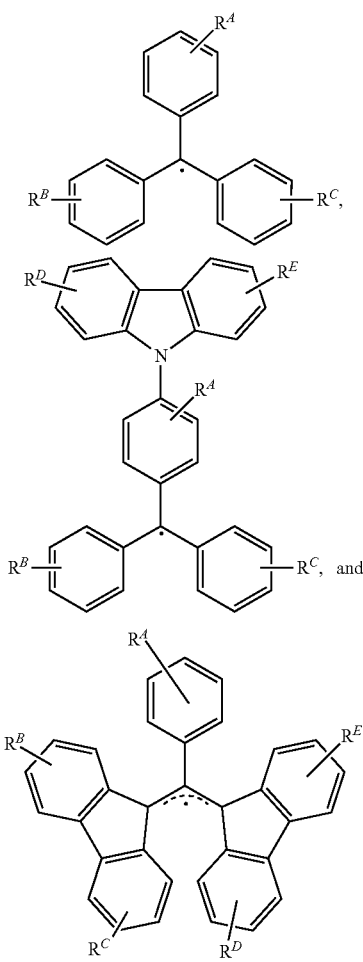

wherein $R^1$ to $R^5$ each independently represent from mono to maximum number of substitutions they can have, or no substitution;

wherein $R^1$ to $R^5$ are each independently a hydrogen or a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein at least one of $R^1$ to $R^5$ is R.

In some embodiments of the OLED wherein the secondary emitter contains an unpaired electron in its ground state, the secondary emitter is selected from the group consisting of:

where $R^A$, $R^B$, $R^C$, $R^D$, and $R^E$ each independently represent mono to the maximum allowable substitution, or no substitution; and wherein $R^A$, $R^B$, $R^C$, $R^D$, and $R^E$ are each independently a hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments of the OLED, the first host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene. In some embodiments, the first host is selected from the group consisting of:

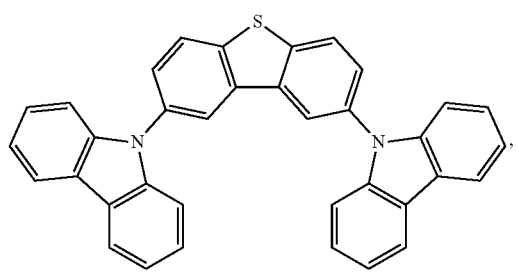
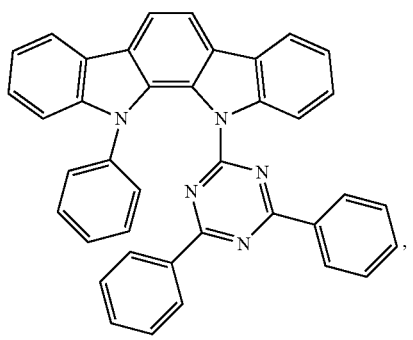
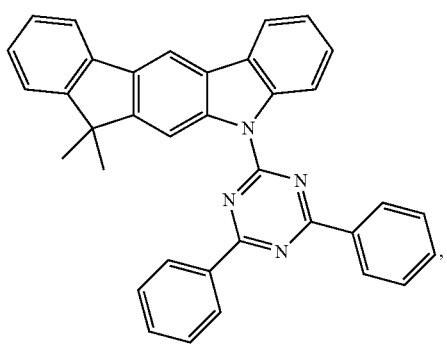
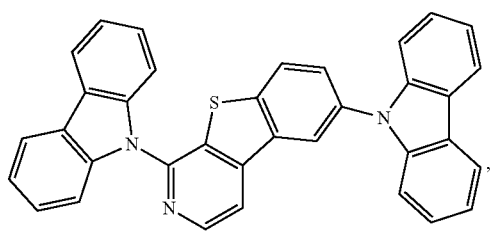
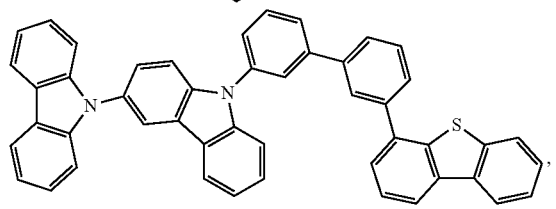
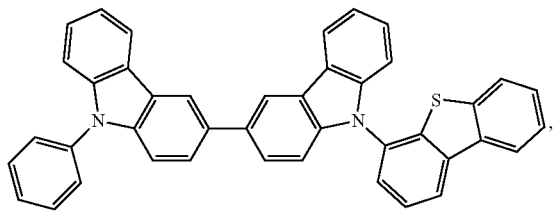
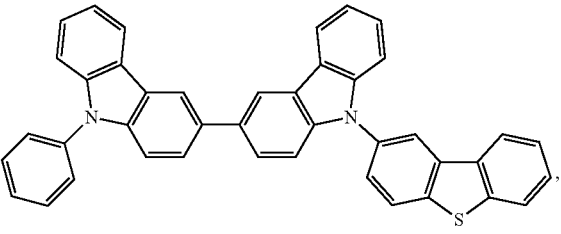
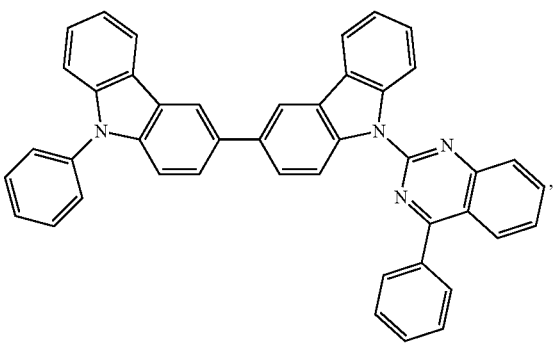
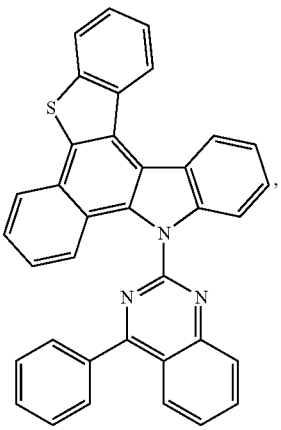
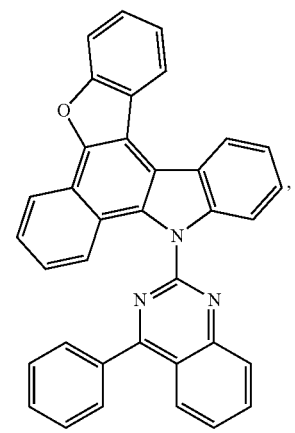

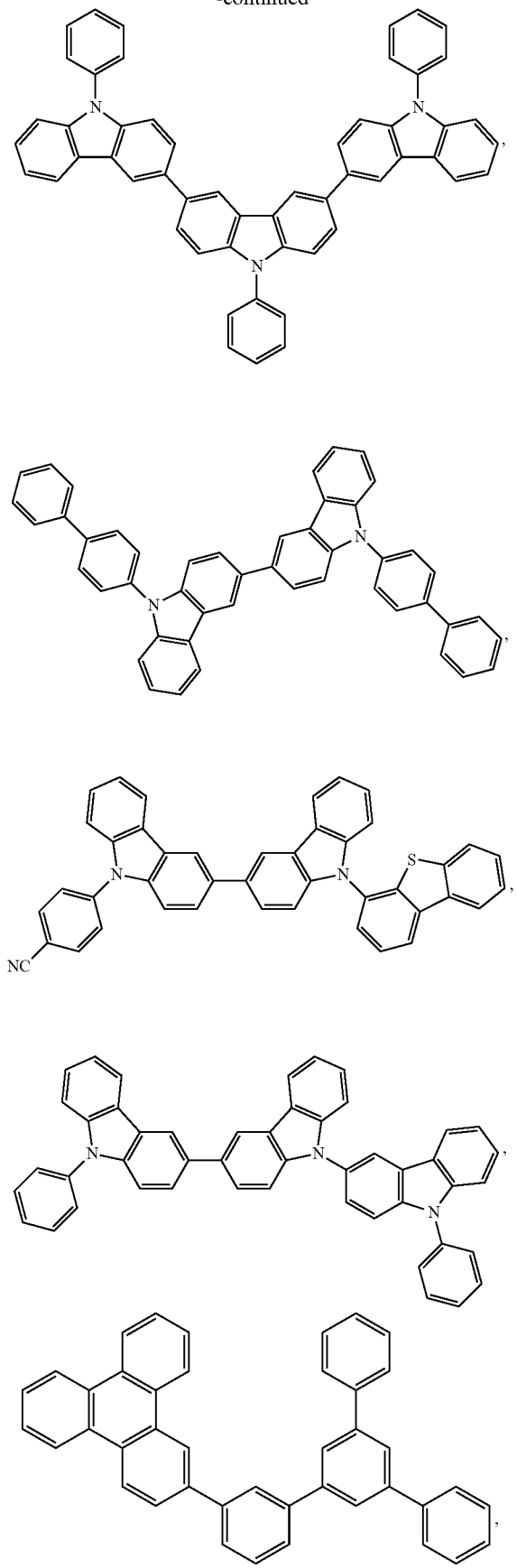
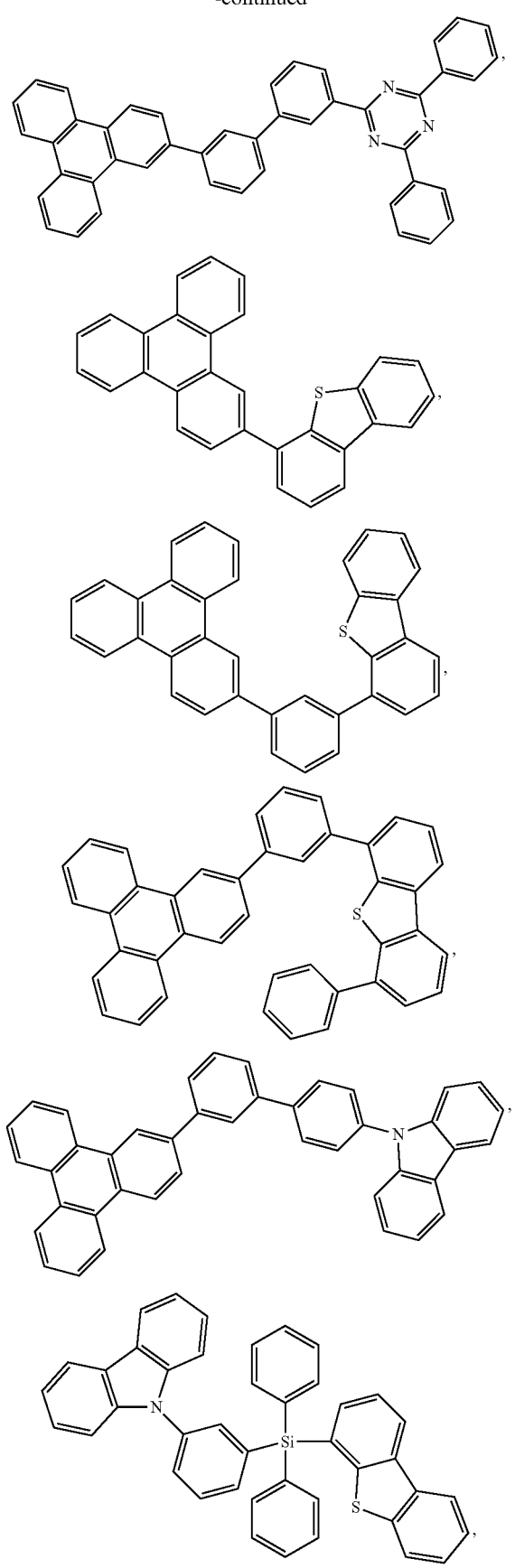

-continued

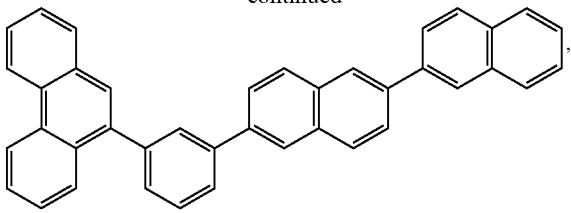

and combinations thereof.

An OLED comprising an anode, a cathode, and a first organic layer disposed between the anode and the cathode is disclosed. The first organic layer comprises a first metal complex $M^1L^1_m$ and a first host; wherein one of the following conditions is true:
(1) the first organic layer further comprises a second metal complex $M^2L^2_n$; or
(2) the OLED device further comprises a second organic layer disposed between the anode and the cathode, where the second organic layer comprises a second metal complex $M^2L^2_n$;
wherein $M^1$ is selected from the group consisting of Os, Ir, Pd, Pt, Cu, Ag, and Au;
wherein $M^2$ is selected from the group consisting of the lanthanide metals;
wherein $L^1$ and $L^2$ are each independently monodentate or multidentate ligands and can represent multiple ligands that are the same or different;
wherein m represents the maximum possible number of ligands $L^1$ that can coordinate to $M^1$;
wherein n represents the maximum possible number of ligands $L^2$ that can coordinate to $M^2$;
wherein the first host has a lowest triplet energy T1 that is the same or higher than the lowest triplet energy T1 of the first metal complex $M^1L^1_m$; and
wherein the first metal complex $M^1L^1_m$ has a lowest triplet energy, T1, that is the same or higher than the energy of the emissive f-f transition, $E_{f\text{-}f}$, of the second metal complex $M^2L^2_n$.

In some embodiments of the OLED, the condition (1) is true, and the first organic layer is the only layer containing $M^2L^2_n$. In some embodiments of the OLED, the condition (2) is true, and the second organic layer is the only layer containing $M^2L^2_n$. In some embodiments of the OLED where the condition (2) is true, the second organic layer further comprises a host.

In some embodiments of the OLED, $M^1$ is selected from the group consisting of Pt and Ir. In some embodiments of the OLED, $M^2$ is selected from the group consisting of Eu, Nd, Yb, and Er. In some embodiments of the OLED, at least one of the ligands $L^2$ has a lowest triplet energy T1 that is the same or lower than the lowest triplet energy T1 of the first metal complex $M^1L^1_m$. In some embodiments of the OLED, at least one of the ligands $L^2$ has a lowest triplet energy T1 that is the same or higher than the lowest triplet energy T1 of the first metal complex $M^1L^1_m$.

In some embodiments of the OLED, $M^2$ is Eu. In some embodiments of the OLED, $M^2$ is Yb. In some embodiments of the OLED, $M^2$ is Nd. In some embodiments of the OLED, $M^2$ is Er.

In some embodiments of the OLED, the first metal complex $M^1L^1_m$ has a formula of $M(L_A)_x(L_B)_y(L_C)_z$ wherein $L_A$, $L_B$ and $L_C$ are each a bidentate ligand; and wherein x is 1, 2, or 3; y is 0, 1, or 2; z is 0, 1, or 2; and x+y+z is the oxidation state of the metal M. In some embodiments, the first metal complex $M^1L^1_m$ has a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein $L_A$, $L_B$, and $L_C$ are different from each other. In some embodiments, the first metal complex $M^1L^1_m$ has a formula of $Pt(L_A)(L_B)$; and wherein $L_A$ and $L_B$ can be same or different.

In some embodiments of the OLED where the first metal complex $M^1L^1_m$ has a formula of $Pt(L_A)(L_B)$, and wherein $L_A$ and $L_B$ can be same or different, $L_A$ and $L_B$ are connected to form a tetradentate ligand. In some embodiments, $L_A$ and $L_B$ are connected at two places to form a macrocyclic tetradentate ligand.

In some embodiments of the OLED wherein the first metal complex $M^1L^1_m$ has a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein $L_A$, $L_B$, and $L_C$ are different from each other, $L_A$, $L_B$, and $L_C$ are each independently selected from the group consisting of:

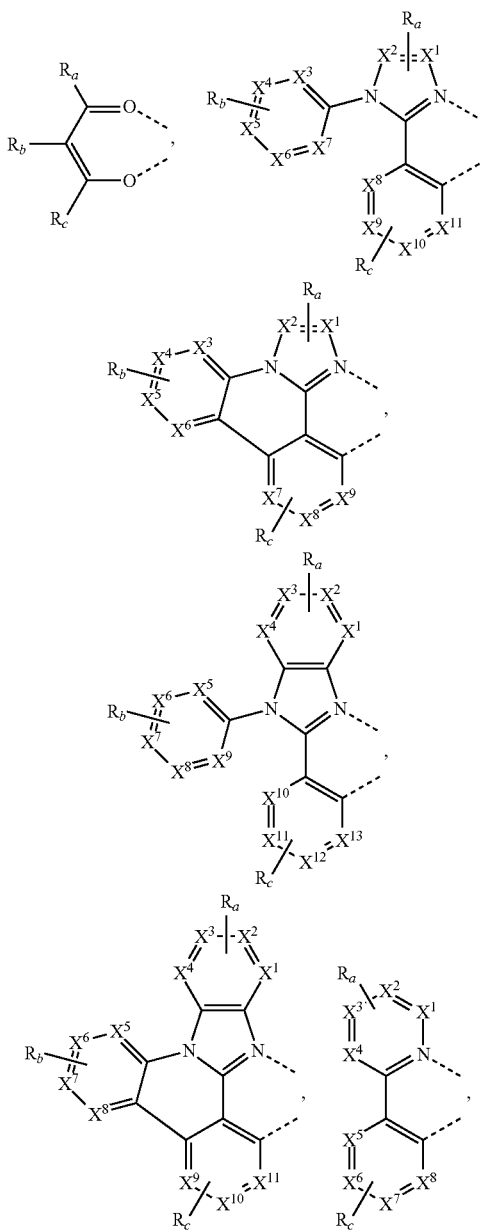

-continued

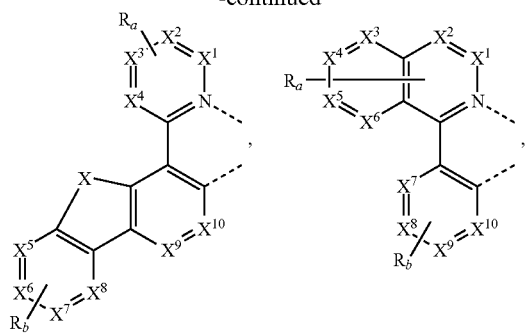

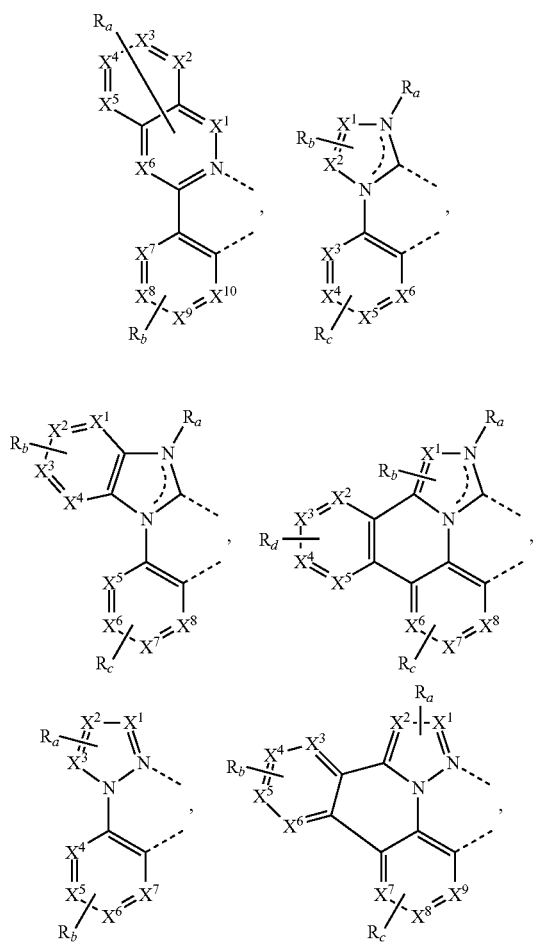

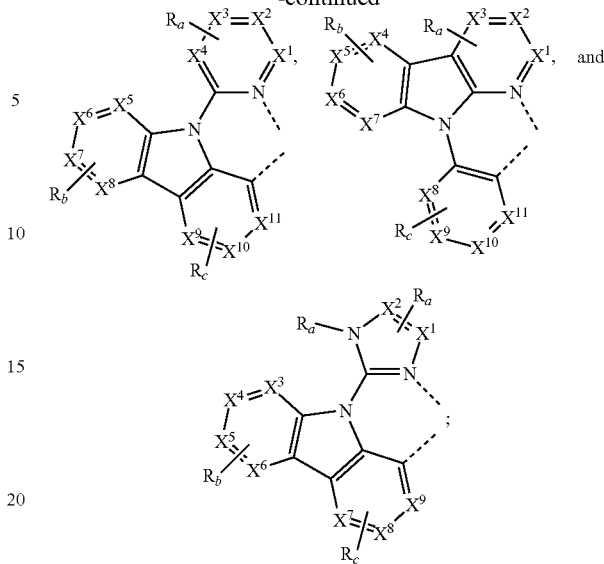

wherein each $X^1$ to $X^{13}$ are independently selected from the group consisting of carbon and nitrogen; wherein X is selected from the group consisting of BR', NR', PR', O, S, Se, C=O, S=O, SO$_2$, CR'R'', SiR'R'', and GeR'R''; wherein R' and R'' are optionally fused or joined to form a ring; wherein each $R_a$, $R_b$, $R_c$, and $R_d$ can represent from mono substitution to the possible maximum number of substitution, or no substitution; wherein R', R'', $R_a$, $R_b$, $R_c$, and $R_d$ are each independently a hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, benzonitrile, isonitrile, sulfanyl, sulfinyl, sulfonyl, phosphino, and combinations thereof; and wherein any two adjacent substitutents of $R_a$, $R_b$, $R_c$, and $R_d$ are optionally fused or joined to form a ring or form a multidentate ligand. In some embodiments, $L_A$ and $L_B$ are each independently selected from the group consisting of:

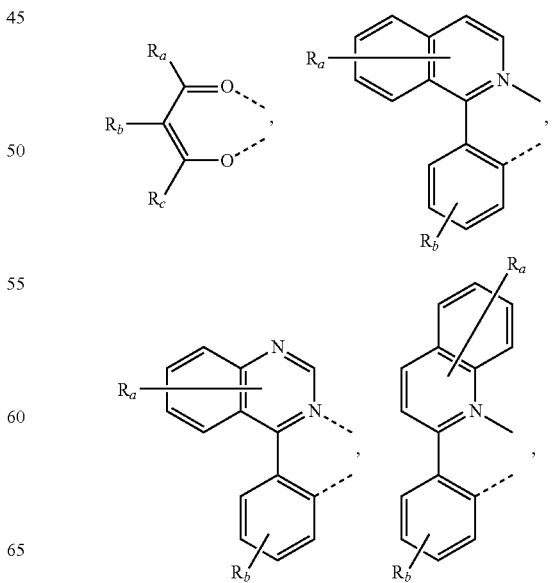

-continued
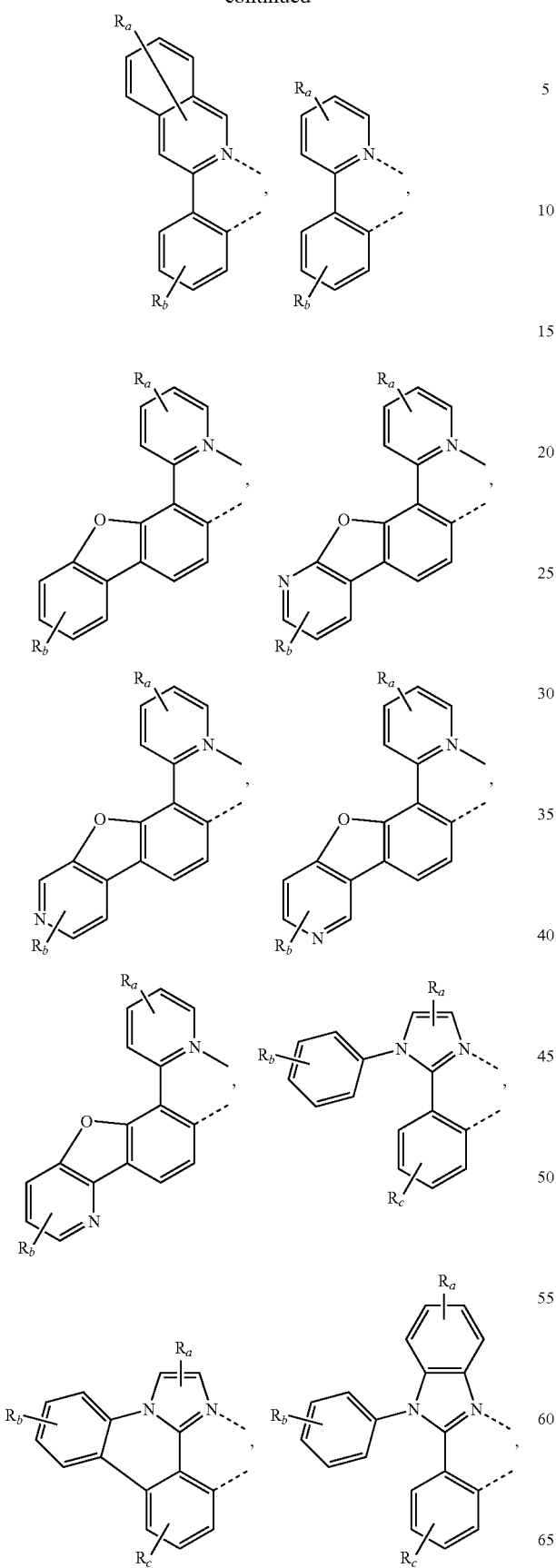
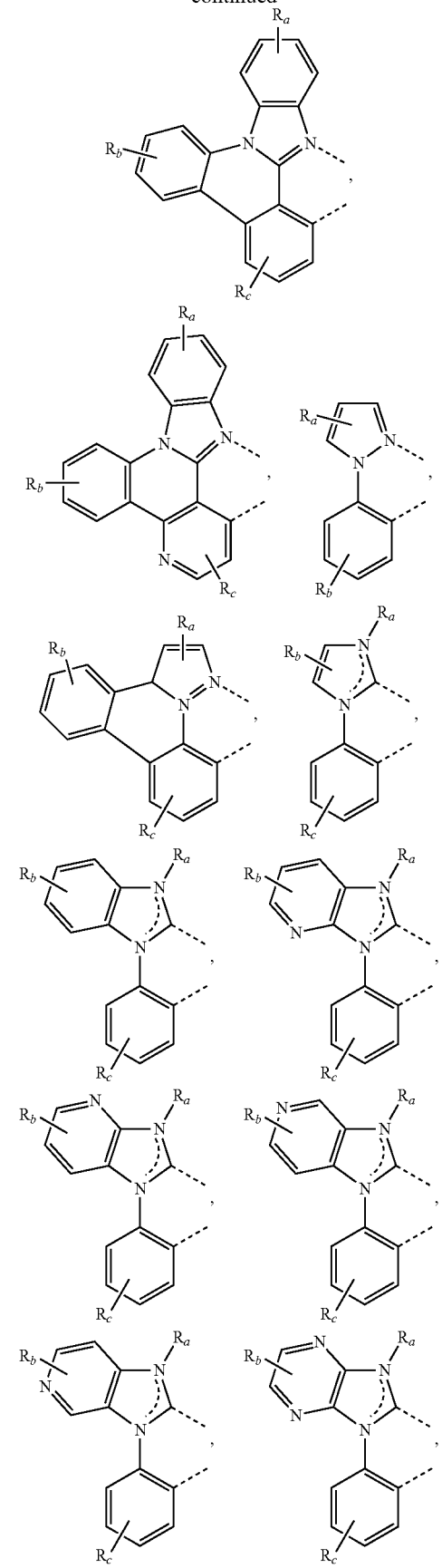

-continued

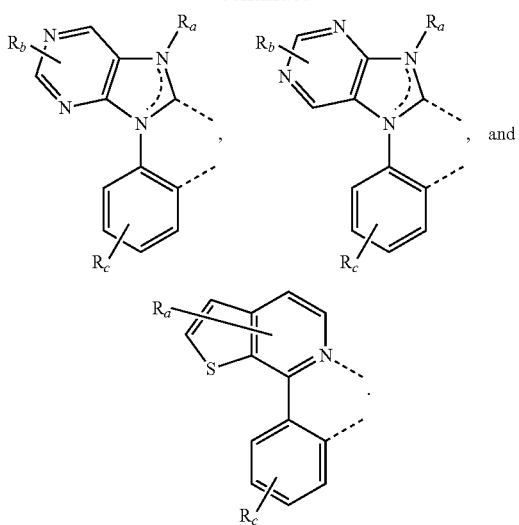

In some embodiments of the OLED, the second metal complex $M^2L^2_n$ is selected from the following group (A) consisting of:

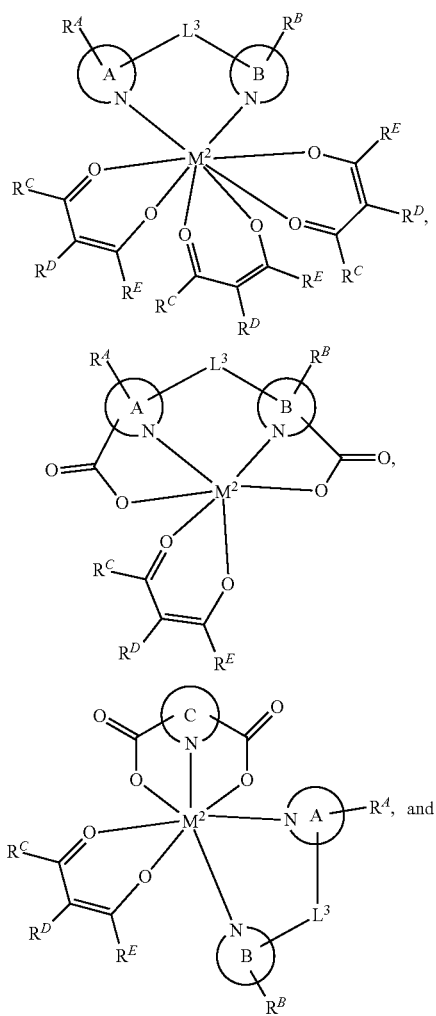

-continued wherein rings A, B, and C are each independently a 5-membered or 6-membered carbocyclic or heterocyclic ring; wherein $R^A$, $R^B$, $R^C$, $R^D$, $R^E$, and $R^F$ can represent mono to the maximum possible substitution, or no substitution; wherein $R^A$, $R^B$, $R^C$, $R^D$, $R^E$, and $R^F$ are each independently a hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, benzonitrile, isonitrile, sulfanyl, sulfinyl, sulfonyl, phosphino, and combinations thereof; and wherein $L^3$ and $L^4$ are each independently selected from direct bond, BR, NR, PR, O, S, Se, C=O, S=O, SO2, CRR', SiRR', GeRR', alkyl, cycloalkyl, and combinations thereof.

In some embodiments of the OLED, the second metal complex $M^2L^2_n$ is selected from the group consisting of:

Compounds 1 through 4 having the following structure

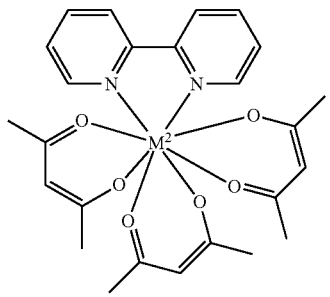

wherein in Compound 1, $M^2$ = Nd,
in Compound 2, $M^2$ = Eu,
in Compound 3, $M^2$ = Yb, and
in Compound 4, $M^2$ = Er,
Compounds 5 through 8 having the following structure

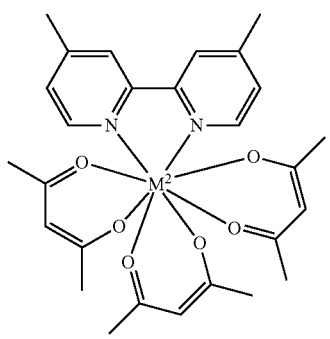

wherein in Compound 5, M² = Nd,
in Compound 6, M² = Eu,
in Compound 7, M² = Yb, and
in Compound 8, M² = Er,
Compounds 9 through 12 having the following structure

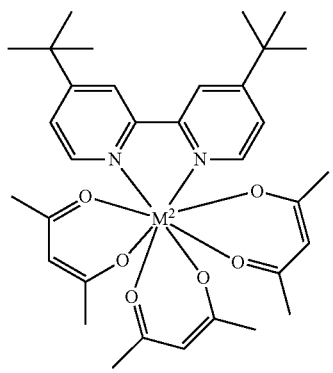

wherein in Compound 9, M2 = Nd,
in Compound 10, M2 = Eu,
in Compound 11, M2 = Yb, and
in Compound 12, M2 = Er,
Compounds 13 through 16 having the following structure

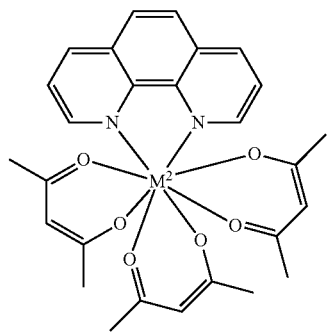

wherein in Compound 13, M² = Nd,
in Compound 14, M² = Eu,
in Compound 15, M² = Yb, and
in Compound 16, M² = Er,
Compounds 17 through 20 having the following structure

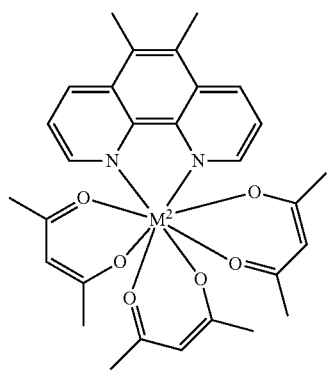

wherein in Compound 17, M² = Nd,
in Compound 18, M² = Eu,
in Compound 19, M² = Yb, and
in Compound 20, M² = Er, Compounds 21 through 24 having the following structure

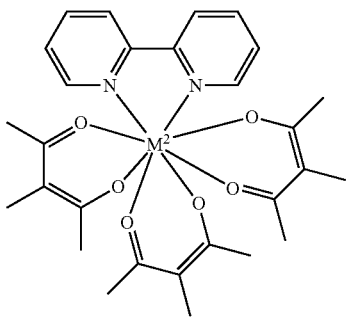

wherein in Compound 21, M² = Nd,
in Compound 22, M² = Eu,
in Compound 23, M² = Yb, and
in Compound 24, M² = Er,
Compounds 25 through 28 having the following structure

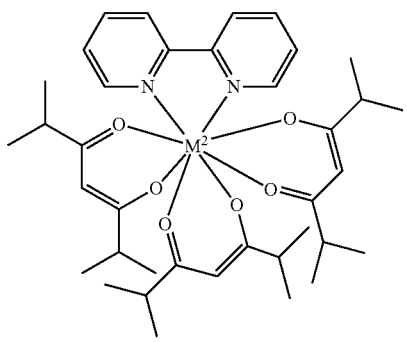

wherein in Compound 25, M² = Nd,
in Compound 26, M² = Eu,
in Compound 27, M² = Yb, and
in Compound 28, M² = Er,
Compounds 29 through 32 having the following structure

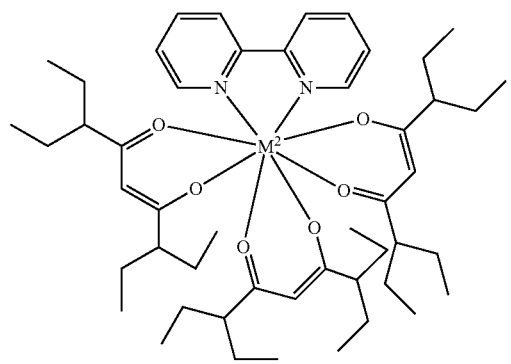

wherein in Compound 29, M² = Nd,
in Compound 30, M² = Eu,
in Compound 31, M² = Yb, and
in Compound 32, M² = Er, Compounds 33 through 36 having the following structure

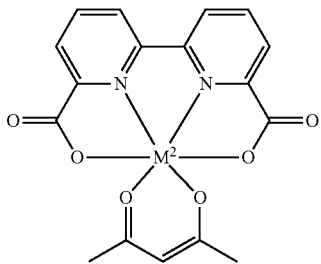

wherein in Compound 33, $M^2$ = Nd,
in Compound 34, $M^2$ = Eu,
in Compound 35, $M^2$ = Yb, and
in Compound 36, $M^2$ = Er, Compounds 37 through 40 having the following structure

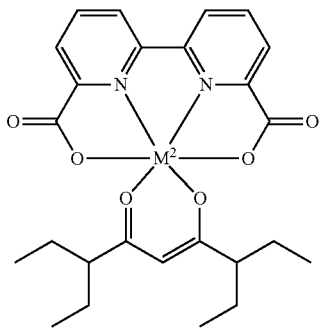

wherein in Compound 37, $M^2$ = Nd,
in Compound 38, $M^2$ = Eu,
in Compound 39, $M^2$ = Yb, and
in Compound 40, $M^2$ = Er, Compounds 41 through 44 having the following structure

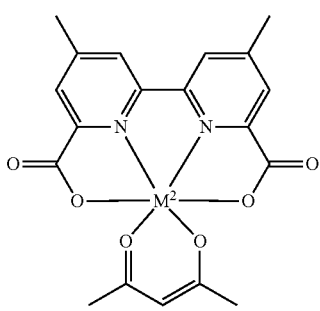

wherein in Compound 41, $M^2$ = Nd,
in Compound 42, $M^2$ = Eu,
in Compound 43, $M^2$ = Yb, and
in Compound 44, $M^2$ = Er, Compounds 45 through 48 having the following structure

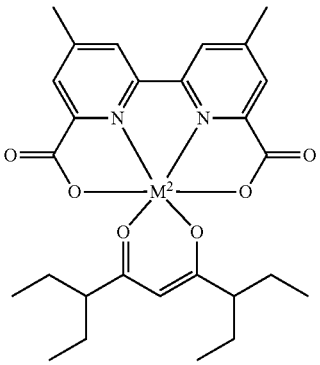

wherein in Compound 45, $M^2$ = Nd,
in Compound 46, $M^2$ = Eu,
in Compound 47, $M^2$ = Yb, and
in Compound 48, $M^2$ = Er, Compounds 49 through 52 having the following structure

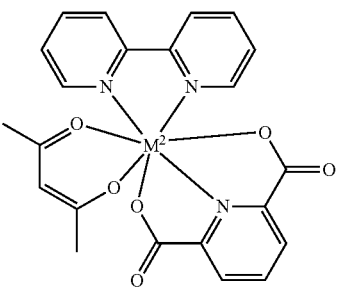

wherein in Compound 49, $M^2$ = Nd,
in Compound 50, $M^2$ = Eu,
in Compound 51, $M^2$ = Yb, and
in Compound 52, $M^2$ = Er, Compounds 53 through 54 having the following structure

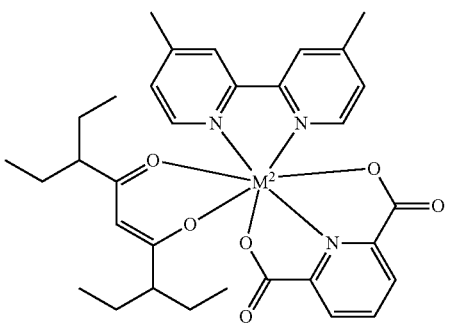

wherein in Compound 53, $M^2$ = Nd,
in Compound 54, $M^2$ = Eu,
in Compound 55, $M^2$ = Yb, and
in Compound 56, $M^2$ = Er, Compounds 57 through 60 having the following structure

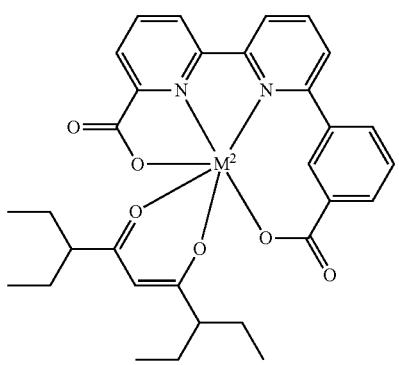

wherein in Compound 57, M2 = Nd,
in Compound 58, M2 = Eu,
in Compound 59, M2 = Yb, and
in Compound 60, M2 = Er, Compounds 61 through 64 having the following structure

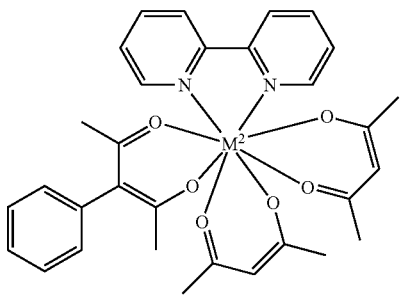

wherein in Compound 61, $M^2$ = Nd,
in Compound 62, $M^2$ = Eu,
in Compound 63, $M^2$ = Yb, and
in Compound 64, $M^2$ = Er, Compounds 65 through 68 having the following structure

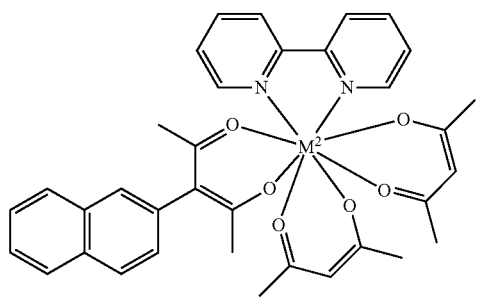

wherein in Compound 65, $M^2$ = Nd,
in Compound 66, $M^2$ = Eu,
in Compound 67, $M^2$ = Yb, and
in Compound 68, $M^2$ = Er, Compounds 69 through 72 having the following structure

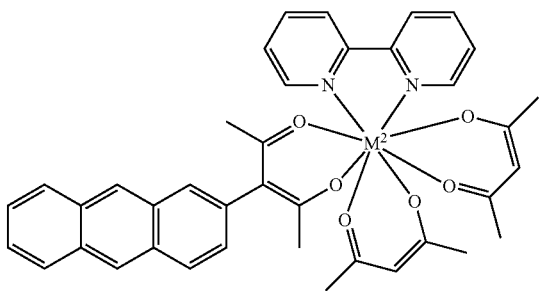

wherein in Compound 69, $M^2$ = Nd,
in Compound 70, $M^2$ = Eu,
in Compound 71, $M^2$ = Yb, and
in Compound 72, $M^2$ = Er.

In some embodiments of the OLED, the first host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

In some embodiments of the OLED, the first host is selected from the group consisting of:

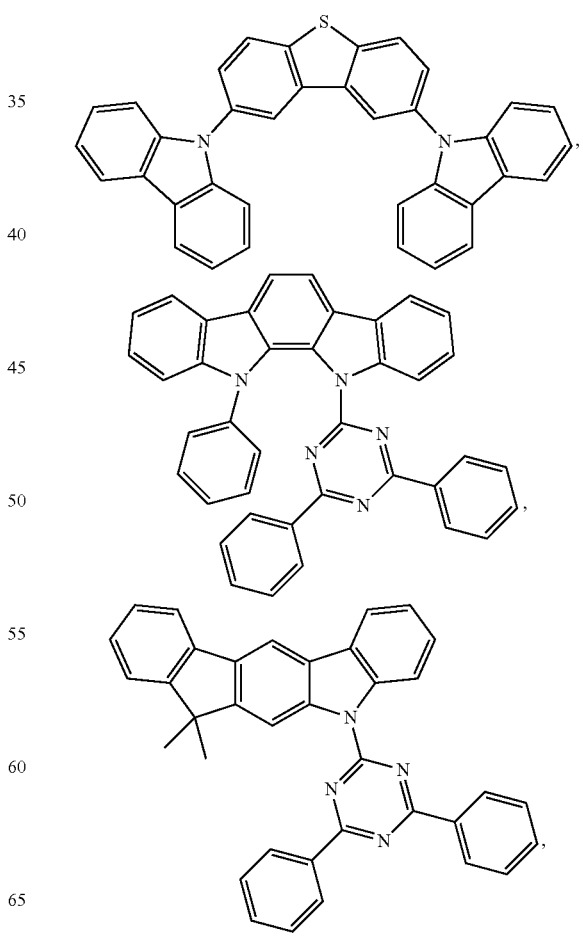

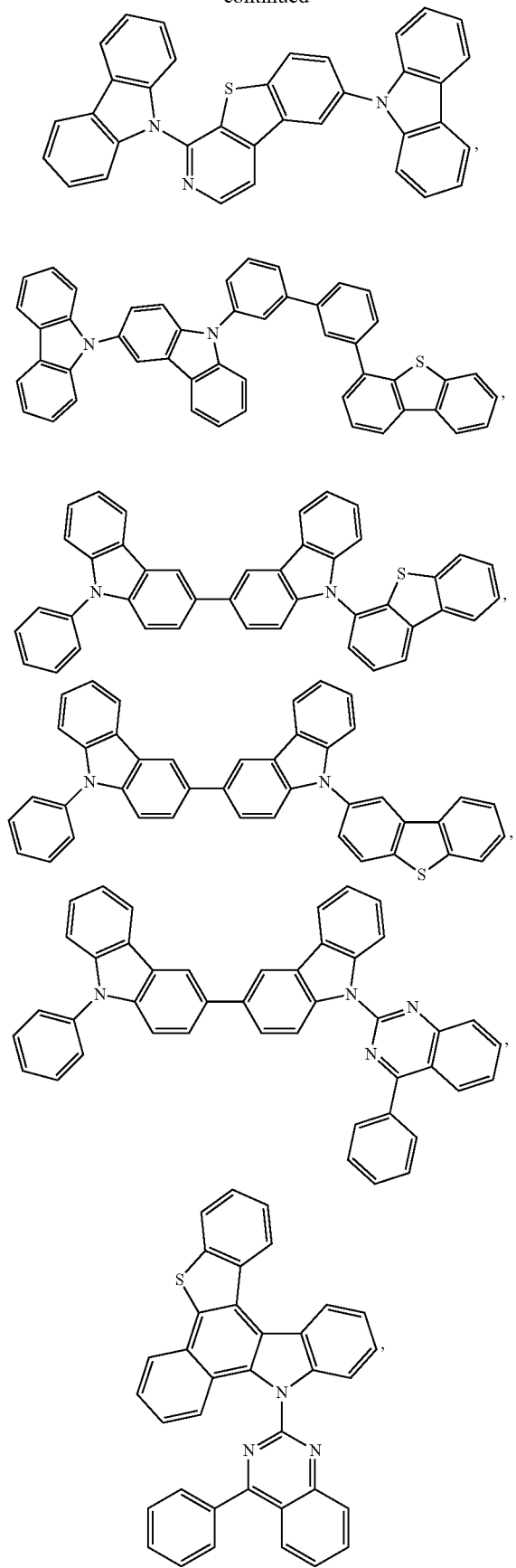
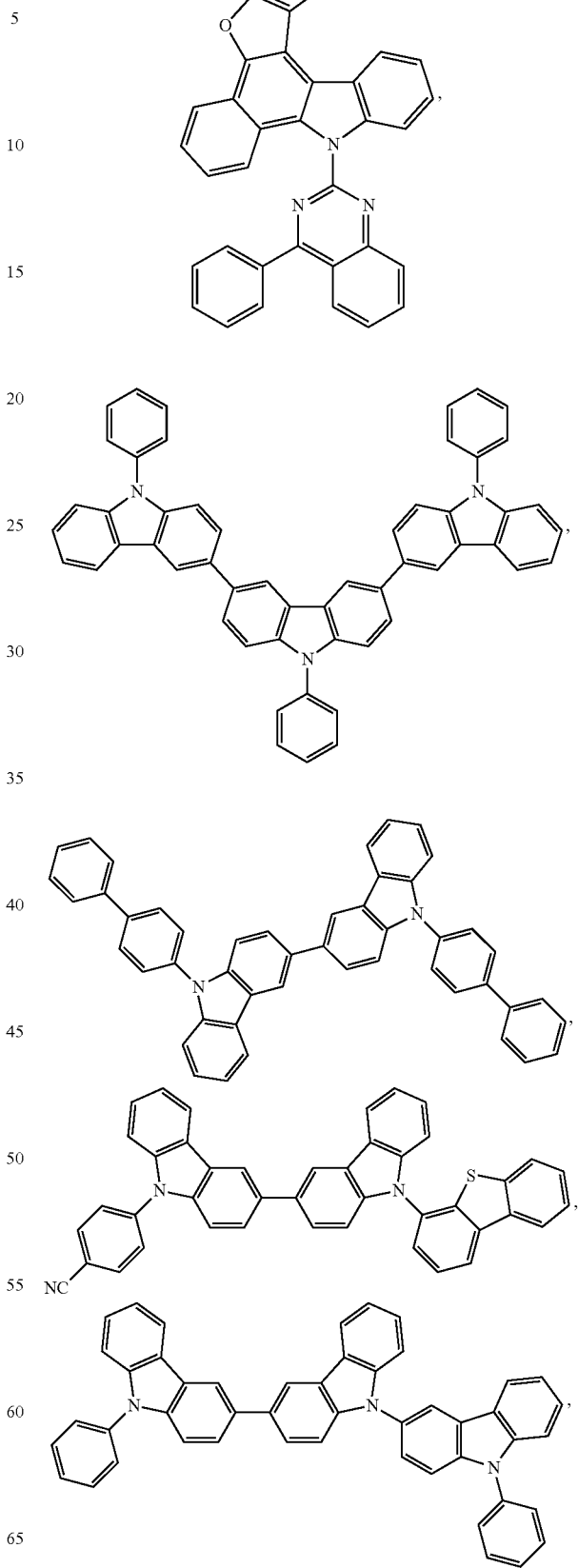

-continued

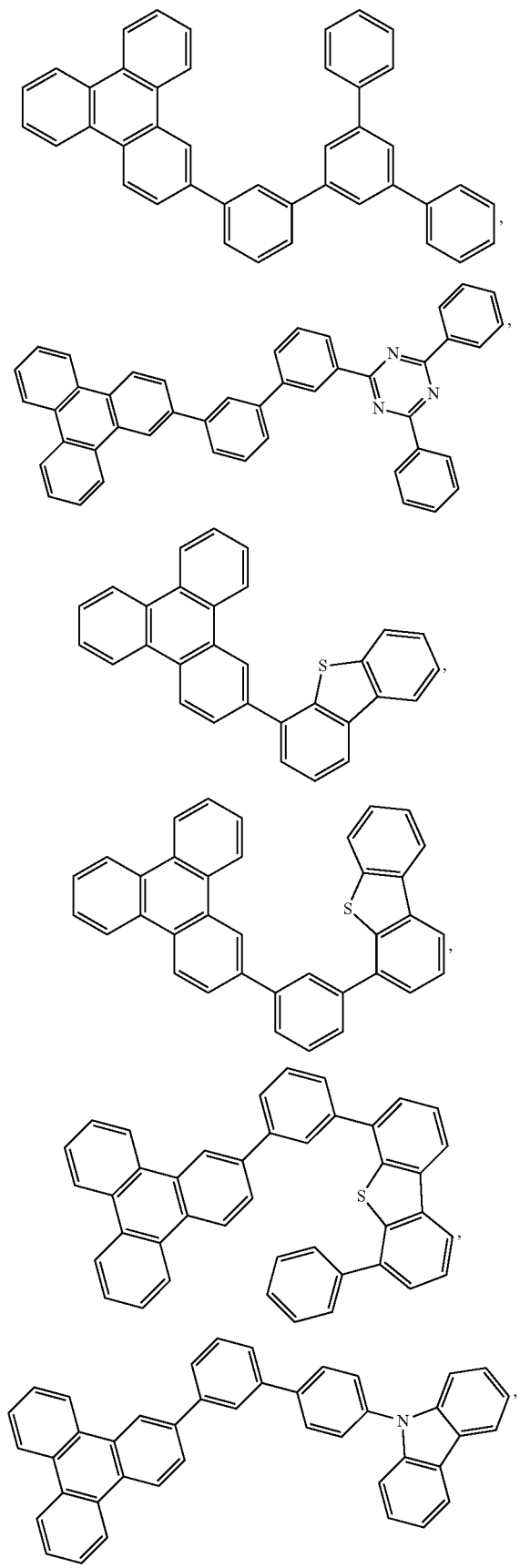

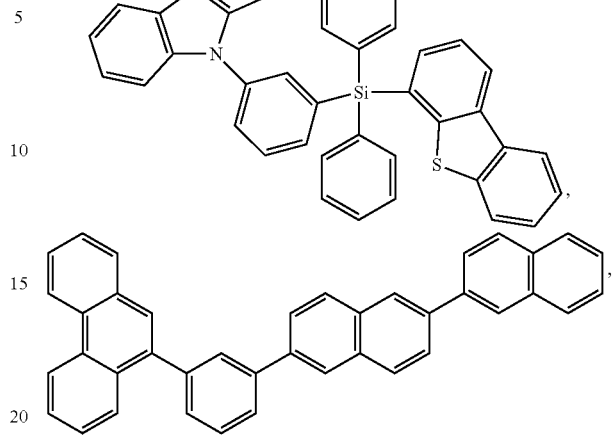

and combinations thereof.

The use of a phosphorescent emitter to sensitize another secondary emitter such as a fluorescent or lanthanide emitter offers a method of obtaining higher efficiency from the secondary emitter while retaining its emission properties. However, we predict a particular benefit for the application of this device structure in the near-infrared emission region. Specific to the near-infrared, the secondary emitter allows for an increase in device efficiency due to the shorter transient lifetime offered by these emitters. As the energy gap law predicts an exponential increase in non-radiative rate with decreasing excited state to ground state (emission) energy gap, efficient NIR emission requires a very fast emissive rate to compete with the faster non-radiative decay in this regime. As such, the use of secondary emitters with faster emissive rates (e.g. fluorophores) is expected to result in higher efficiency than both an all phosphorescent device, which suffers from long excited state lifetimes, and an all fluorescent device, which suffers from lower emission quantum yield due to wasted triplet excitons.

Standard measurement of peak wavelength (λmax) is as follows: photoluminescence is measured by photoexcitation of a thin film sample of the emitter doped at 1% (wt. %) in an inert Poly(methyl methacrylate) matrix.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An emissive region in an OLED is also disclosed where the emissive region comprising the first organic layer described herein.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv C-C_nH_{2n+1}$, $Ar_1$, $Ar_1-Ar_2$, and $C_nH_{2n}-Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

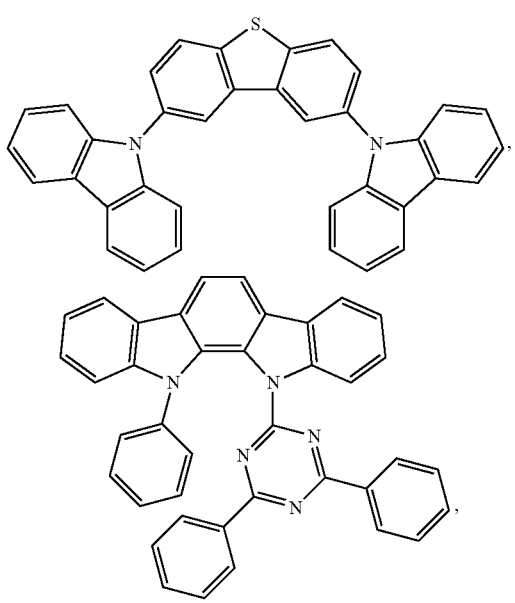

-continued

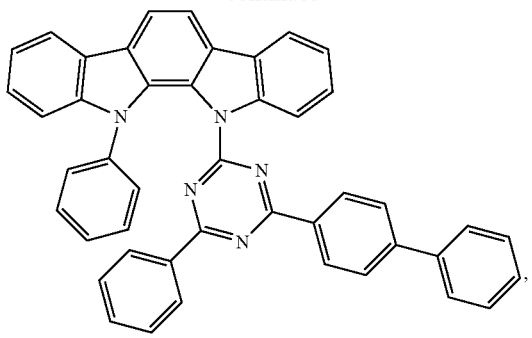

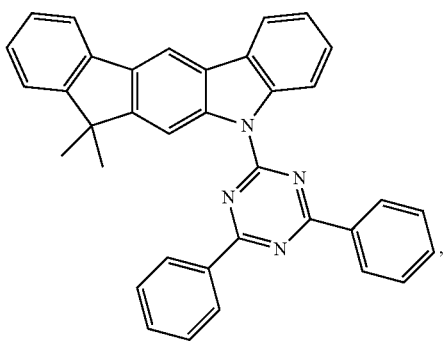

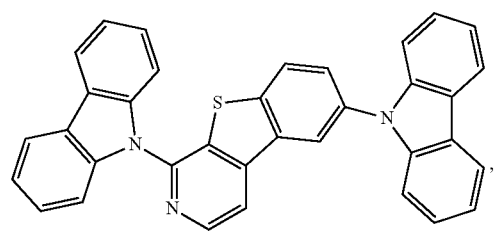

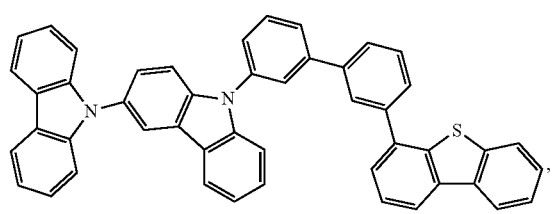

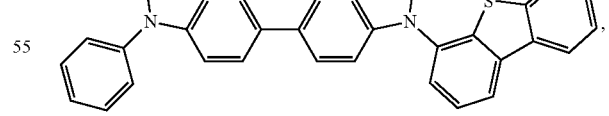

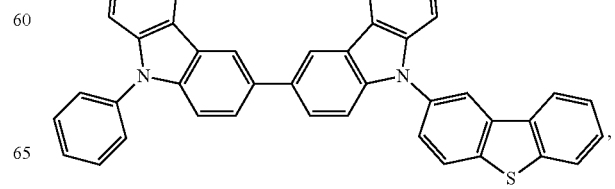

-continued
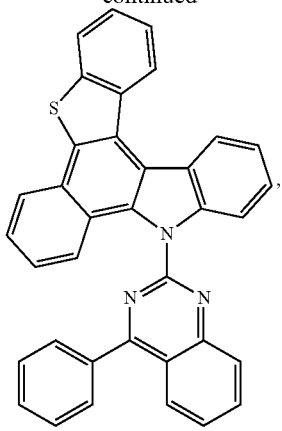
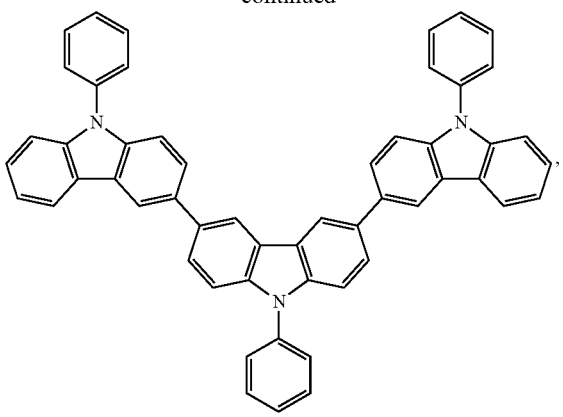
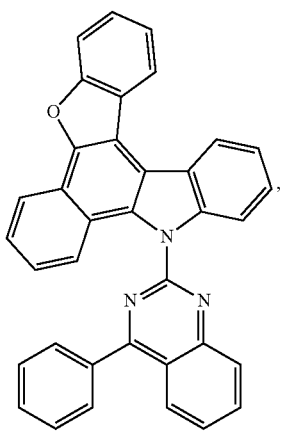
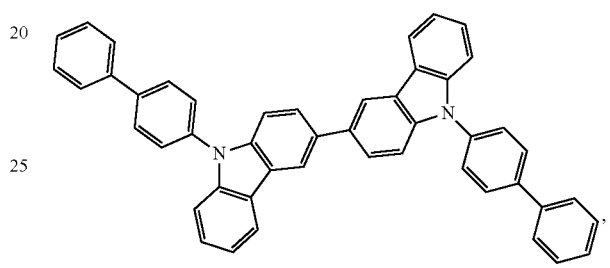
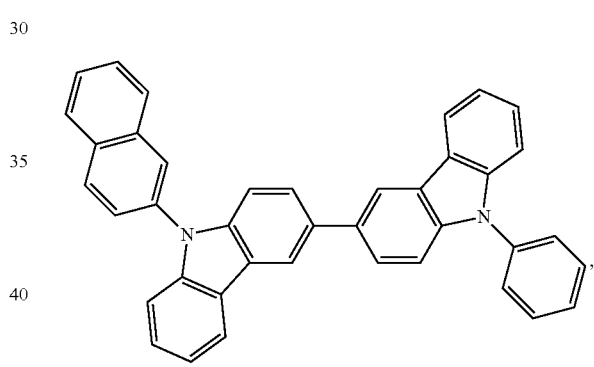
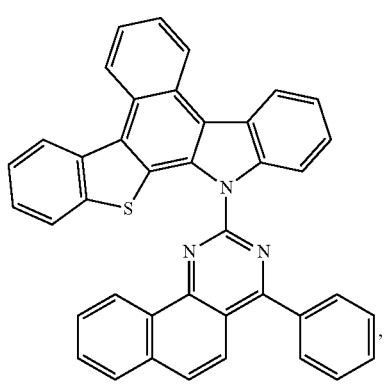
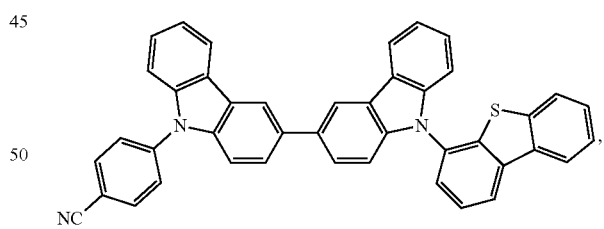
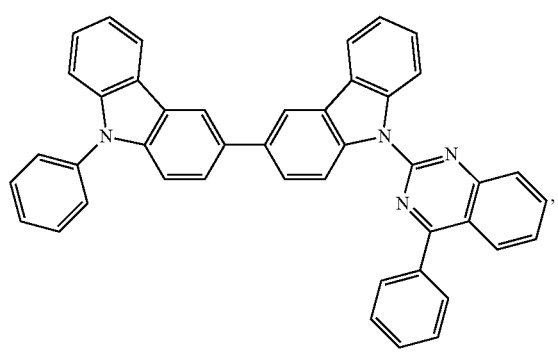
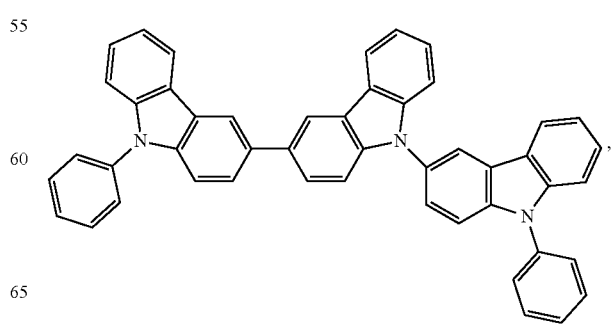

-continued

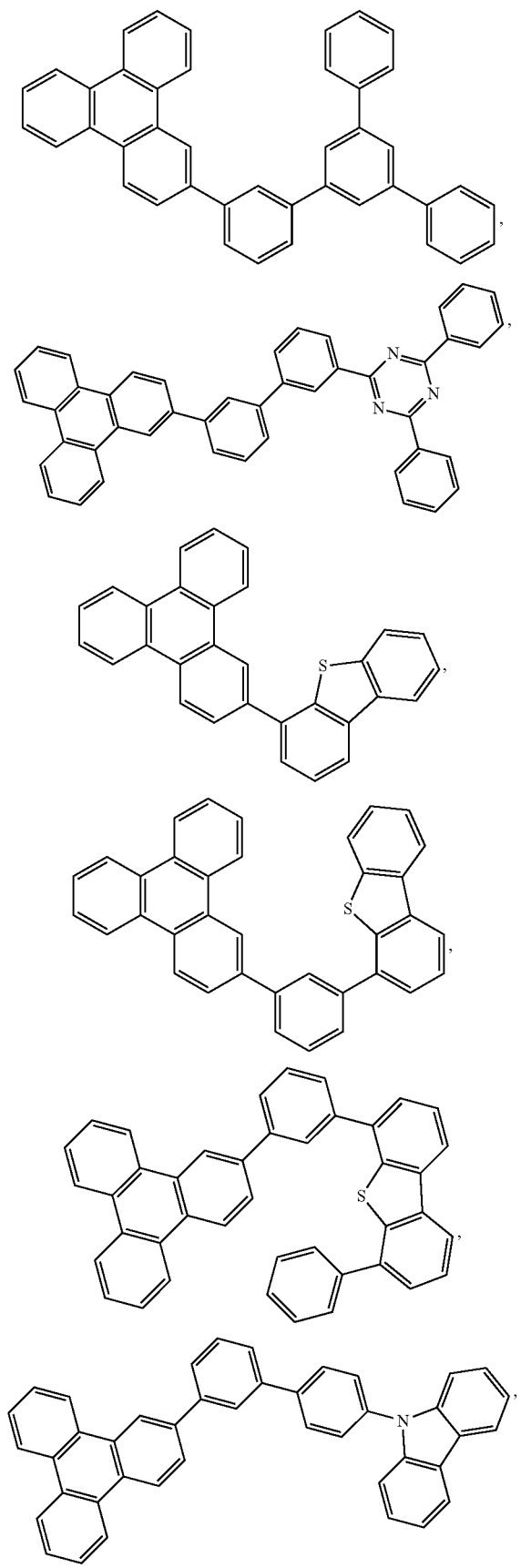

-continued

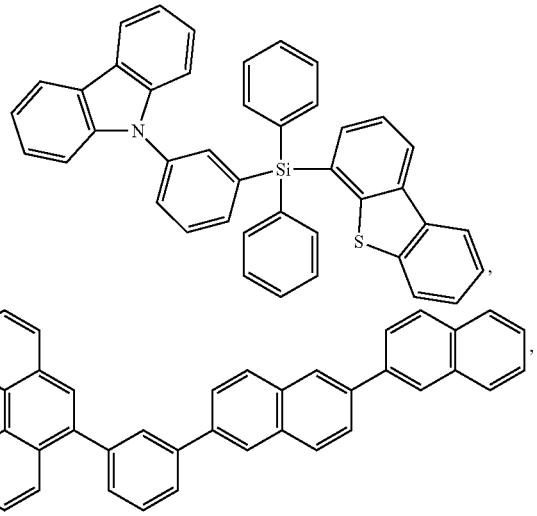

and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

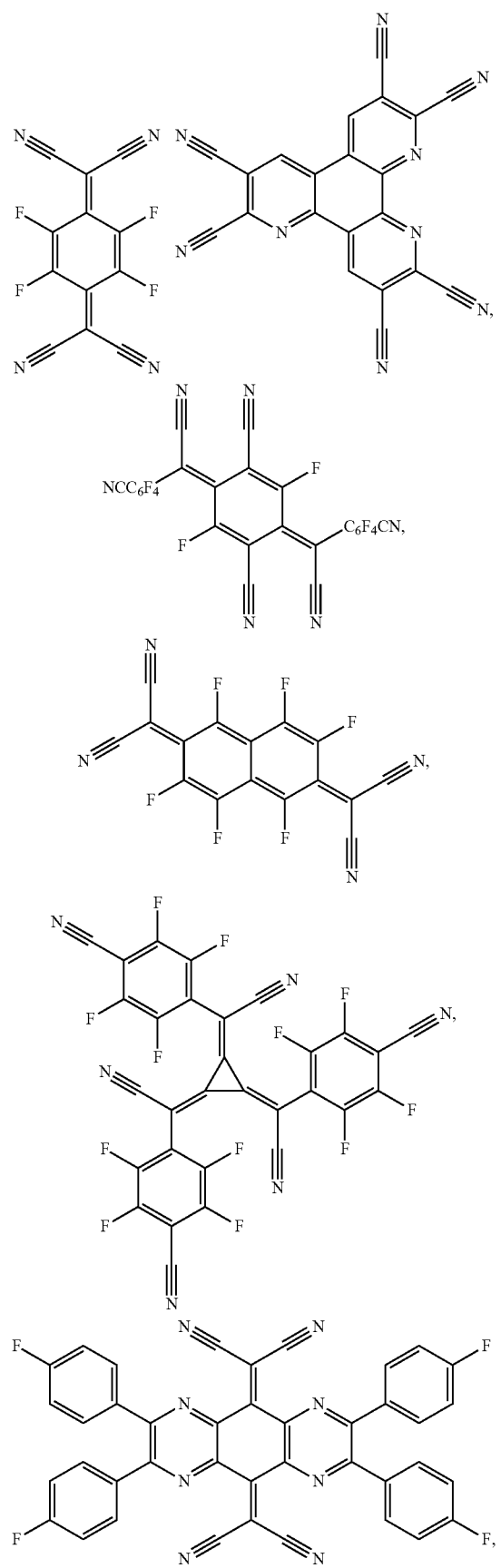
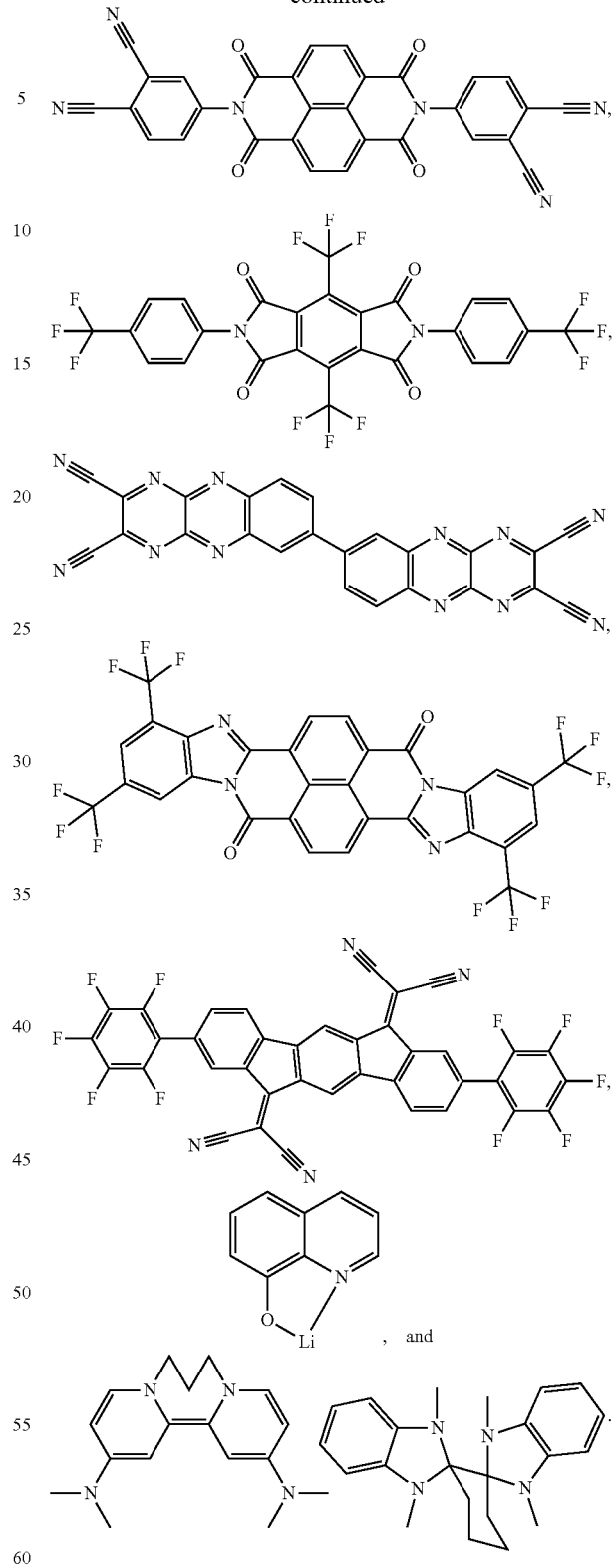
HIL/HTL:
A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

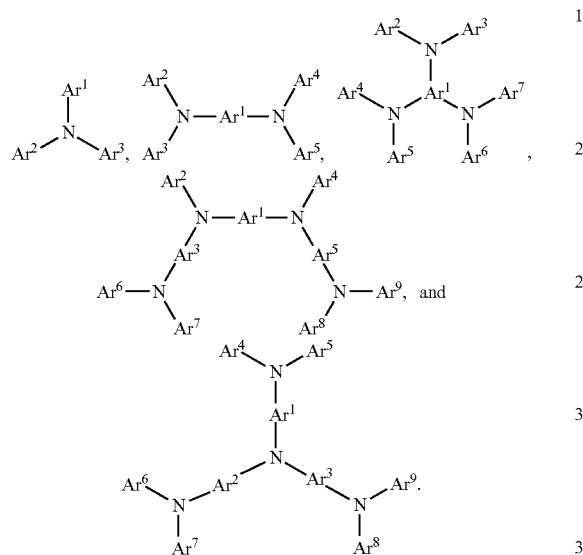

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

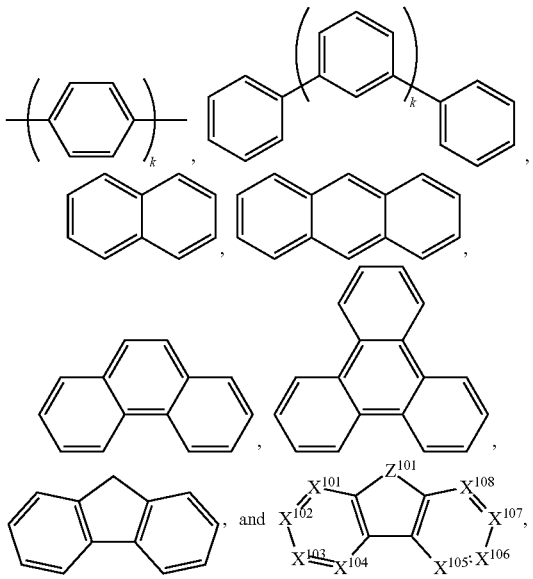

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

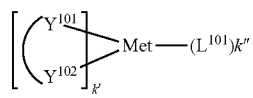

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. Fc*/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Pat. No. 6,517,957, US20020158242, US20030162053, US20050123751, US20060182993, US20060240279, US20070145888, US20070181874, US20070278938, US20080014464, US20080091025, WO07125714, WO08023550, WO08023759, US20080106190, US20080124572, US20080145707, WO2009145016, WO2010061824, WO2011075644, US20080220265, US20080233434, US20080303434, WO2012177006, WO2013018530, WO2013039073, US2008107919, US20090115320, US20090167161, WO2013087142, WO2013118812, WO2013120577, US2009066235, US2011007385, US20110163302, WO2013157367, WO2013175747, WO2014002873, US2011240968, US2011278551, US2012205642, WO2014015935, WO2014015937, WO2014030872, US2013241401, US20140117329, US2014183517, U.S. WO2014030921, WO2014034791, WO2014104514, Pat. Nos. 5,061,569, 5,639,914, WO05075451, WO2014157018.
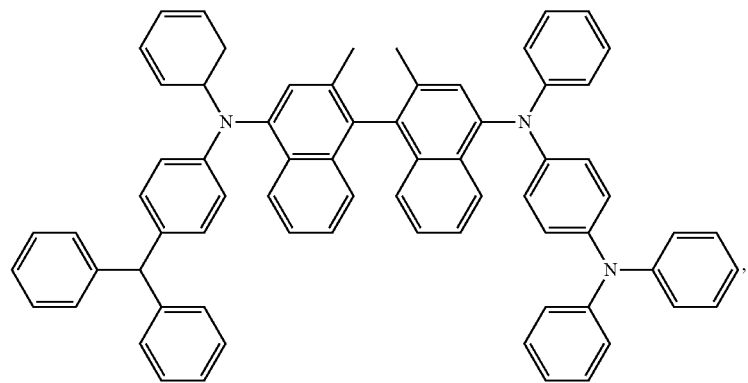
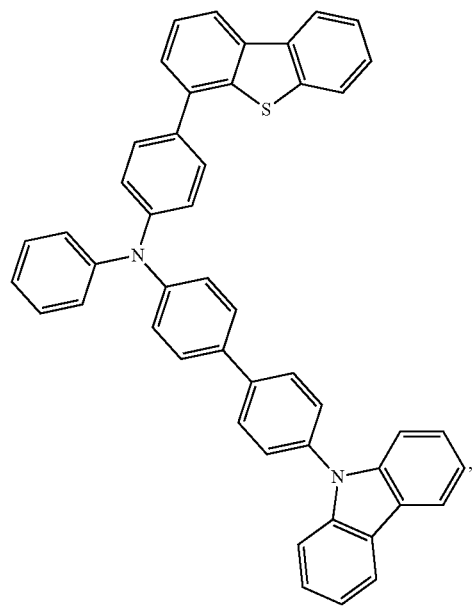

-continued
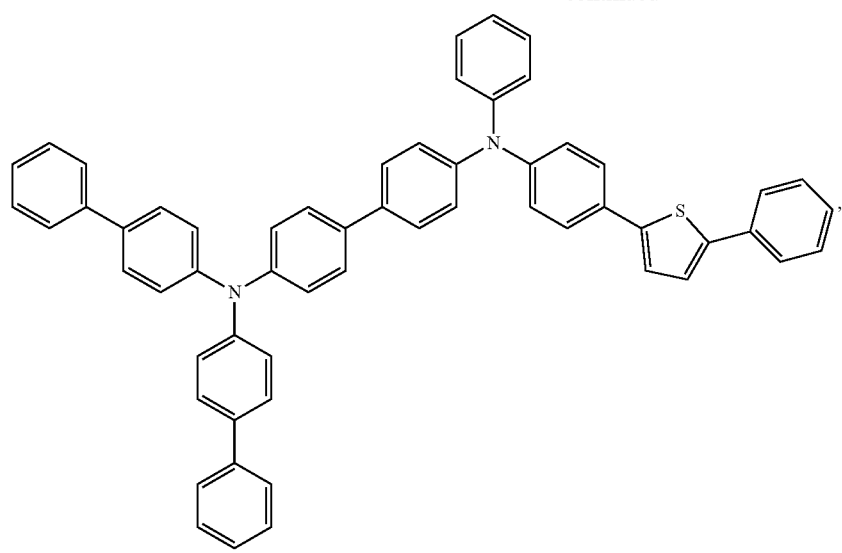
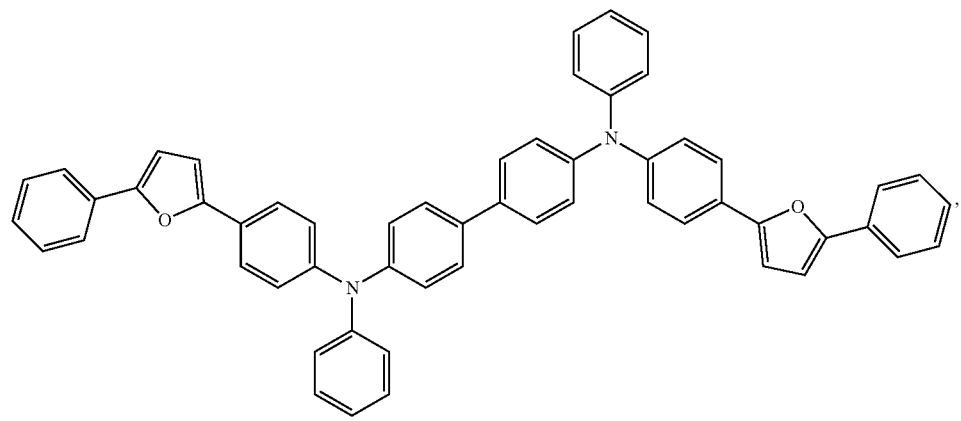
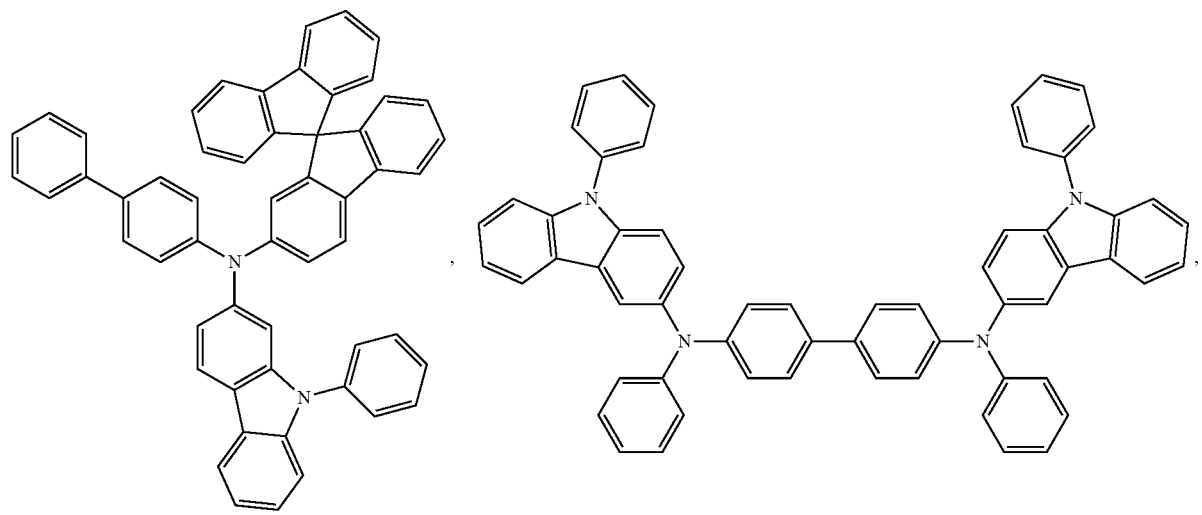

-continued
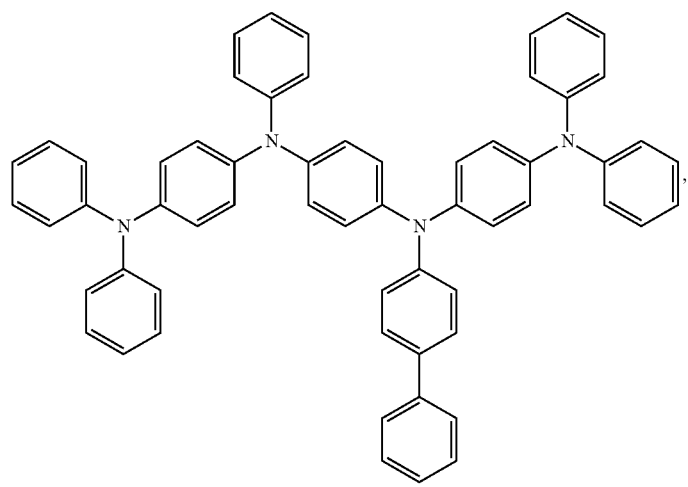
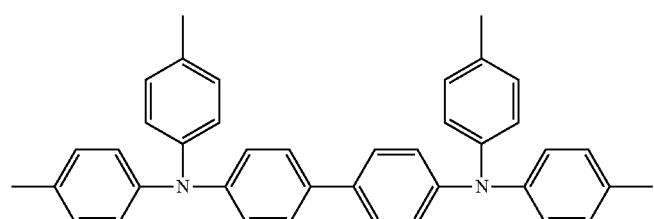
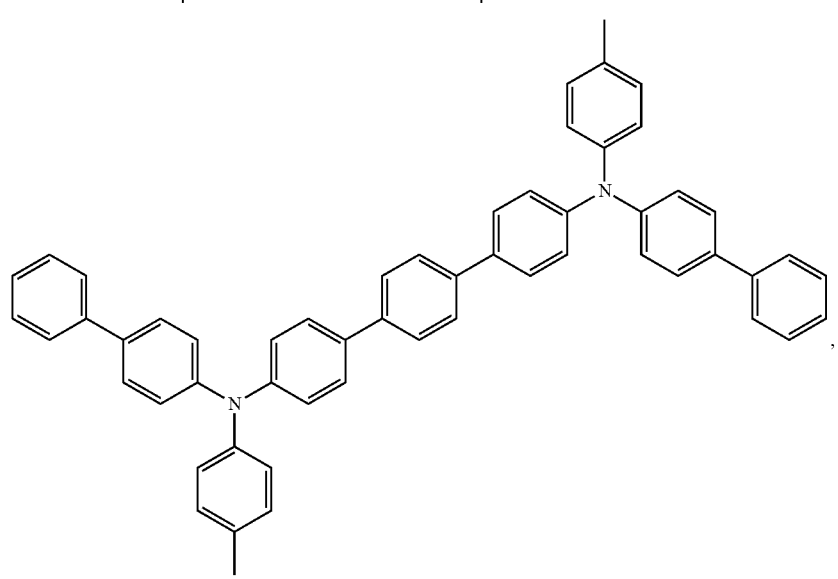

-continued
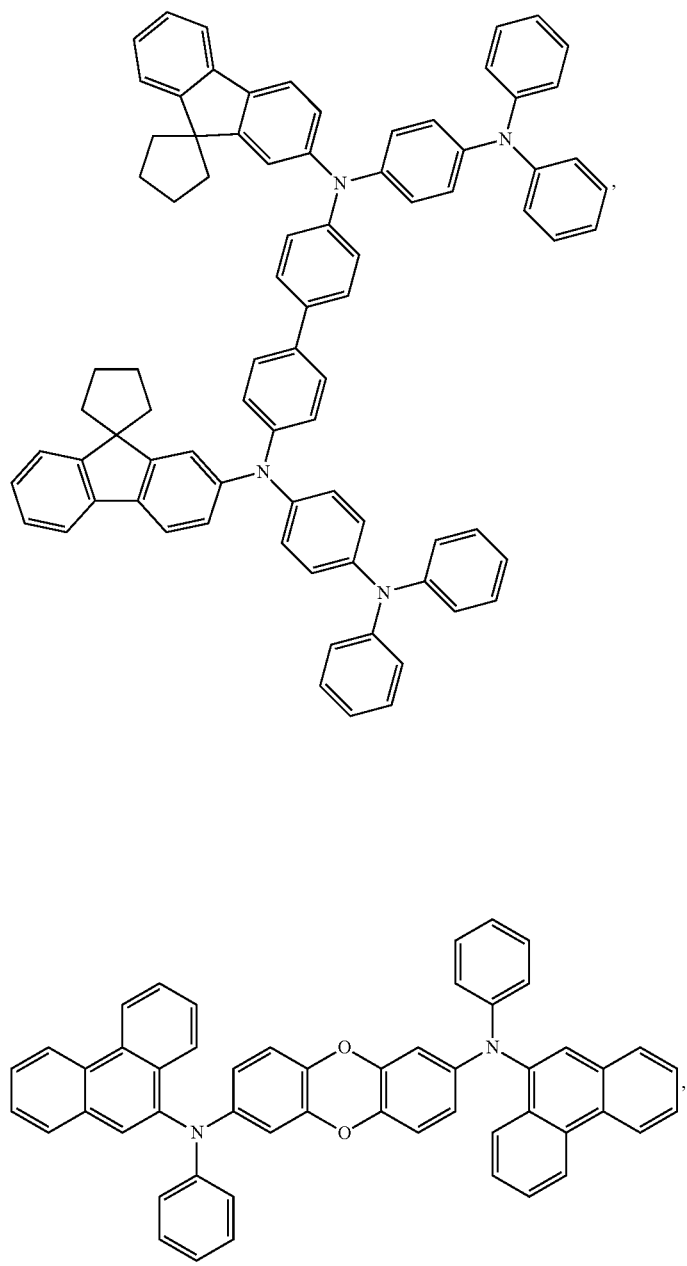
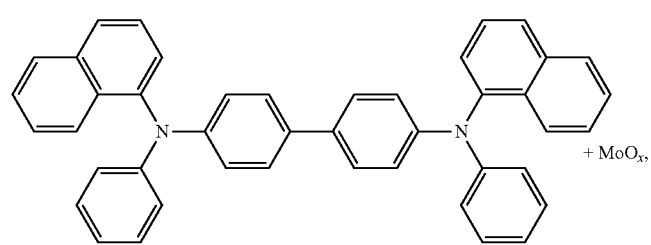
+ MoOx,

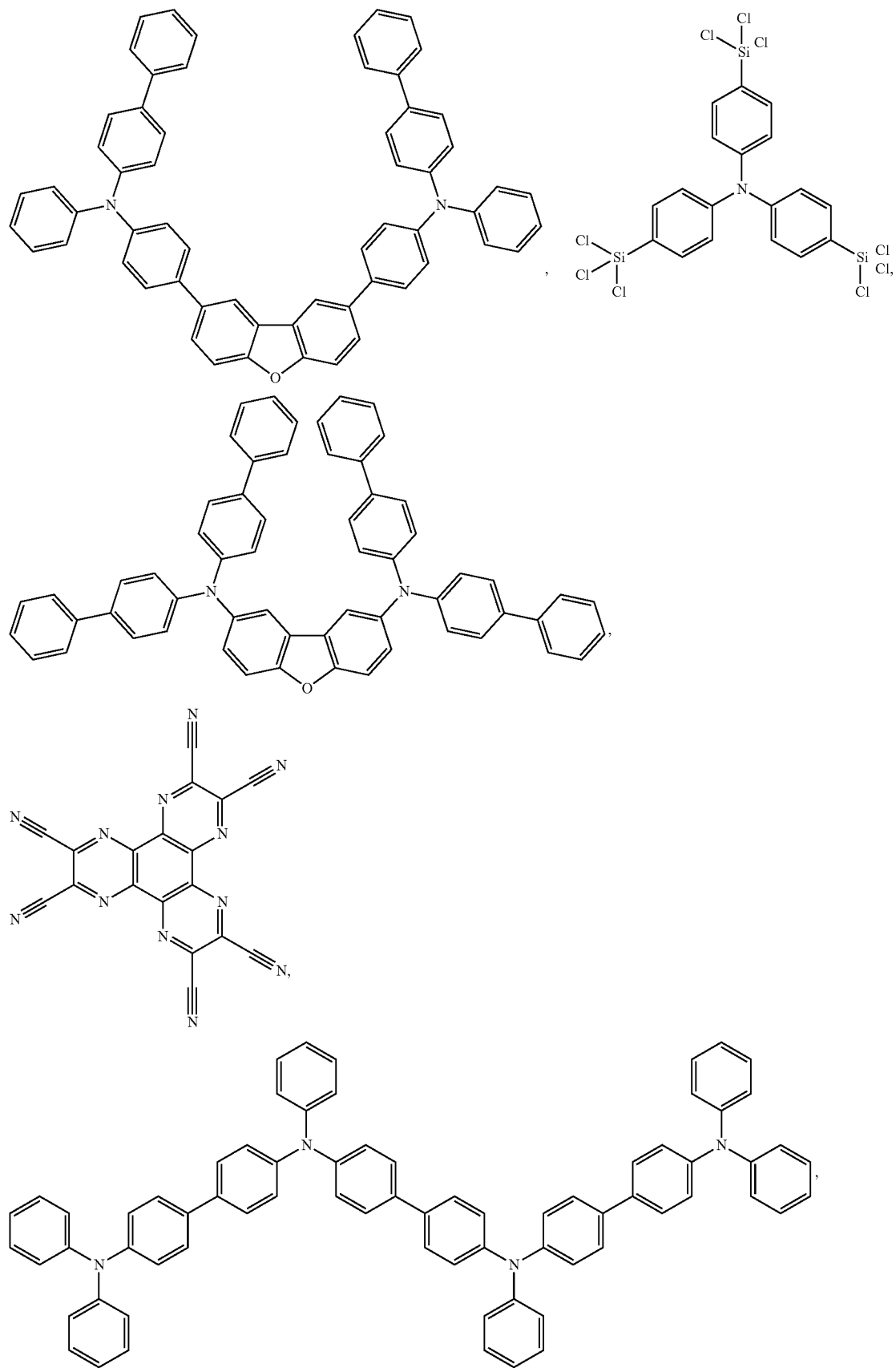

-continued
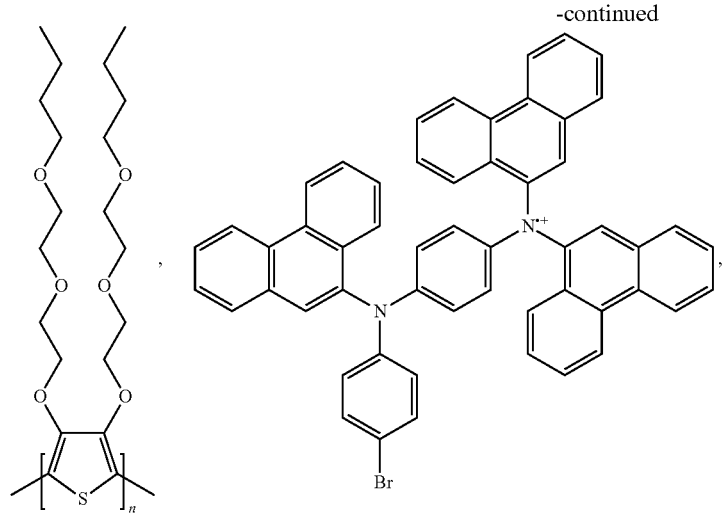
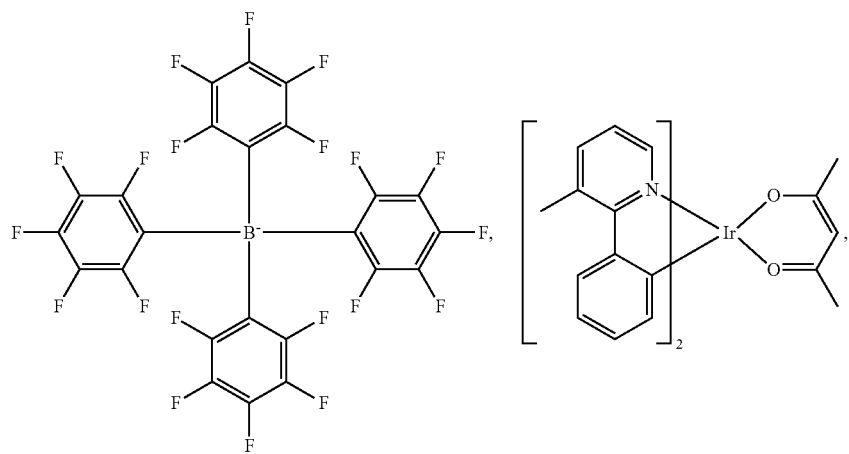
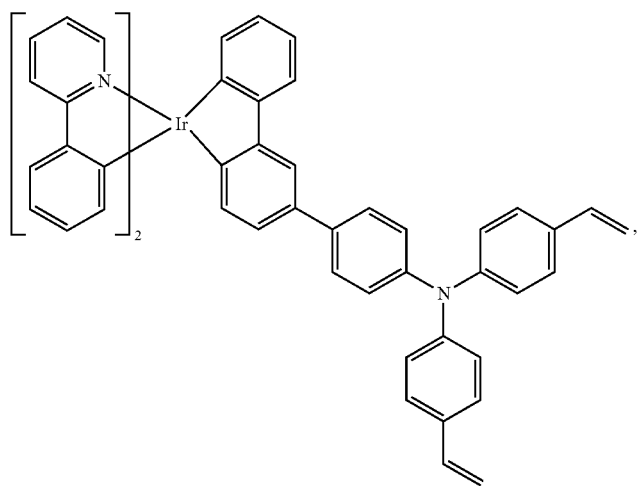

-continued
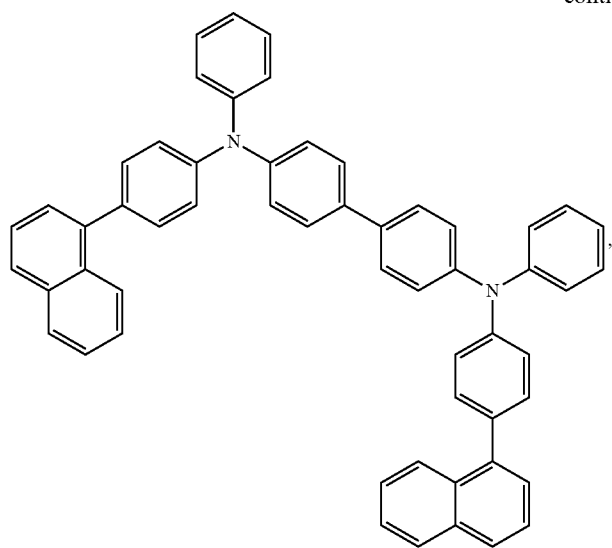
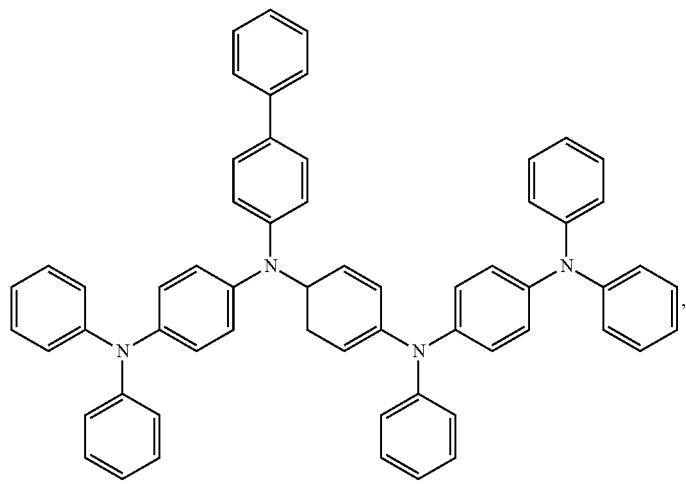
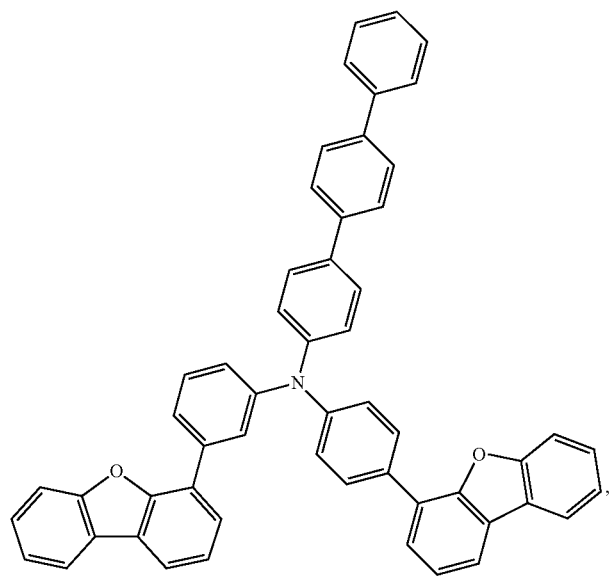

-continued
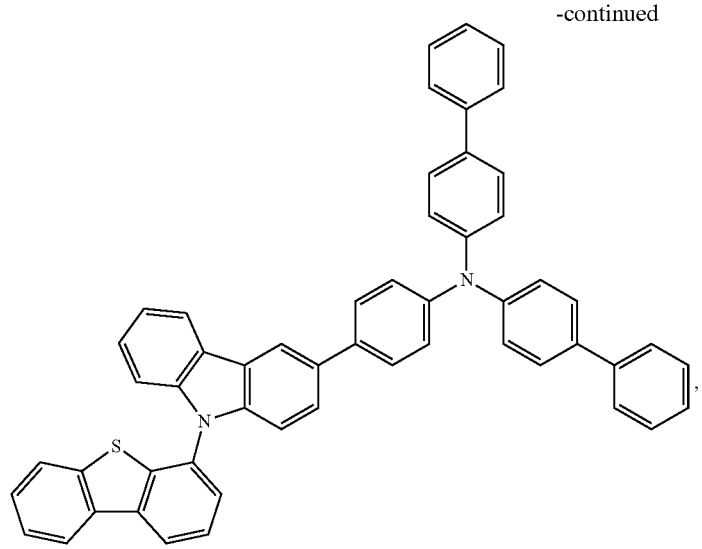
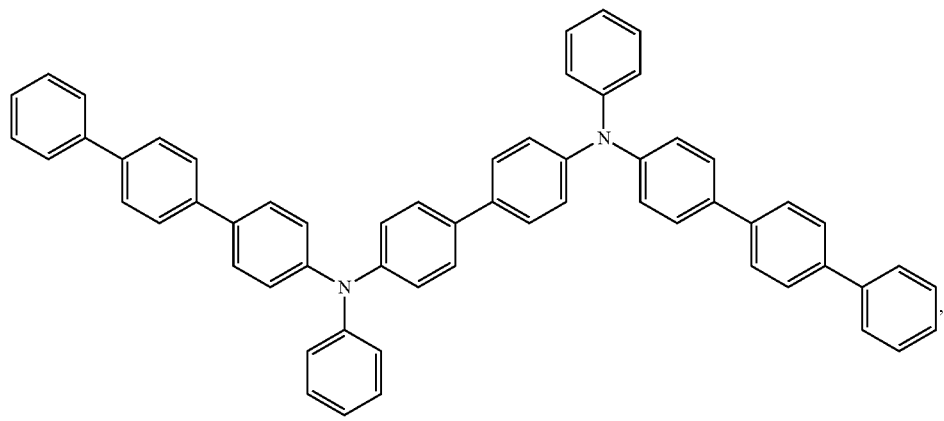
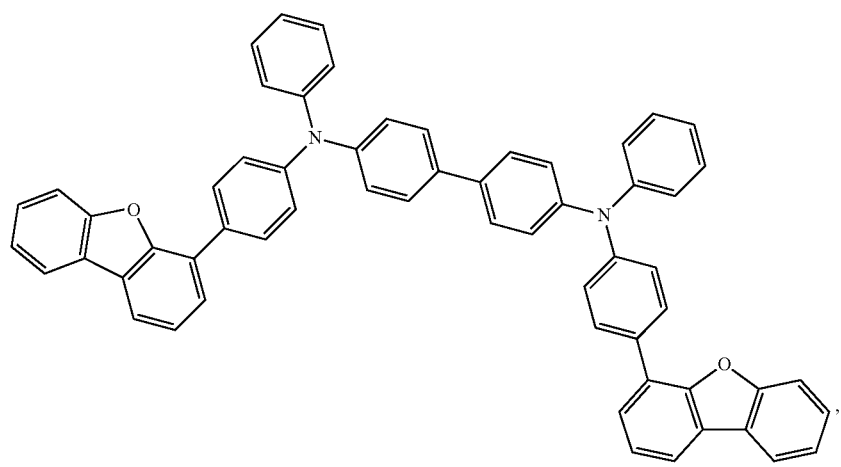

-continued
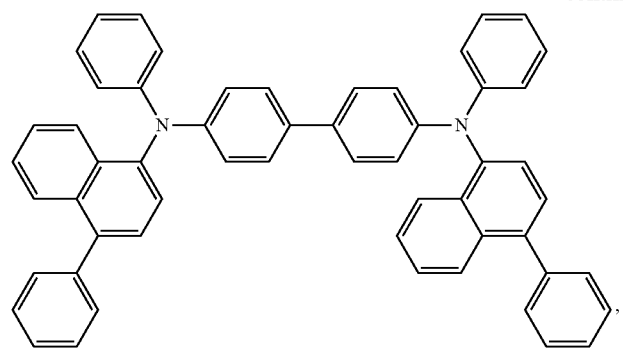
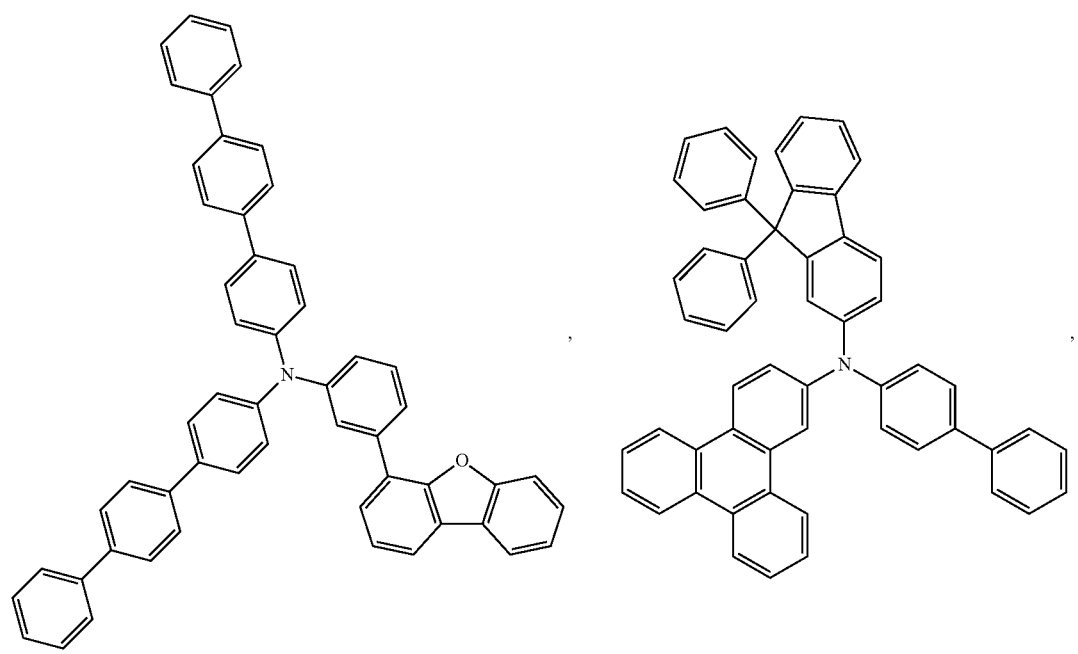
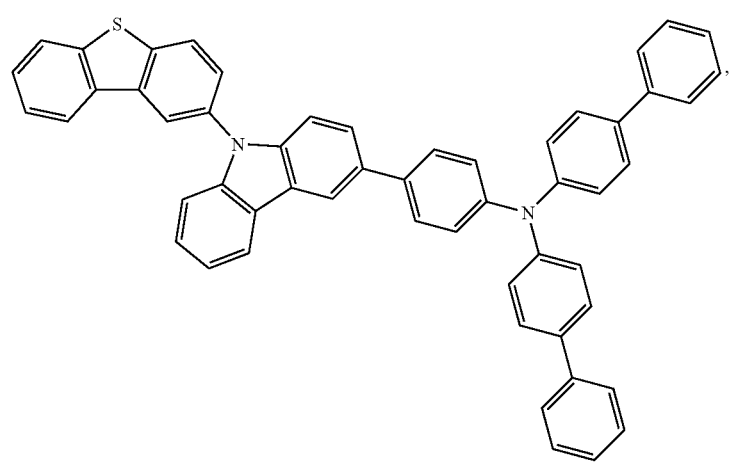

-continued
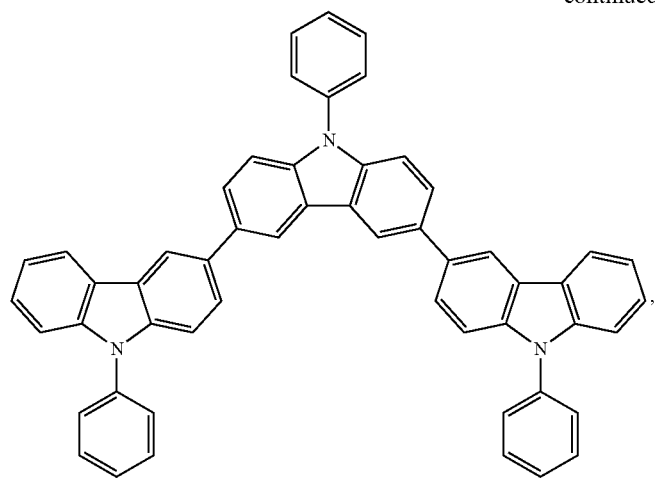
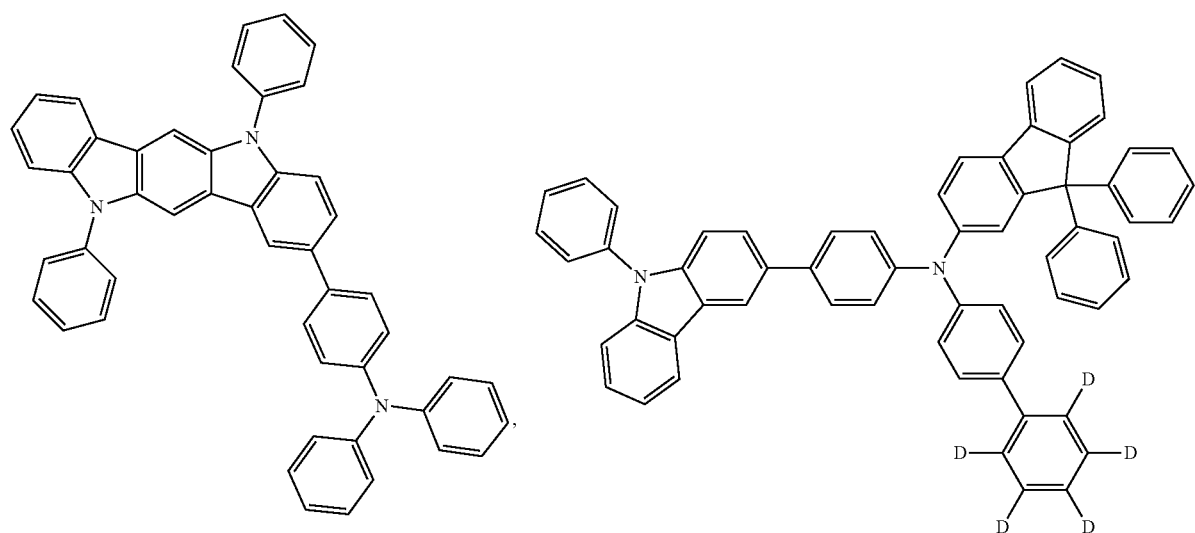
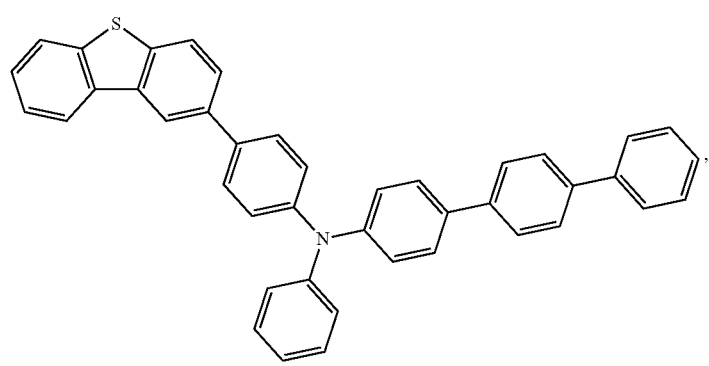

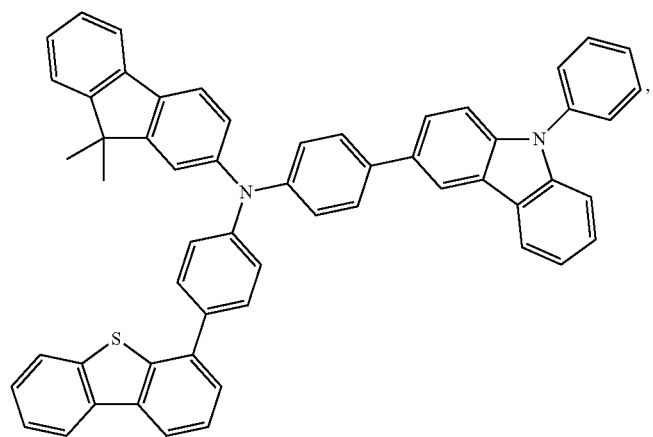
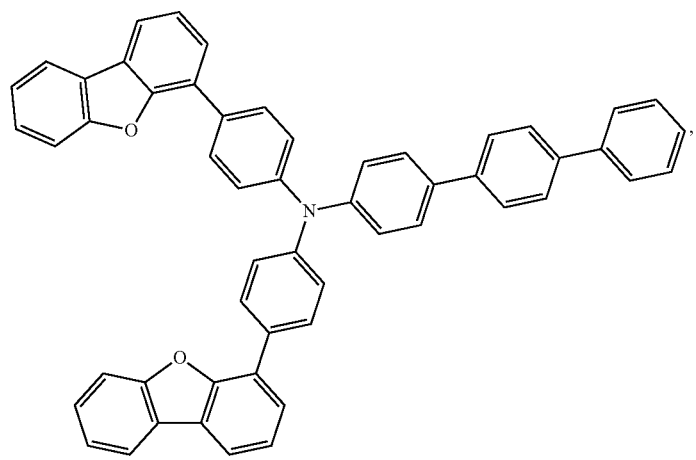
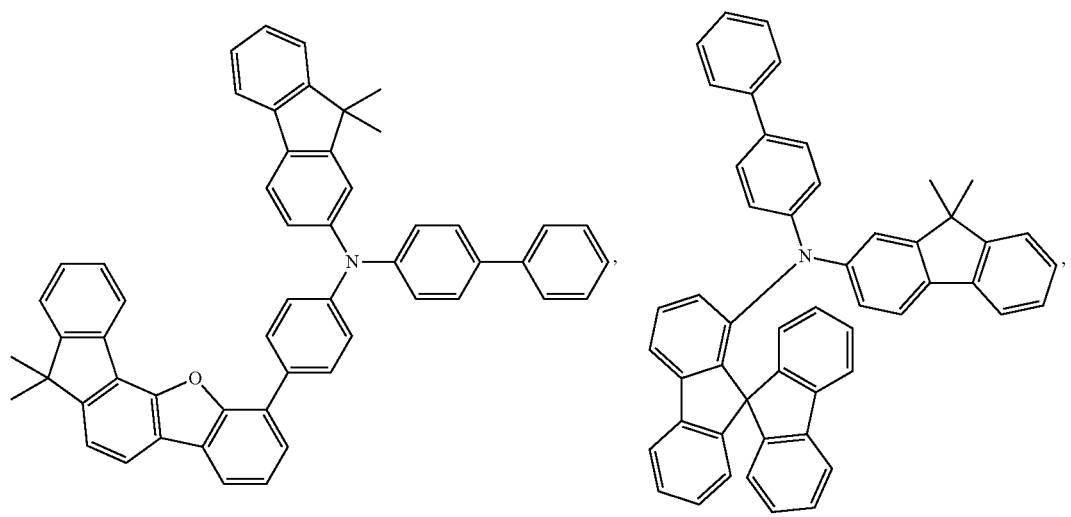

-continued
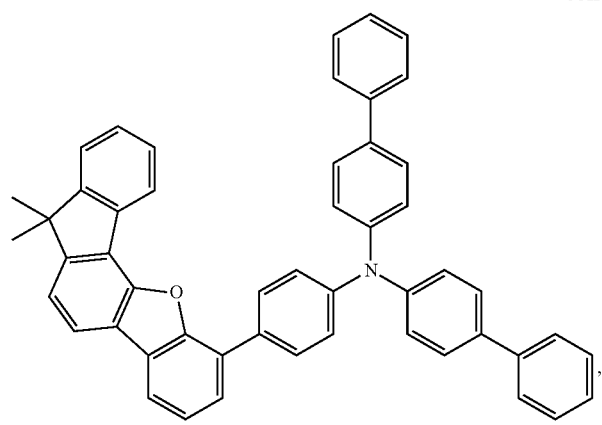
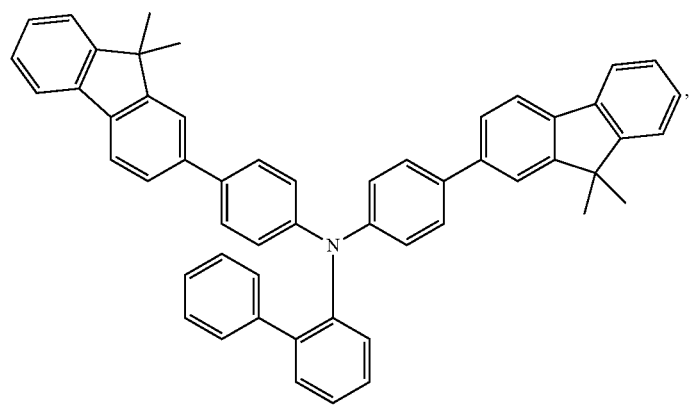
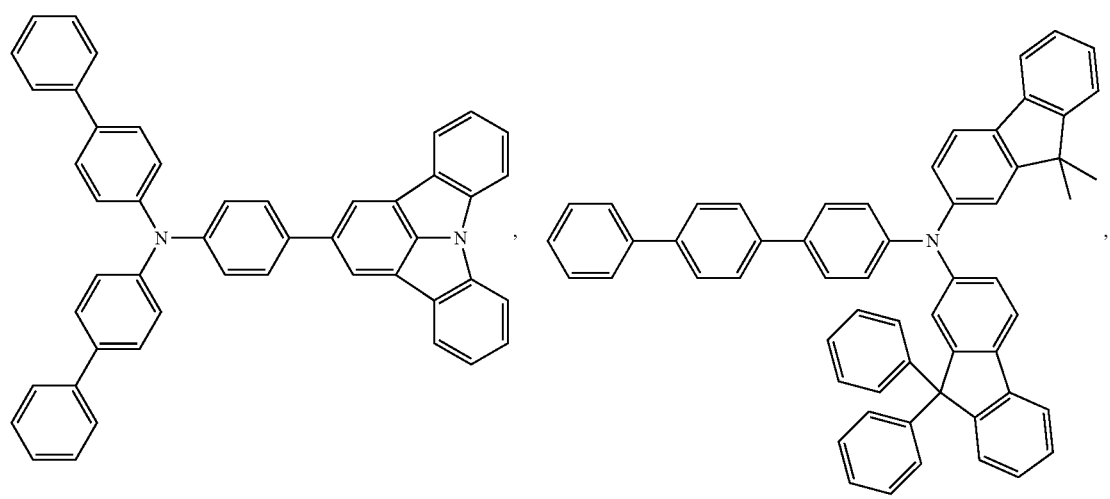

-continued
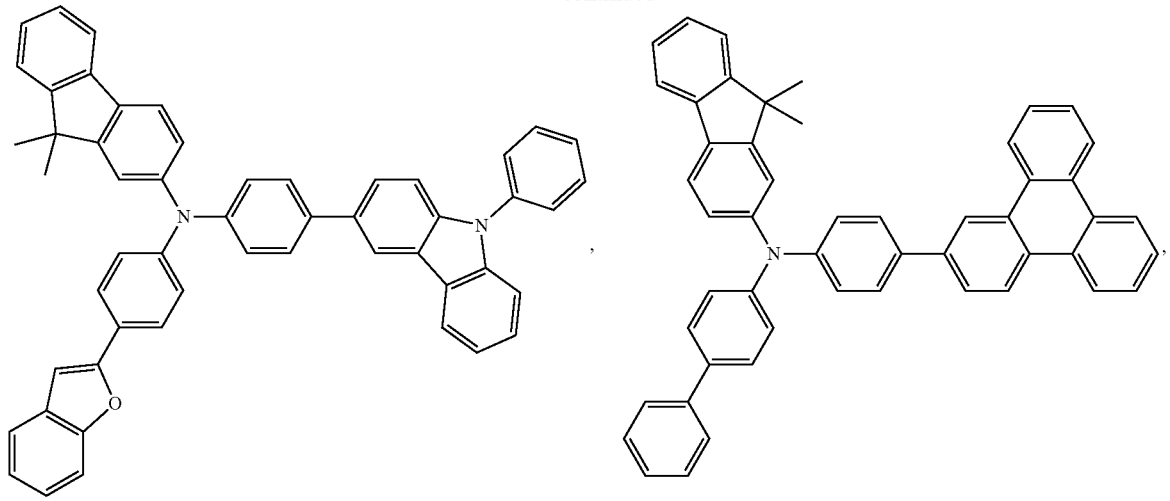
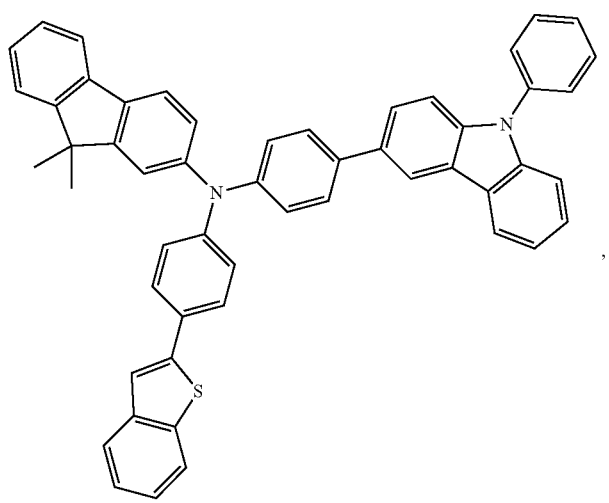
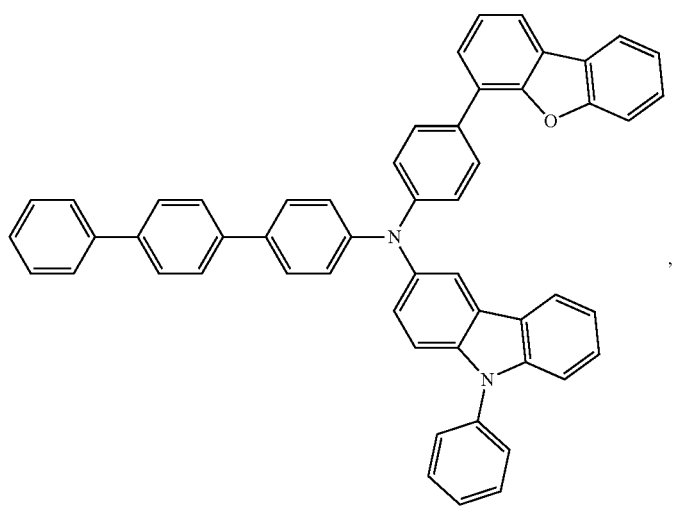

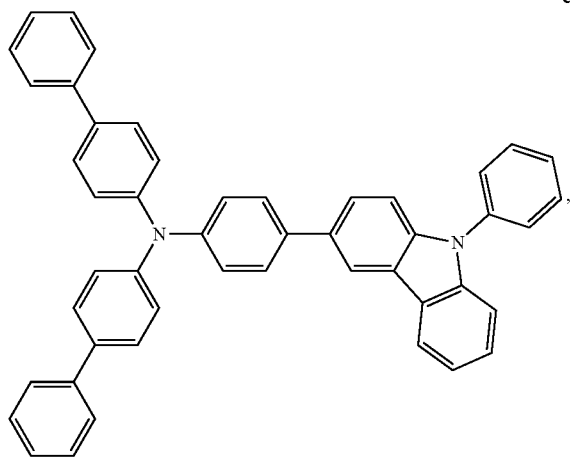
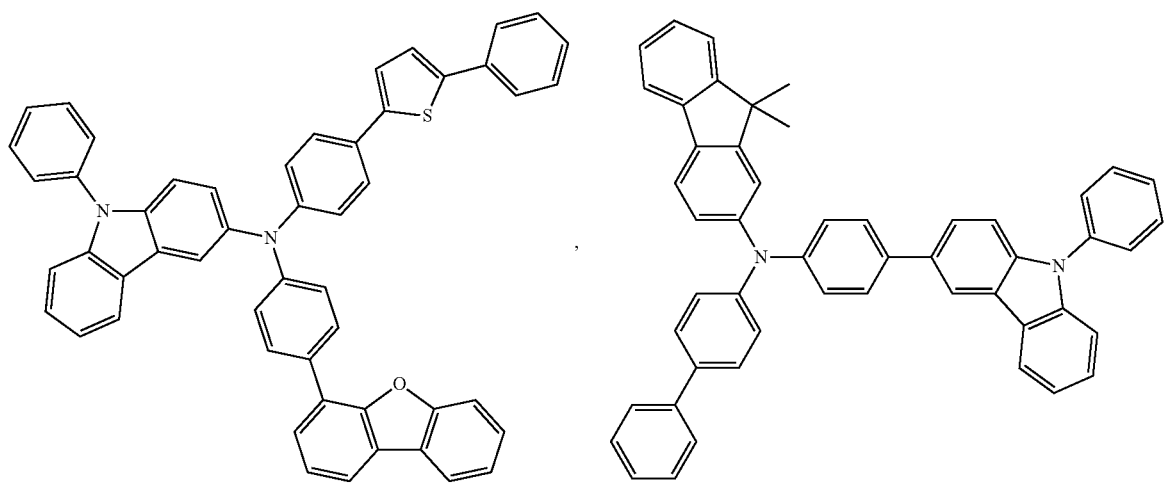
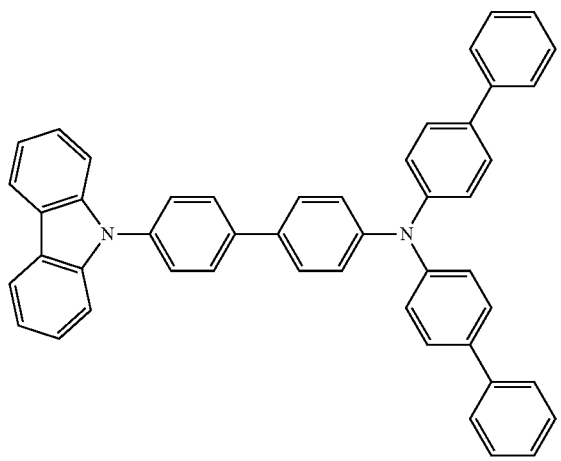

-continued
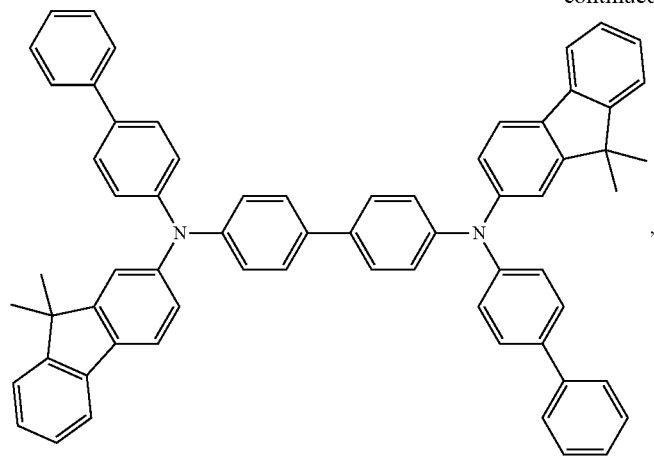
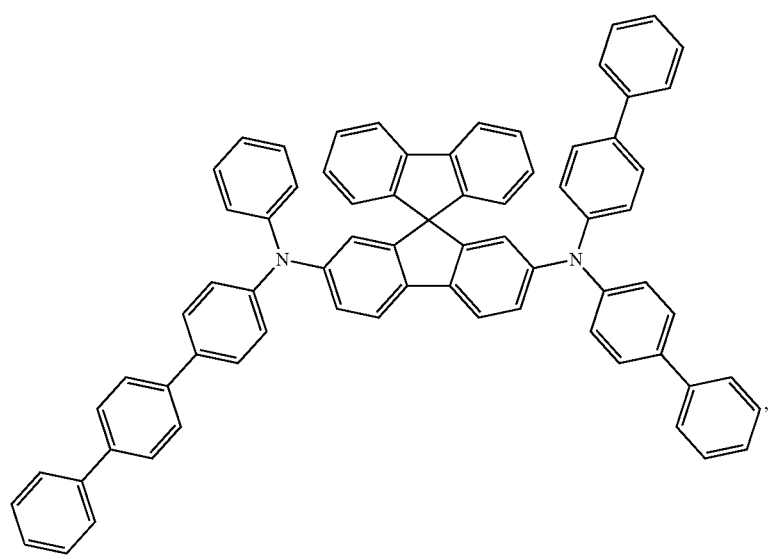
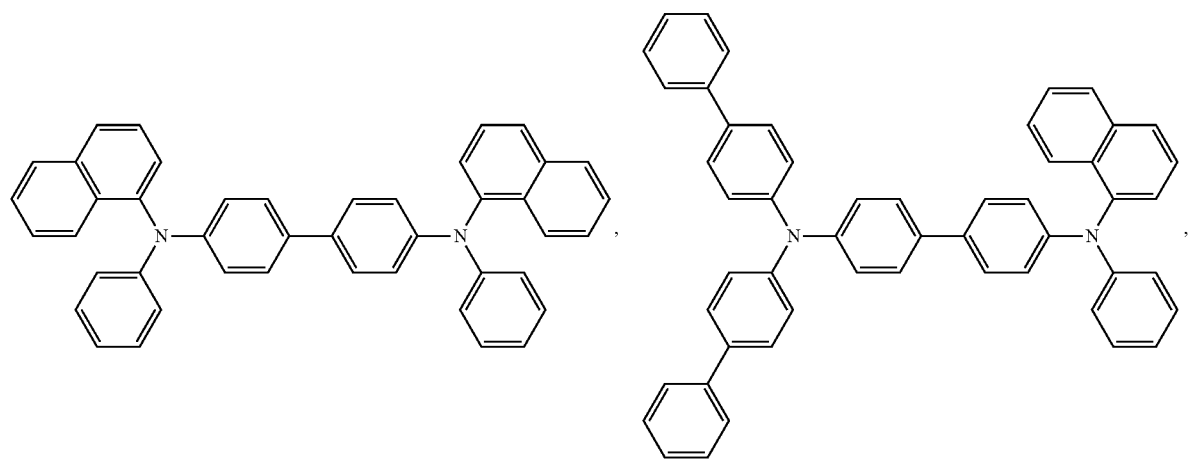

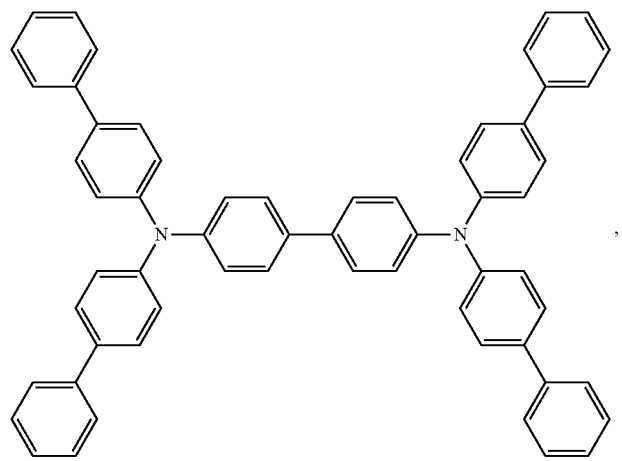
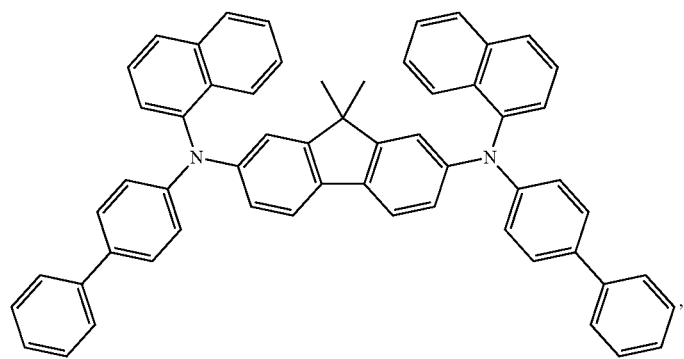
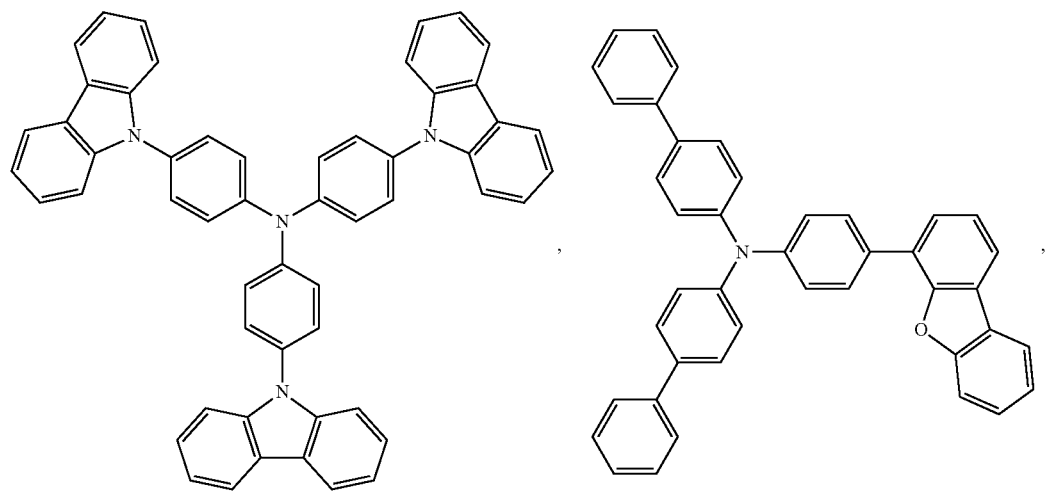

-continued

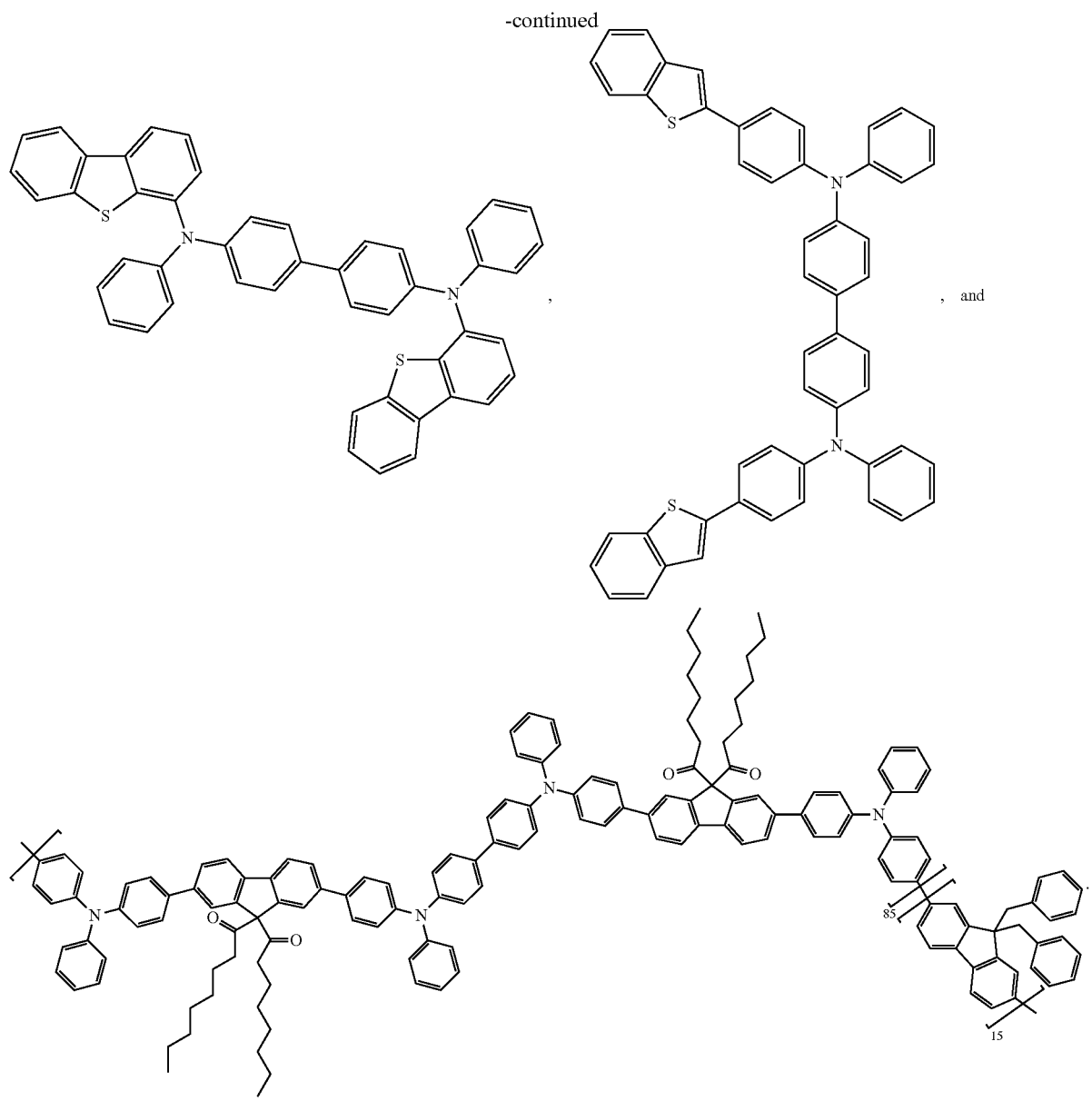

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

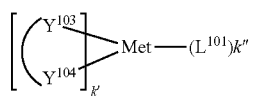

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

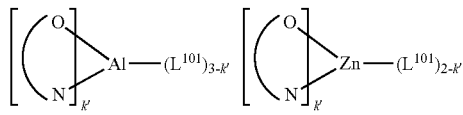

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

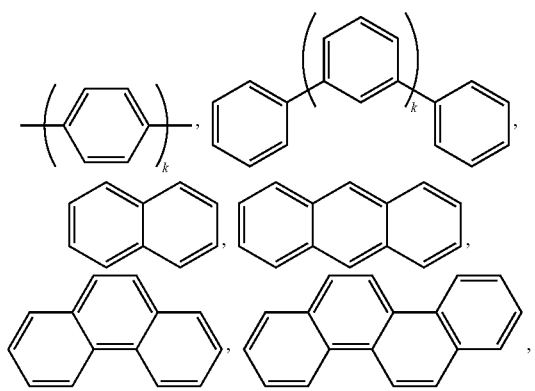

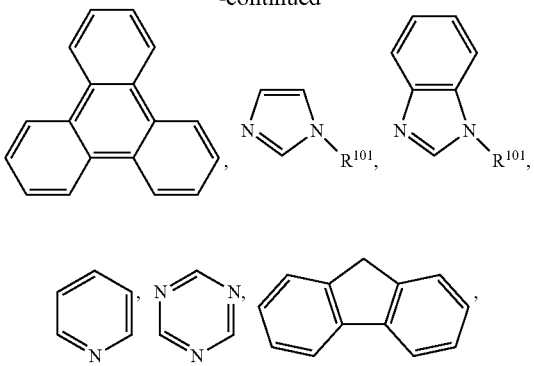

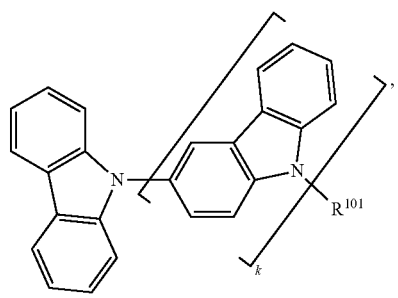

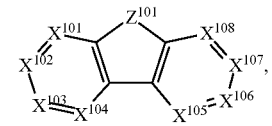

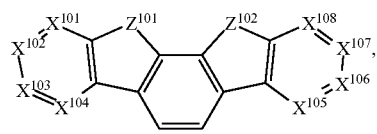

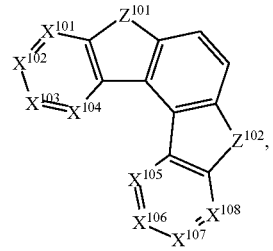

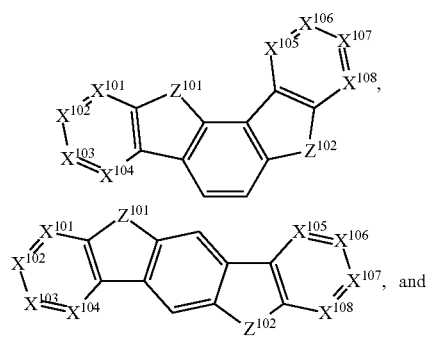

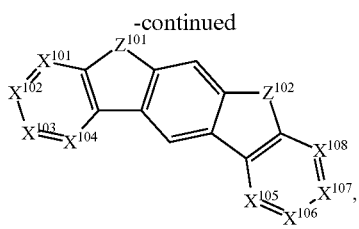

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

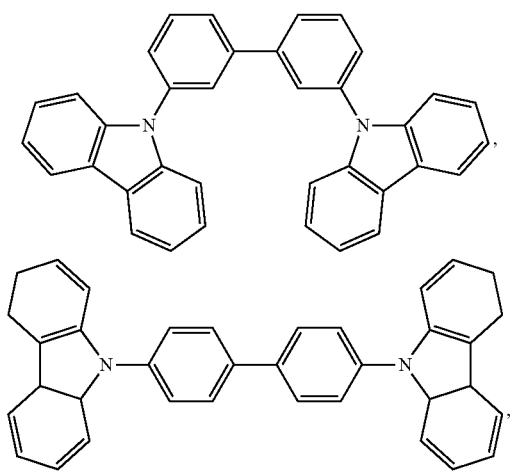

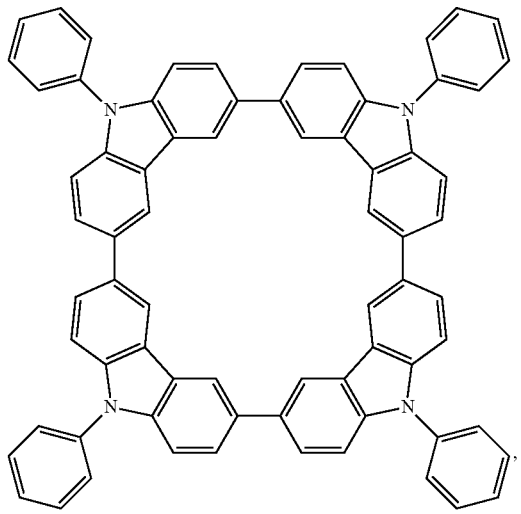

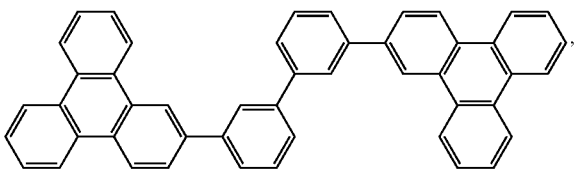

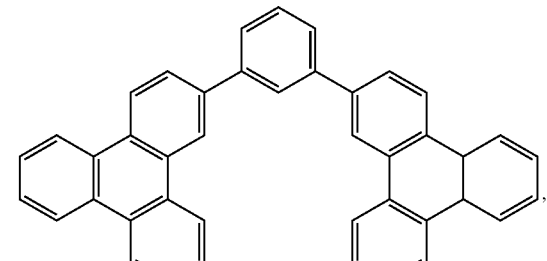

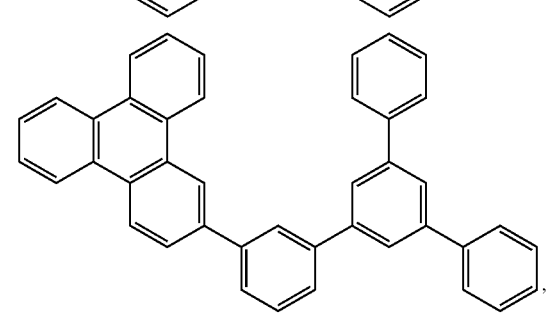

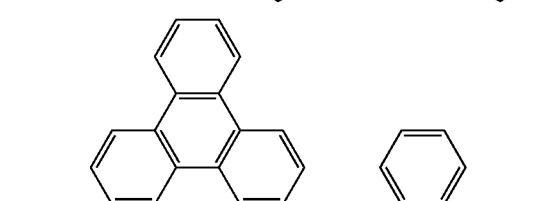

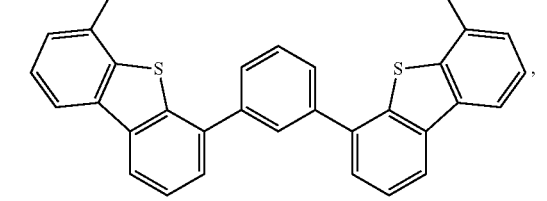

95
-continued
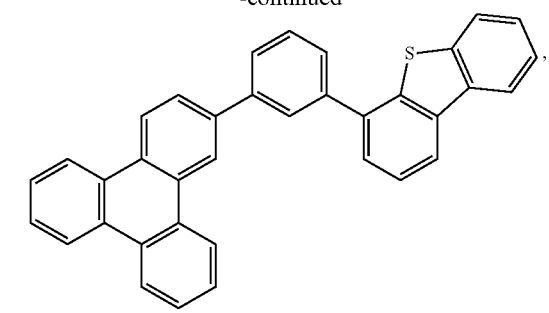
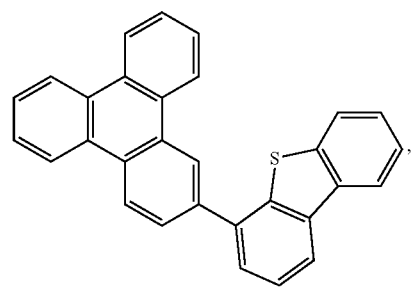
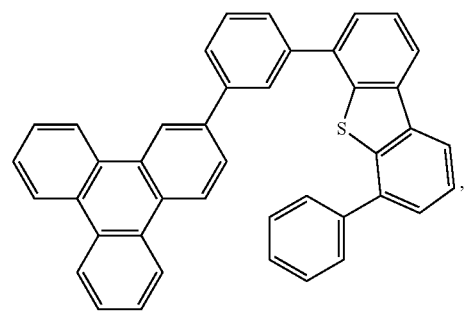
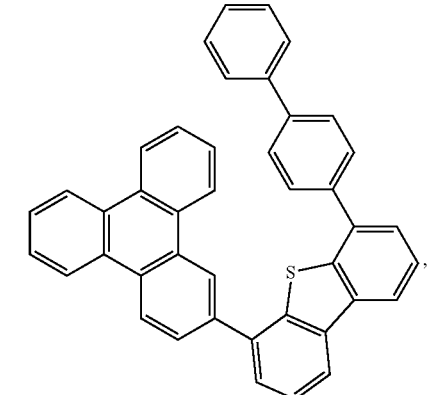
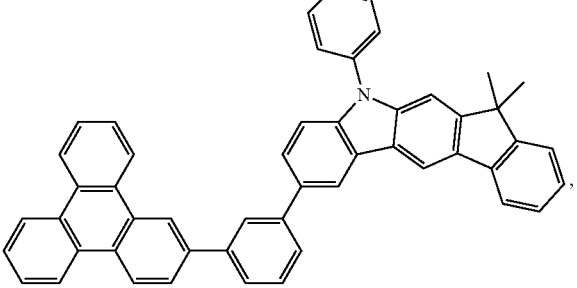
96
-continued
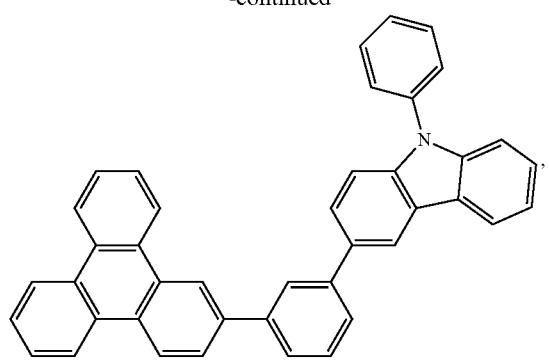
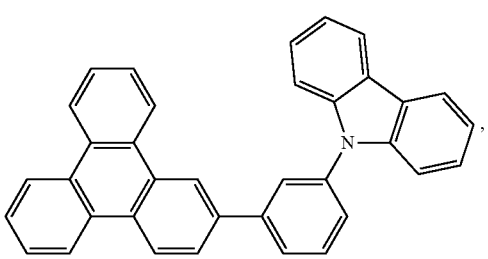
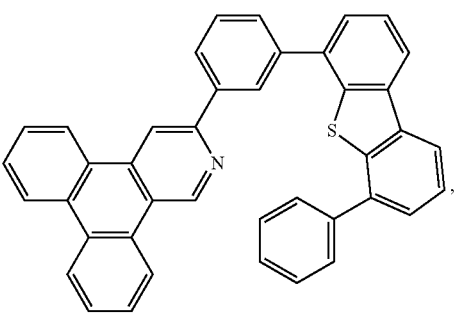
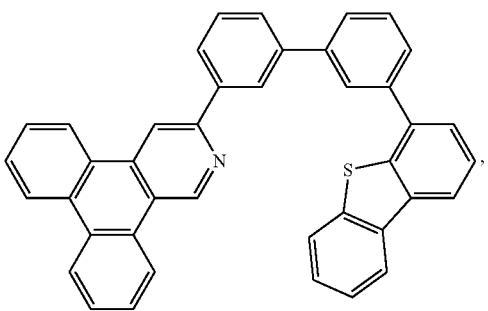
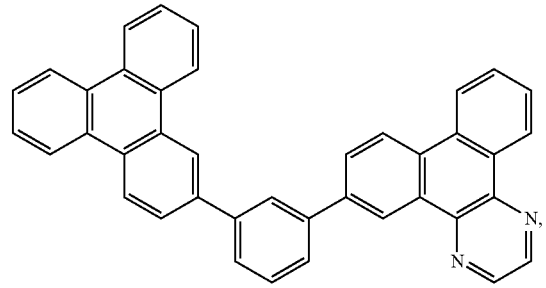

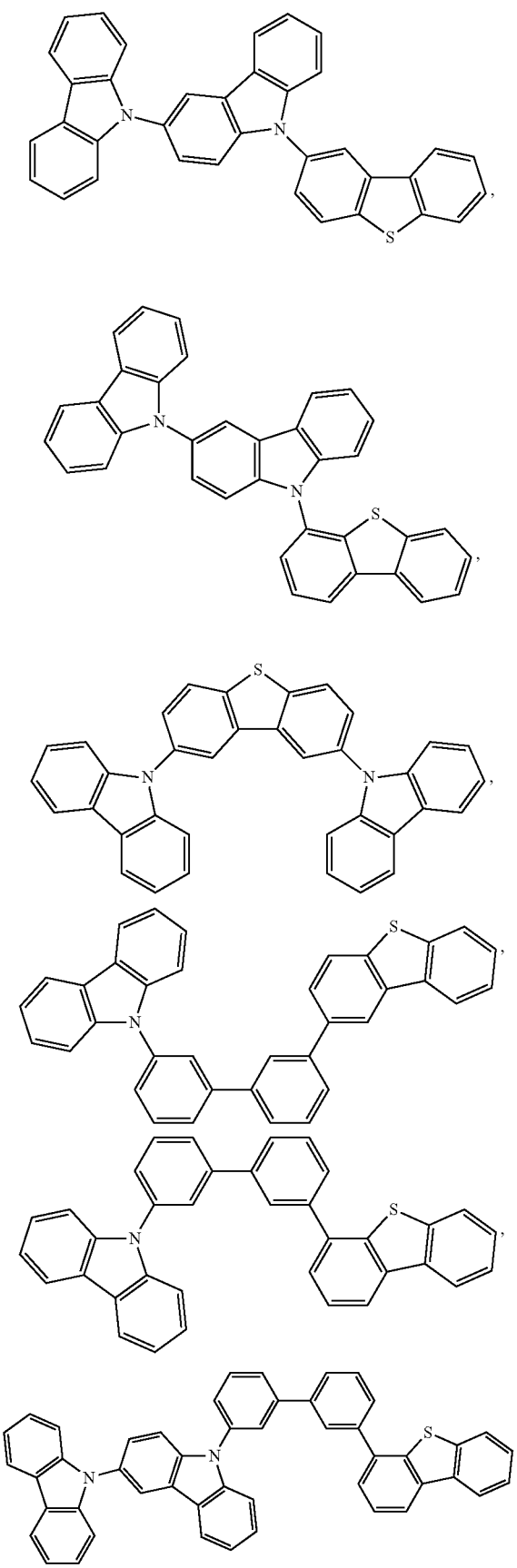
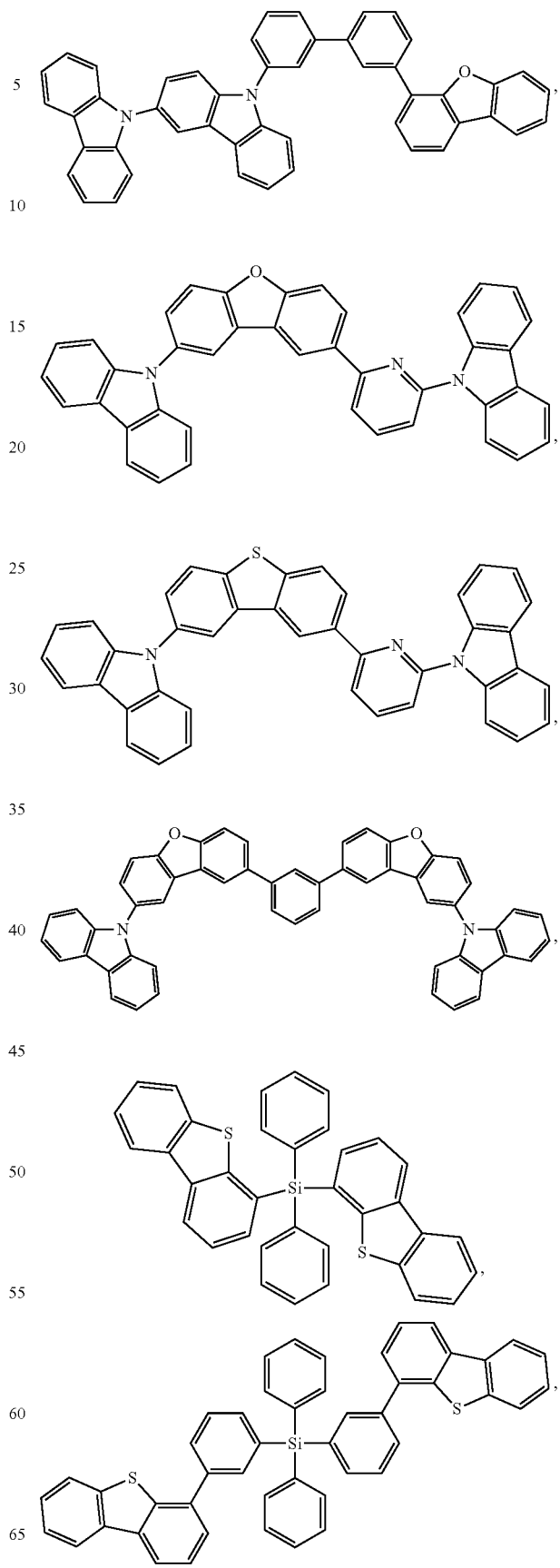

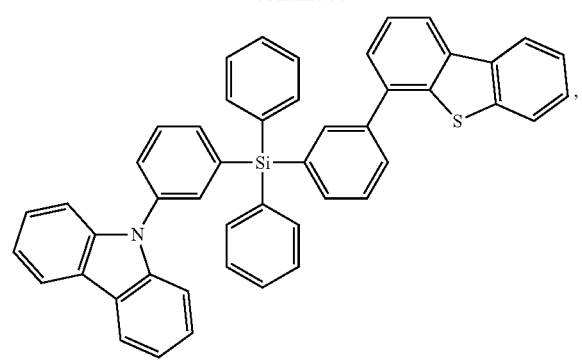
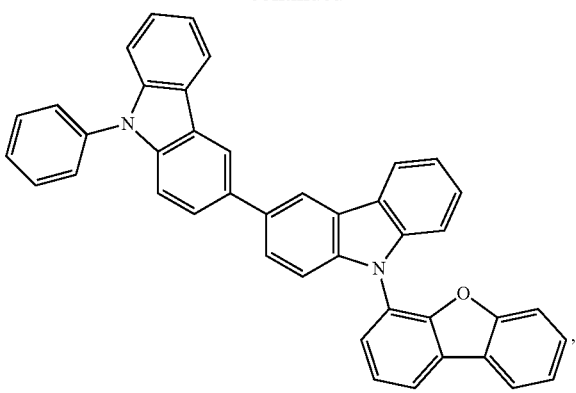
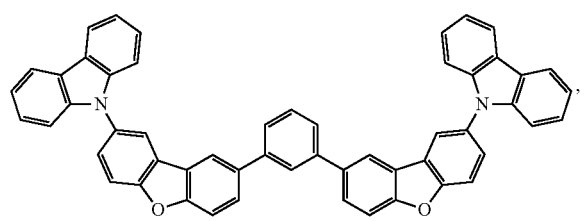
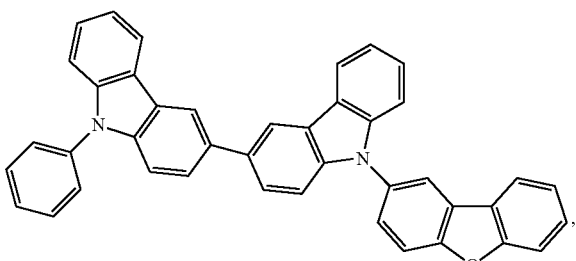
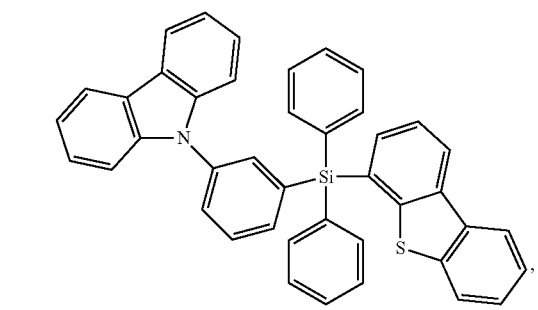
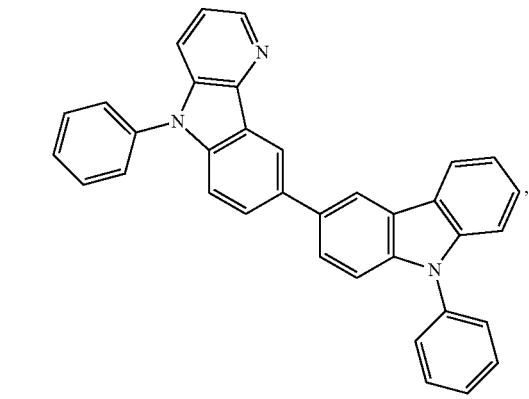
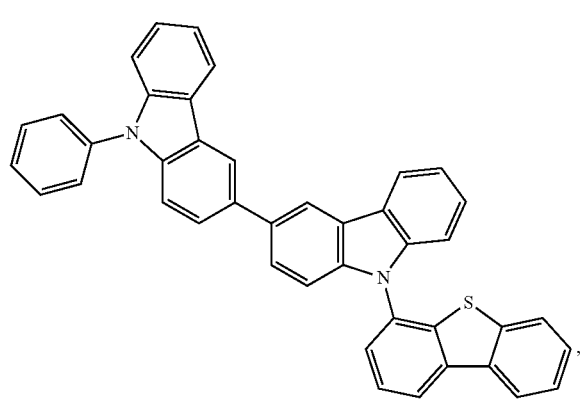
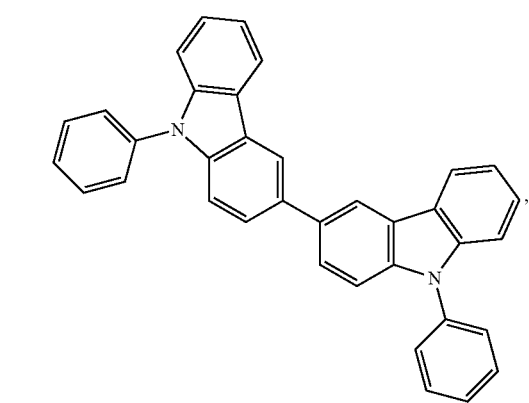

101
-continued
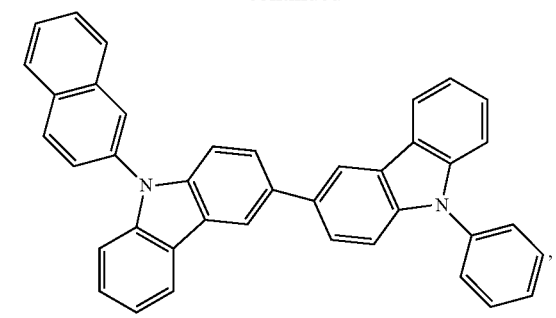
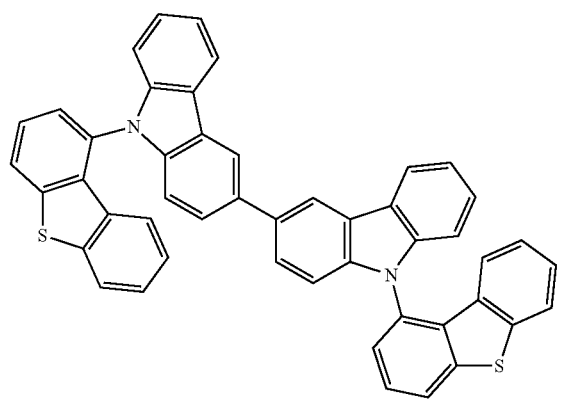
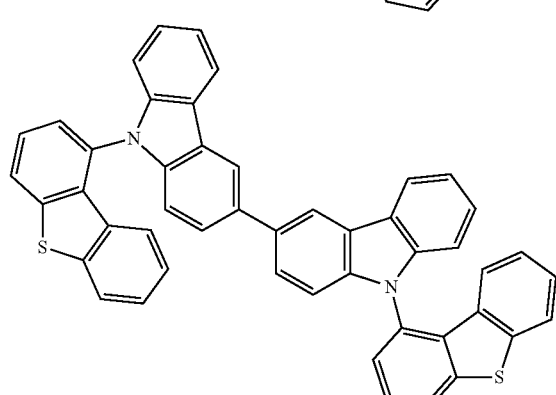
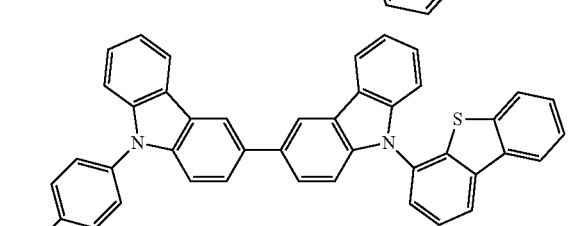
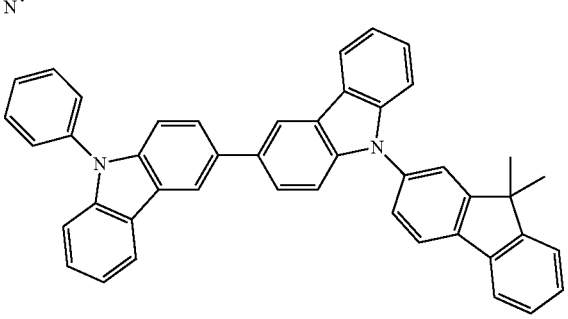
102
-continued
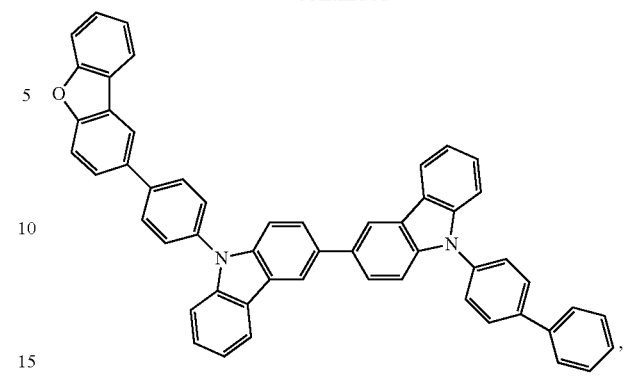
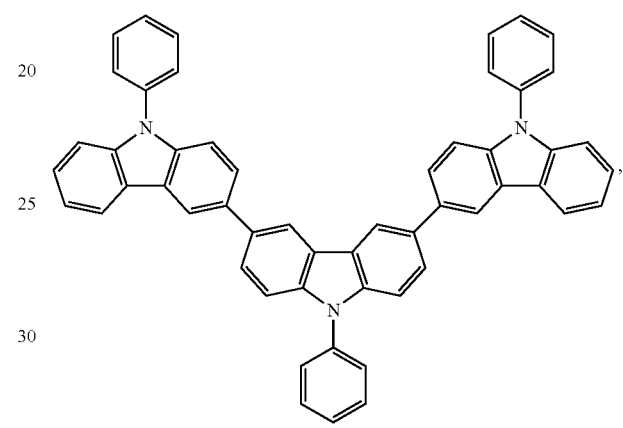
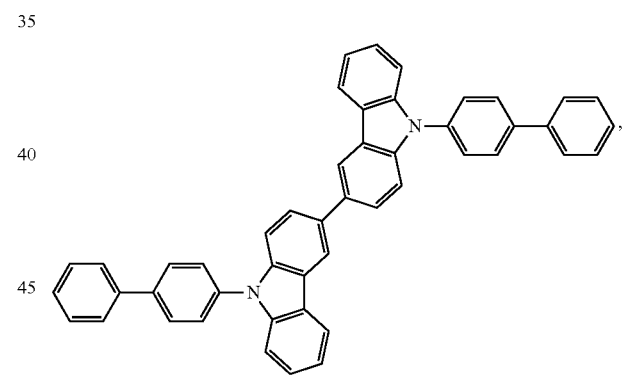
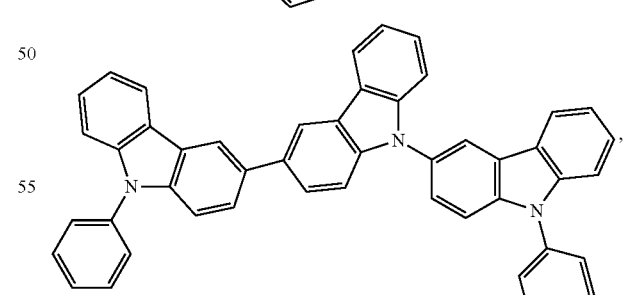
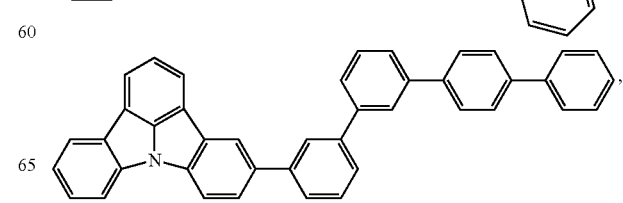

103
-continued
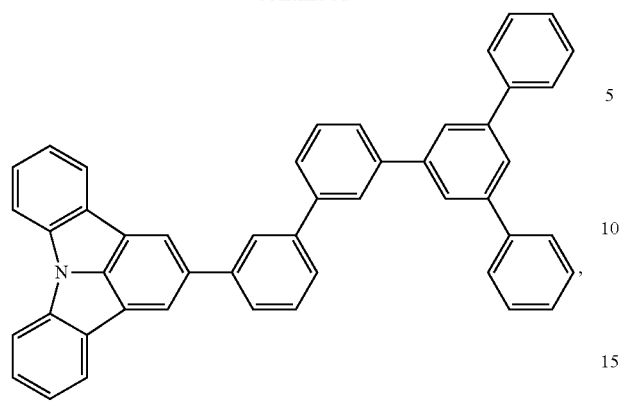
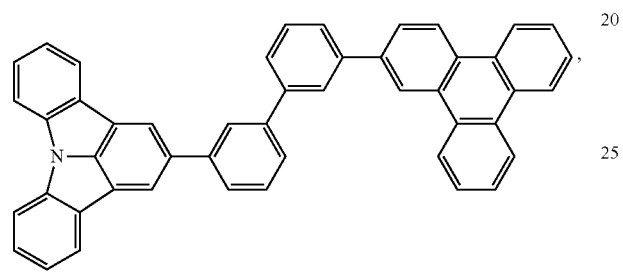
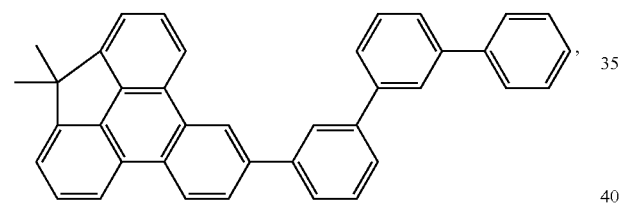
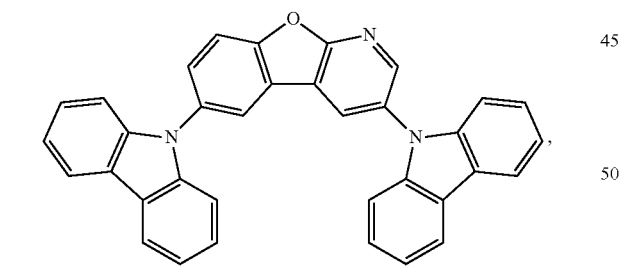
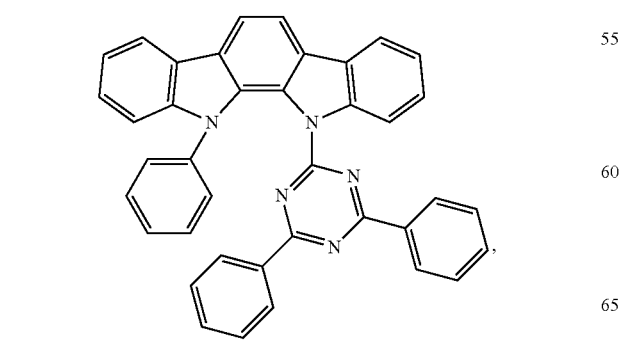
104
-continued
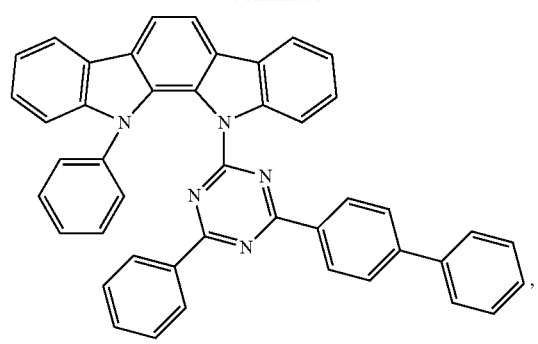
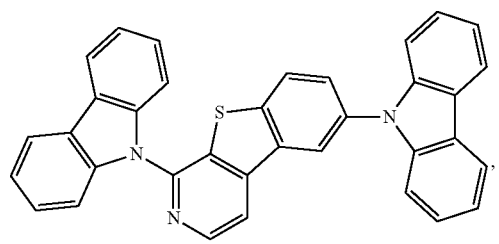
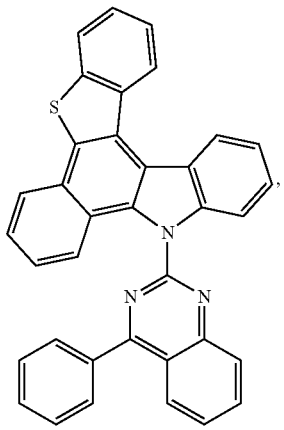
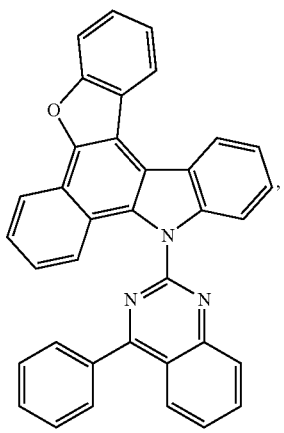

105
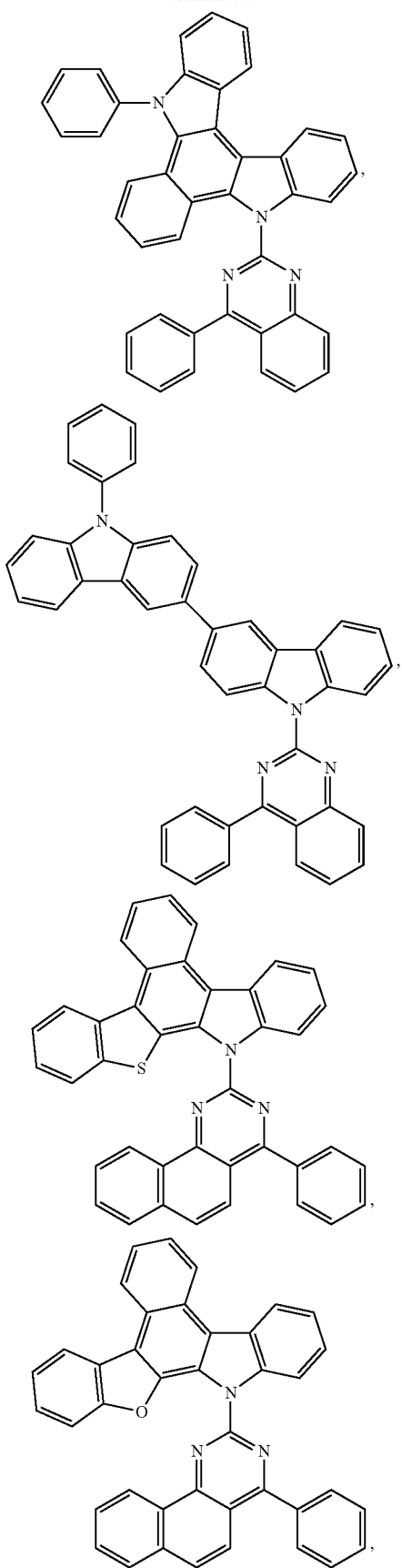
106
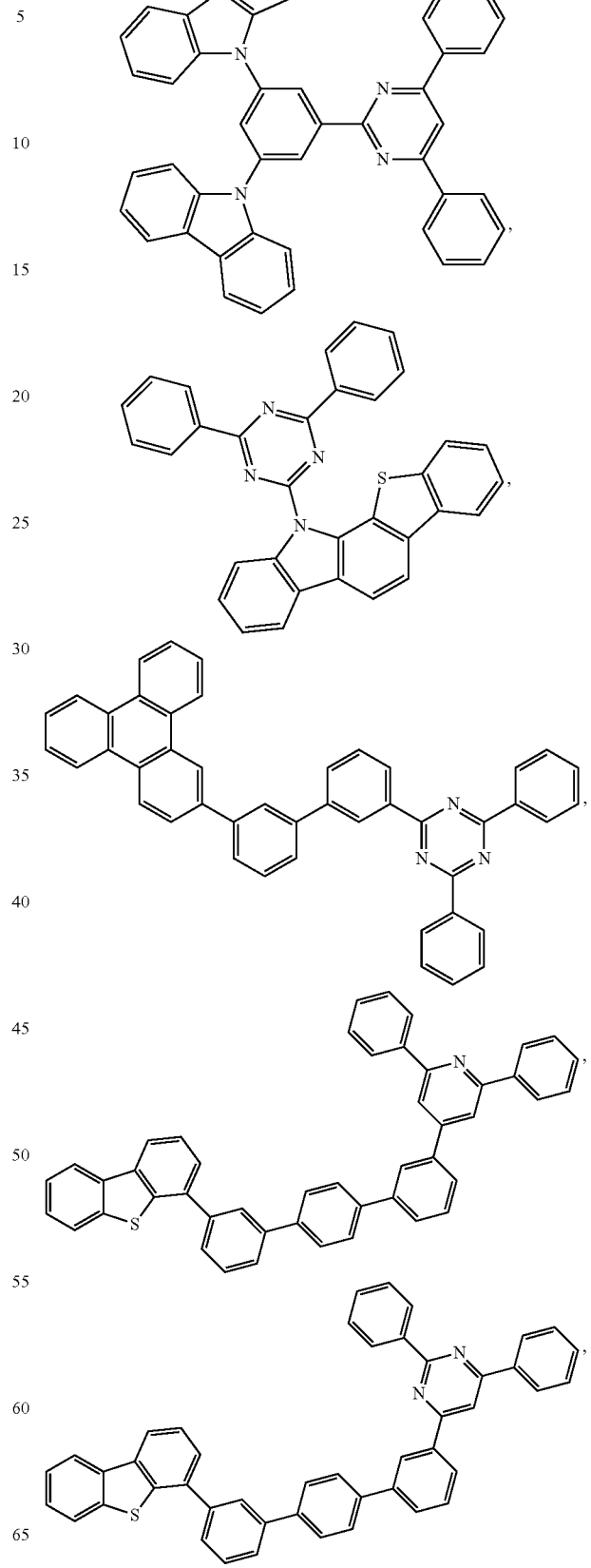

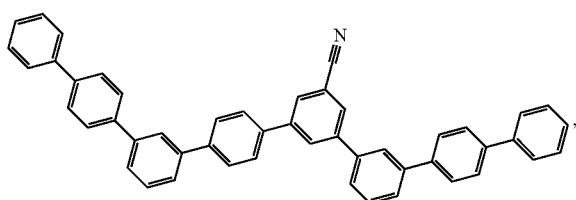

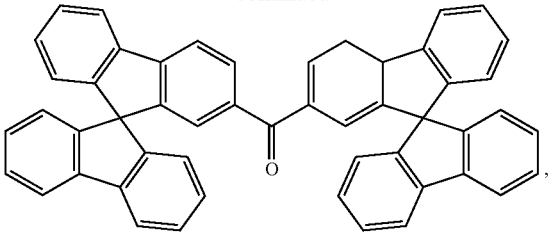

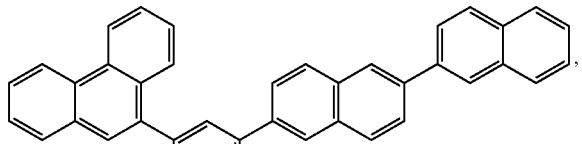

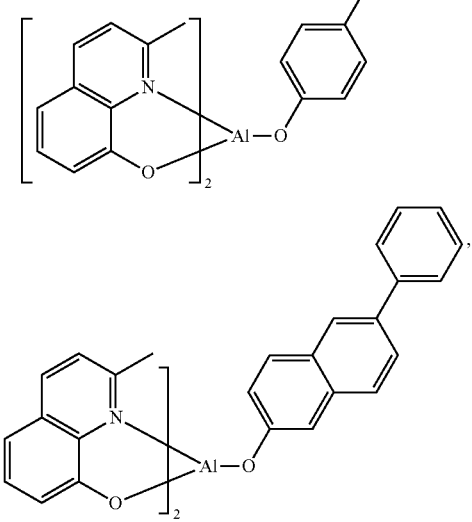

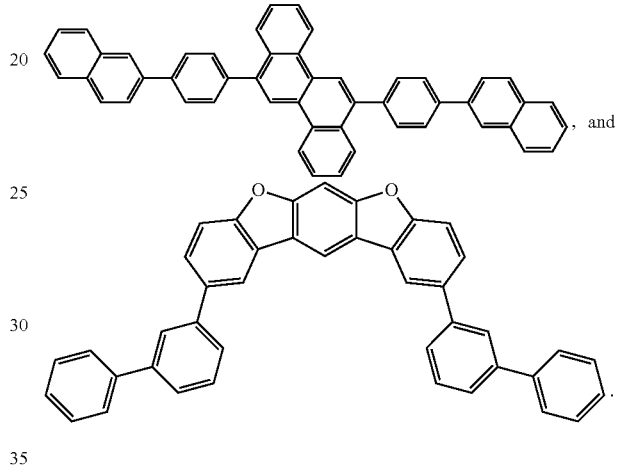

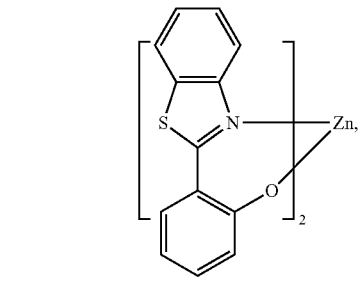

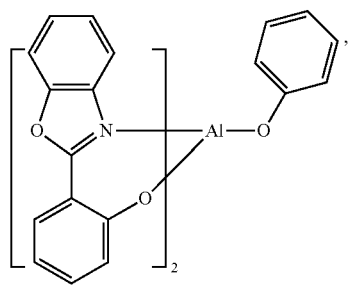

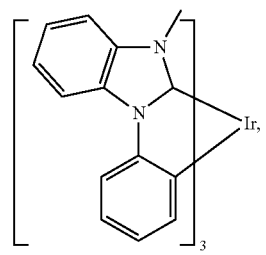

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Pat. Nos. 6,699,599, 6,916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
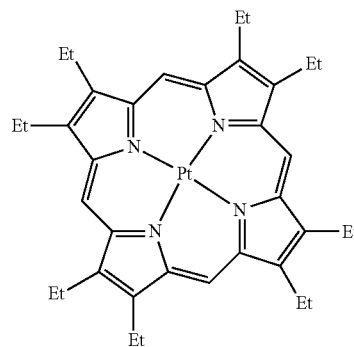
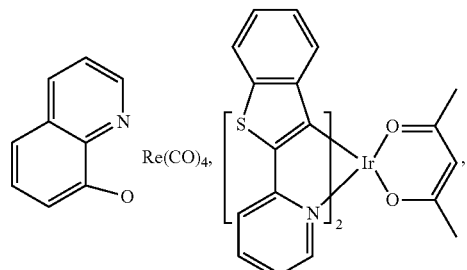
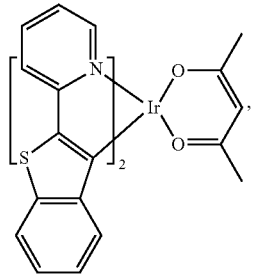
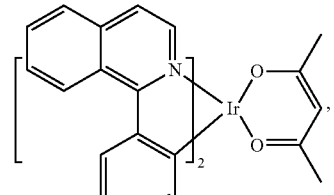
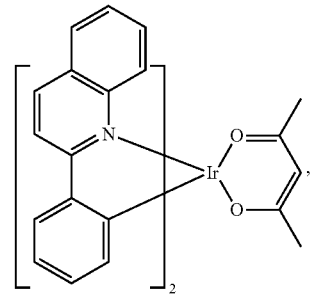
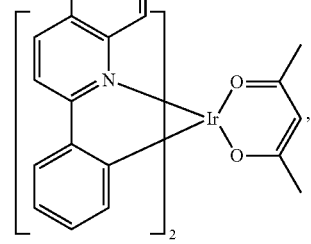
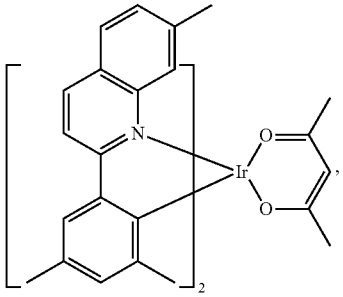
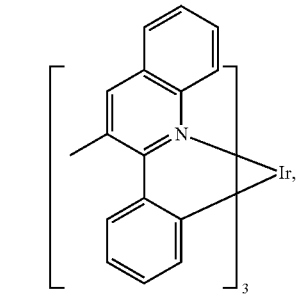
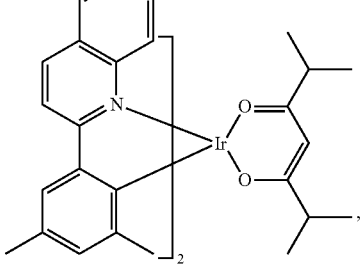

111
-continued
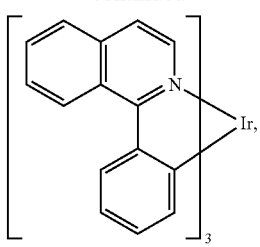
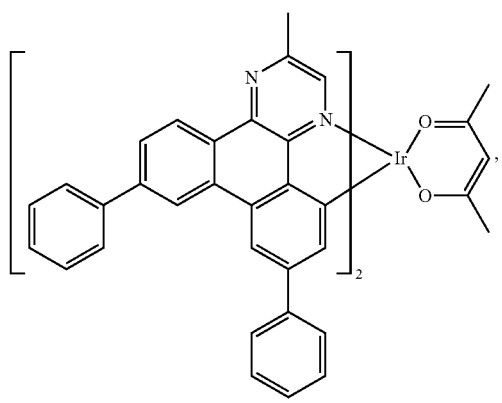
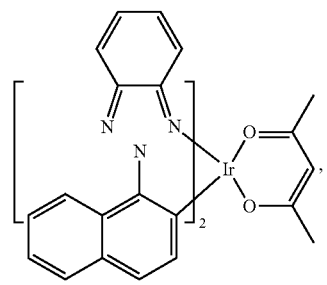
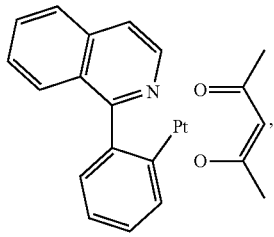
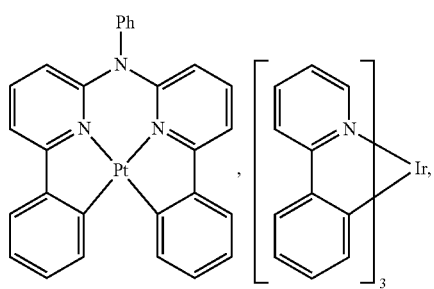
112
-continued
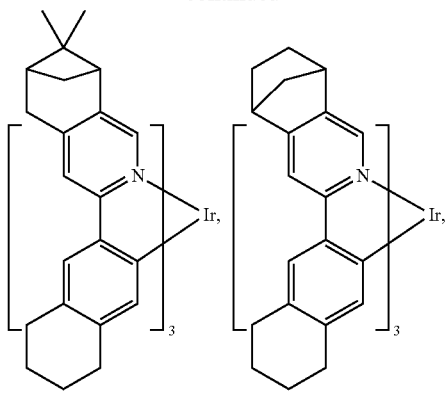
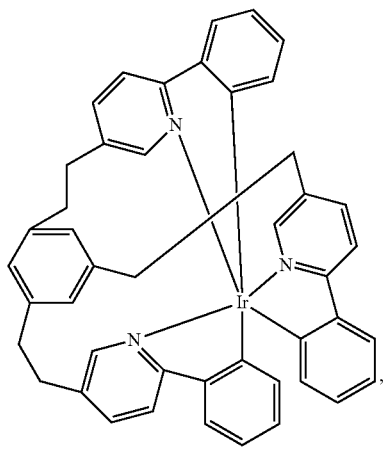
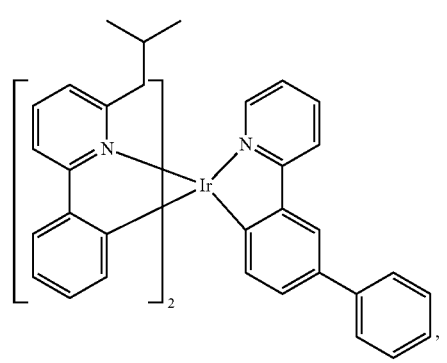
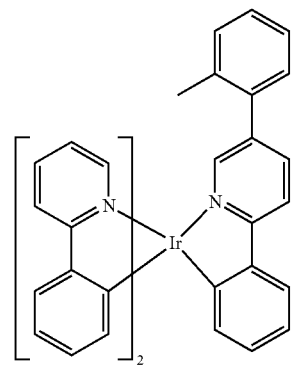

-continued
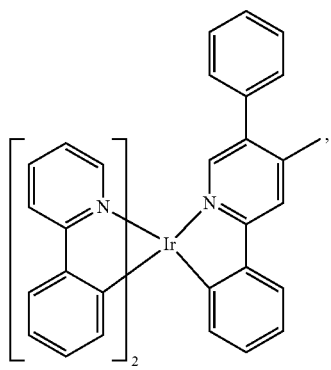
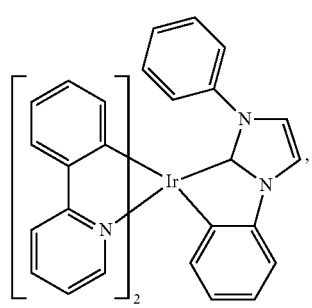
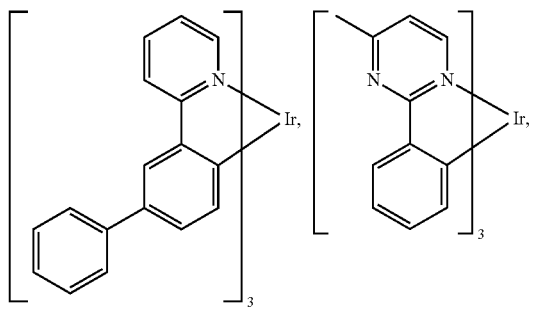
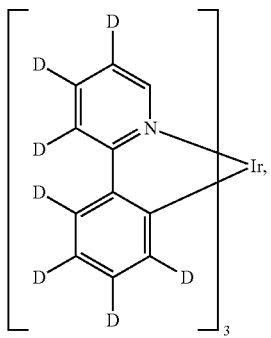
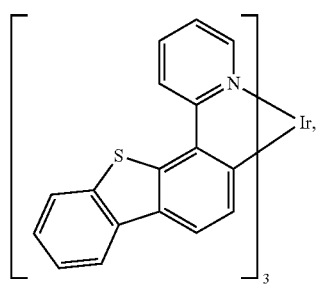
-continued
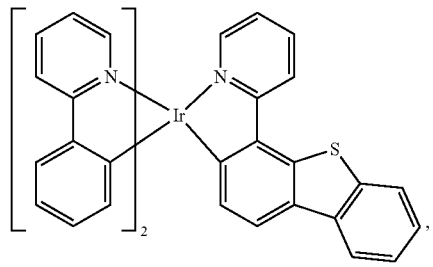
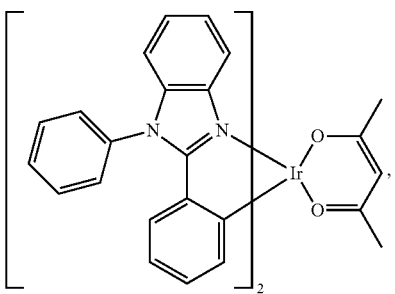
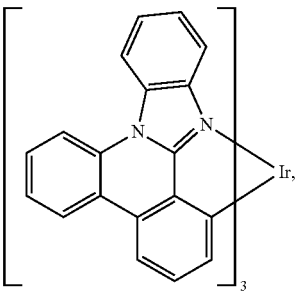
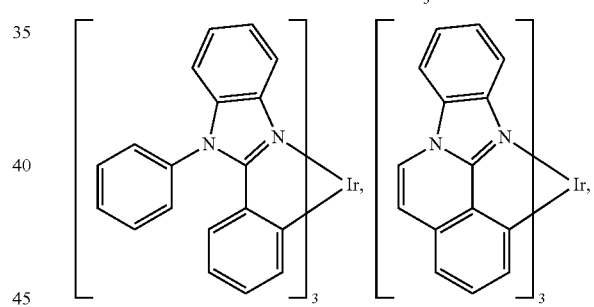
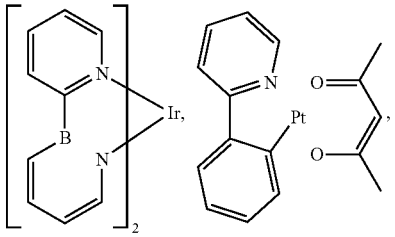
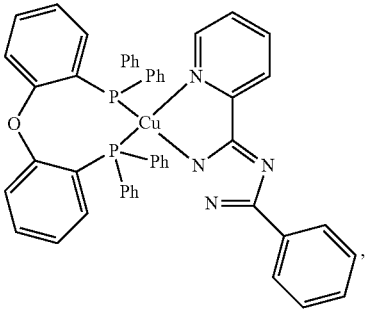

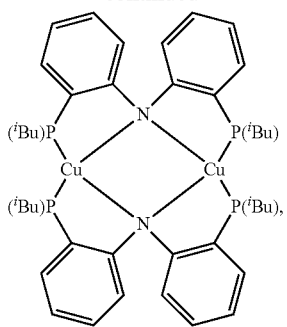
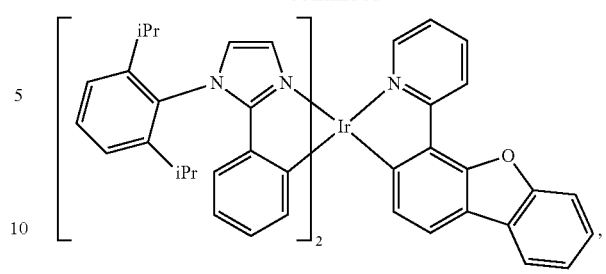
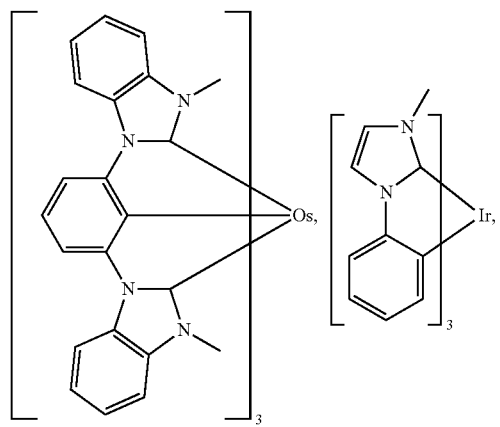
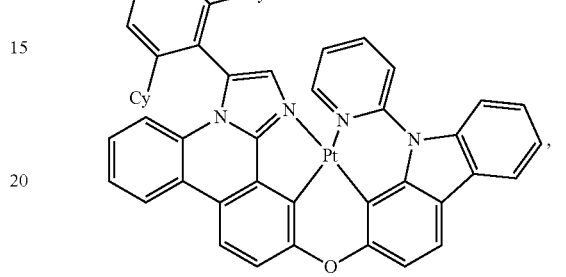
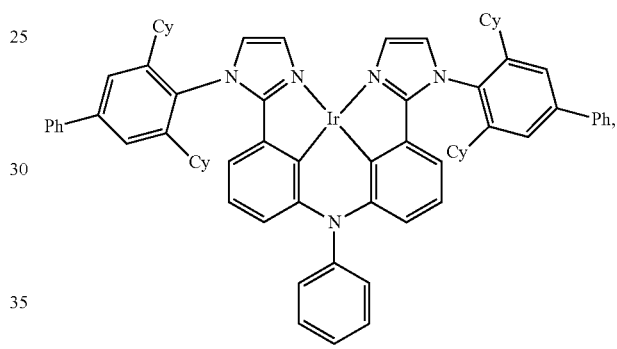
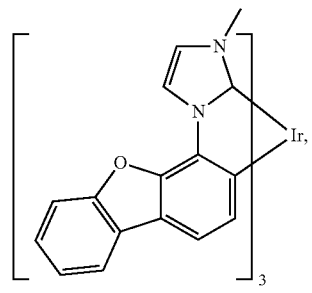
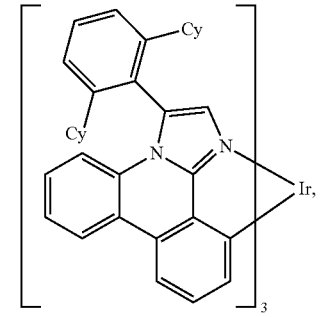
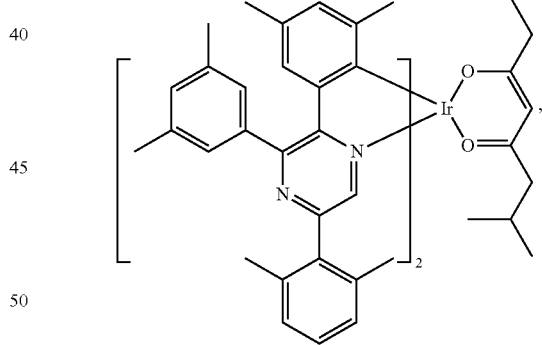
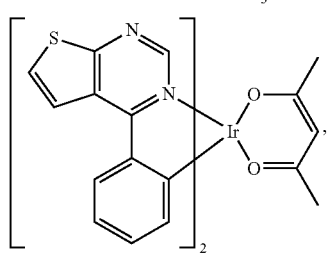
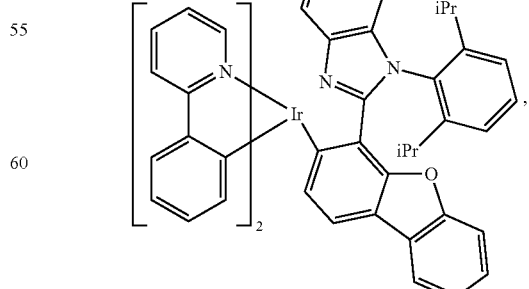

117
-continued
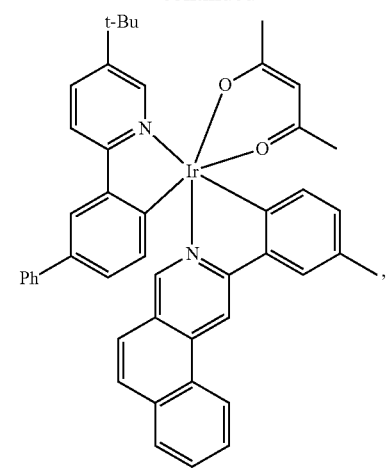
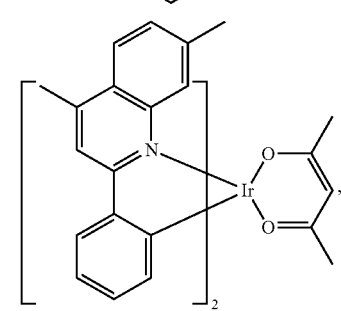
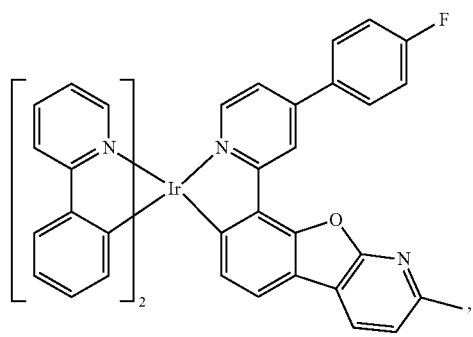
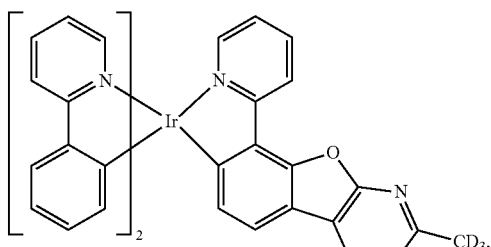
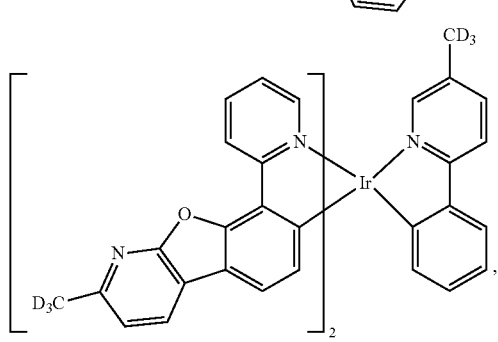
118
-continued
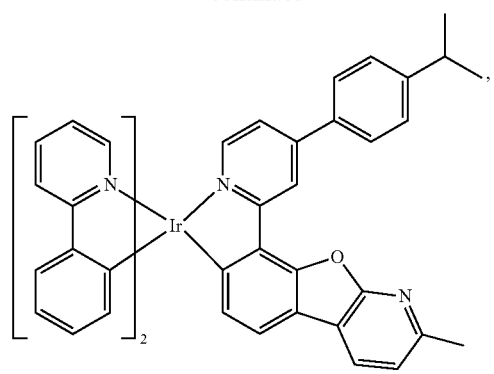
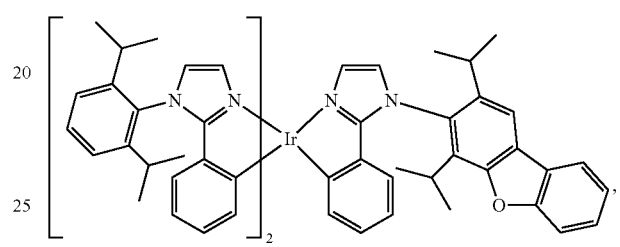
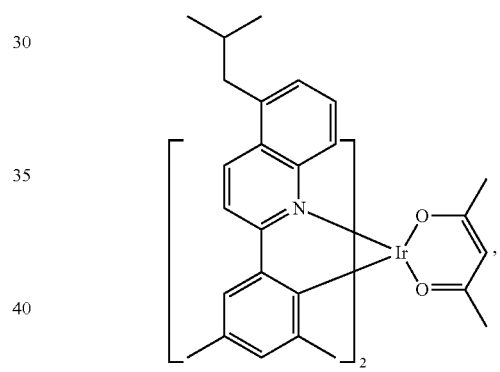
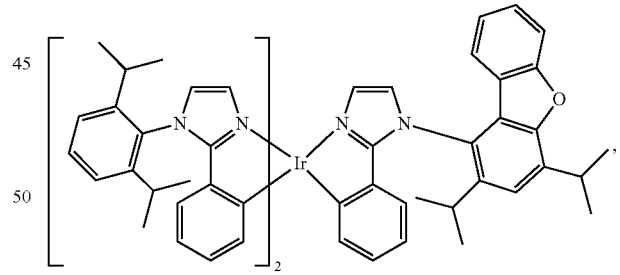
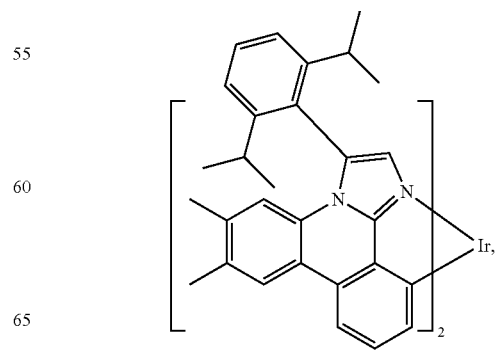

119
-continued
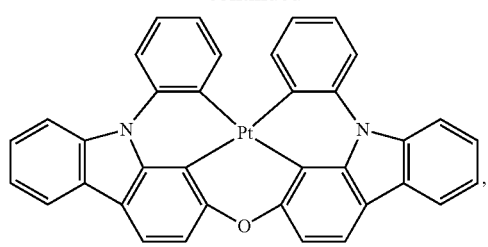
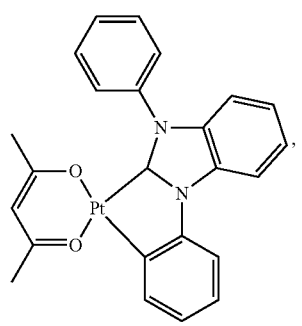
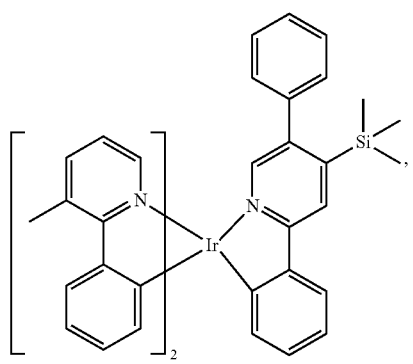
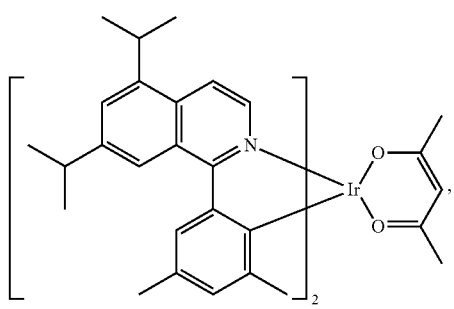
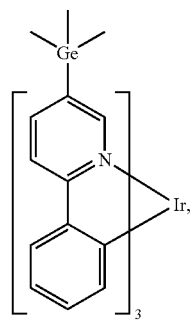
120
-continued
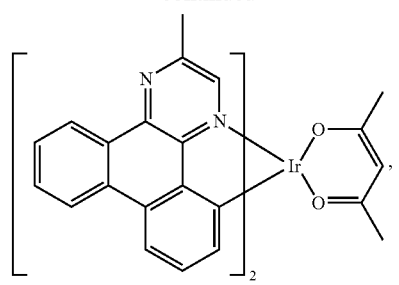
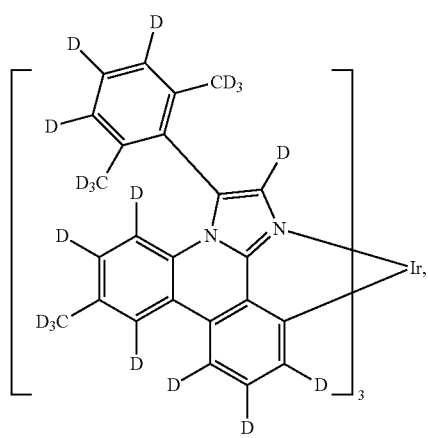
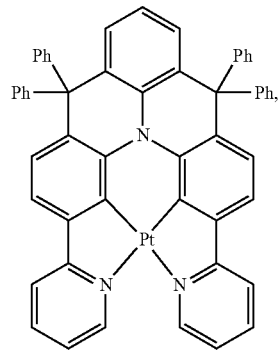
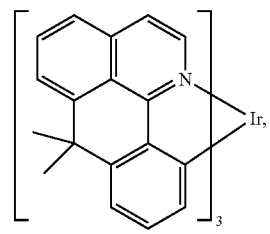
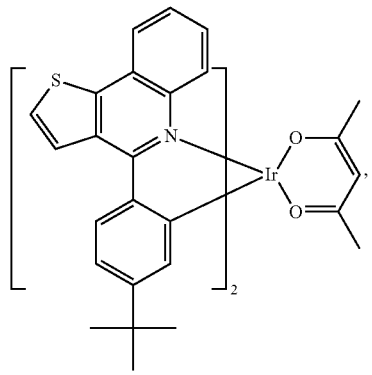

121
-continued
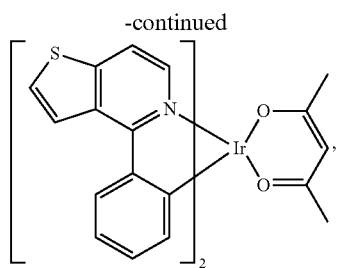
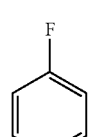
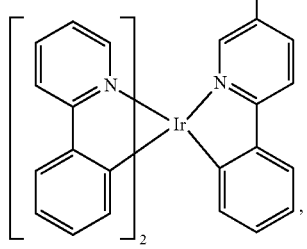
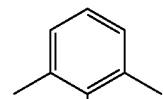
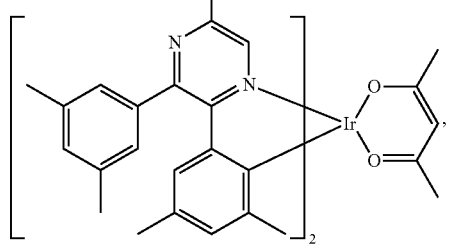
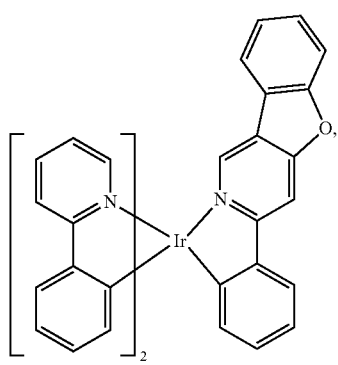
122
-continued
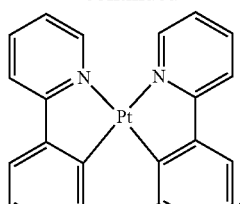
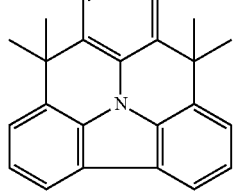
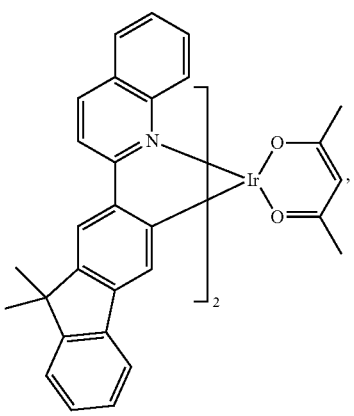
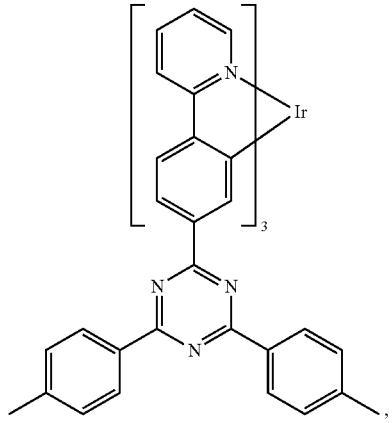
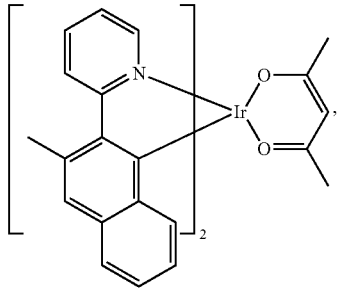

123
-continued
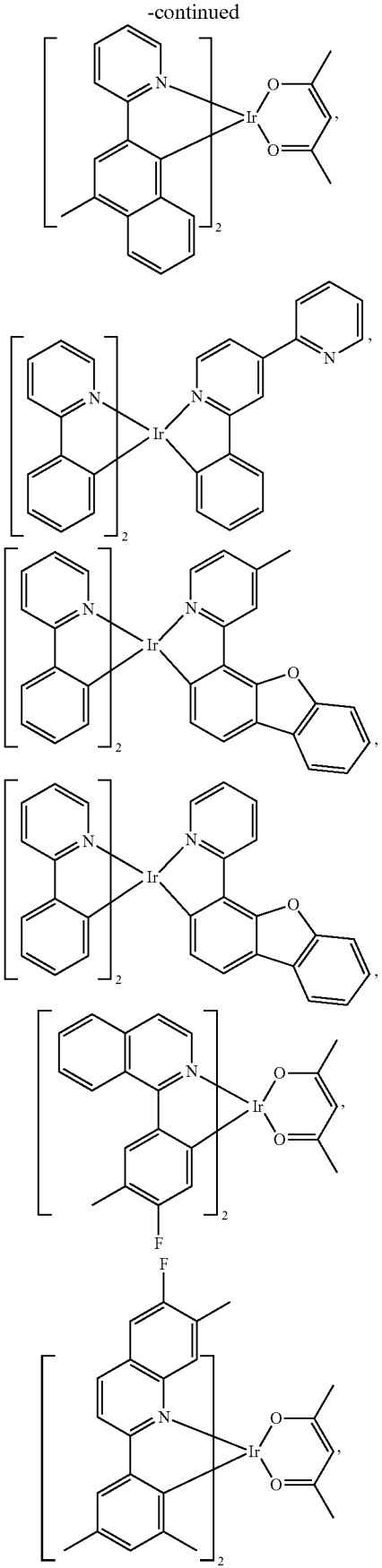
124
-continued
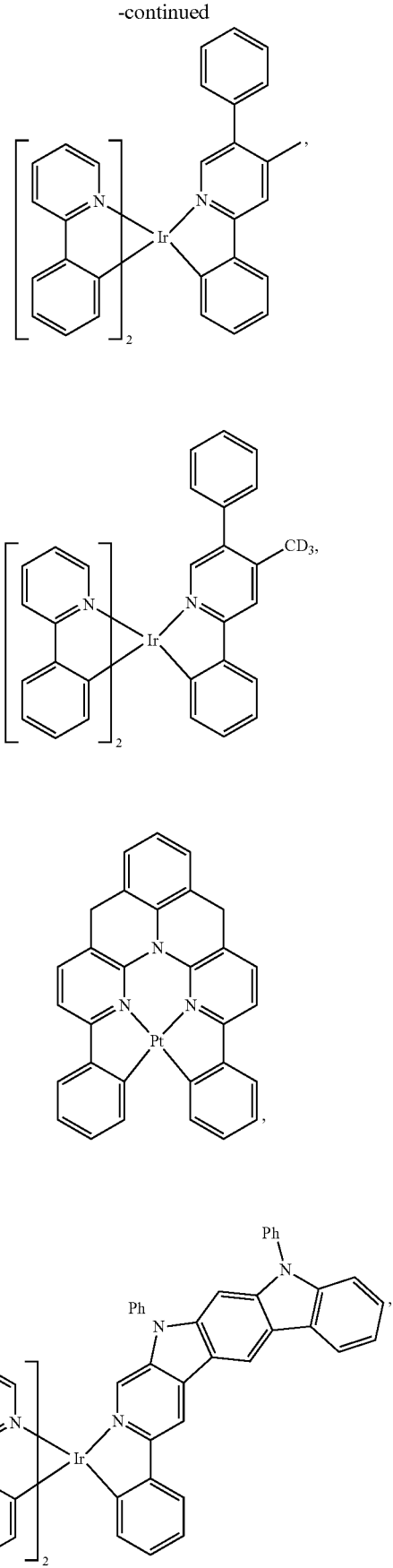

-continued
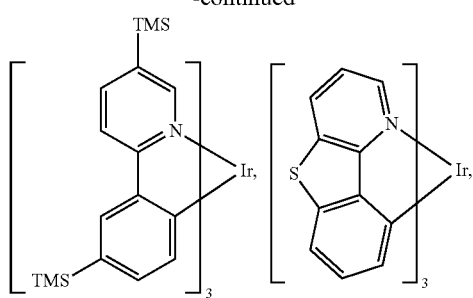
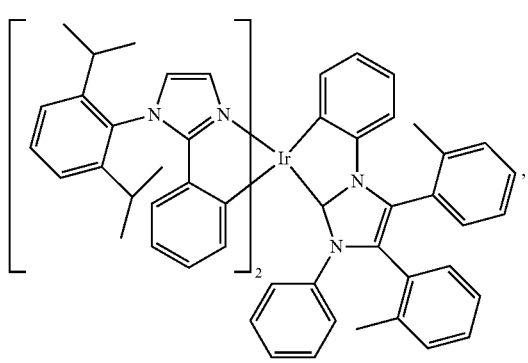
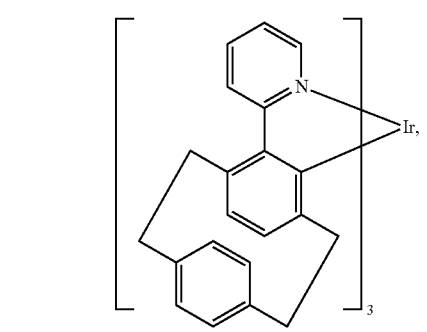
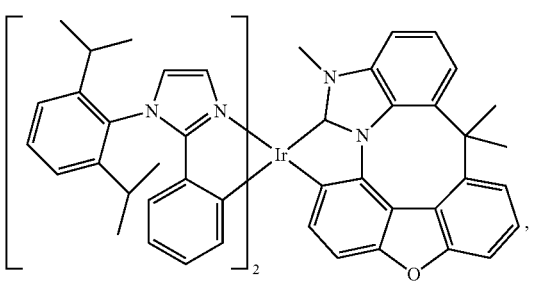
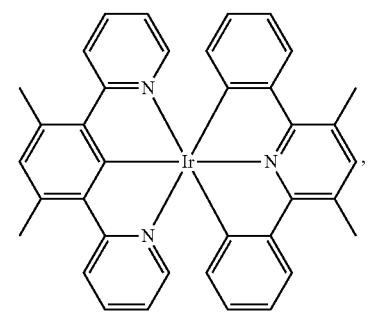
-continued
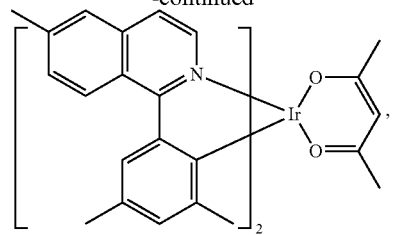
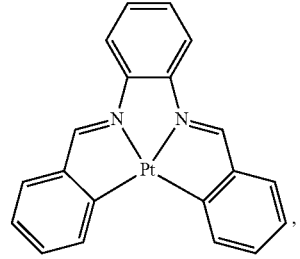
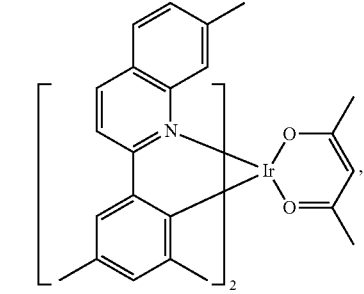
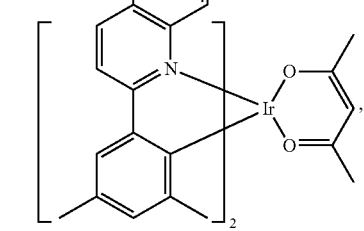
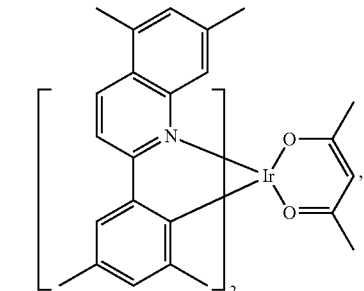
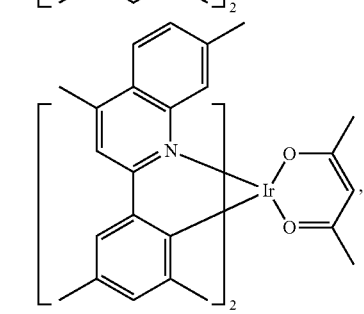

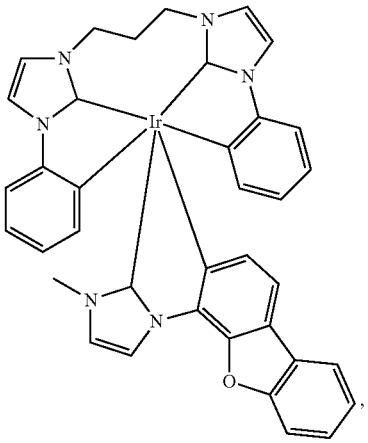
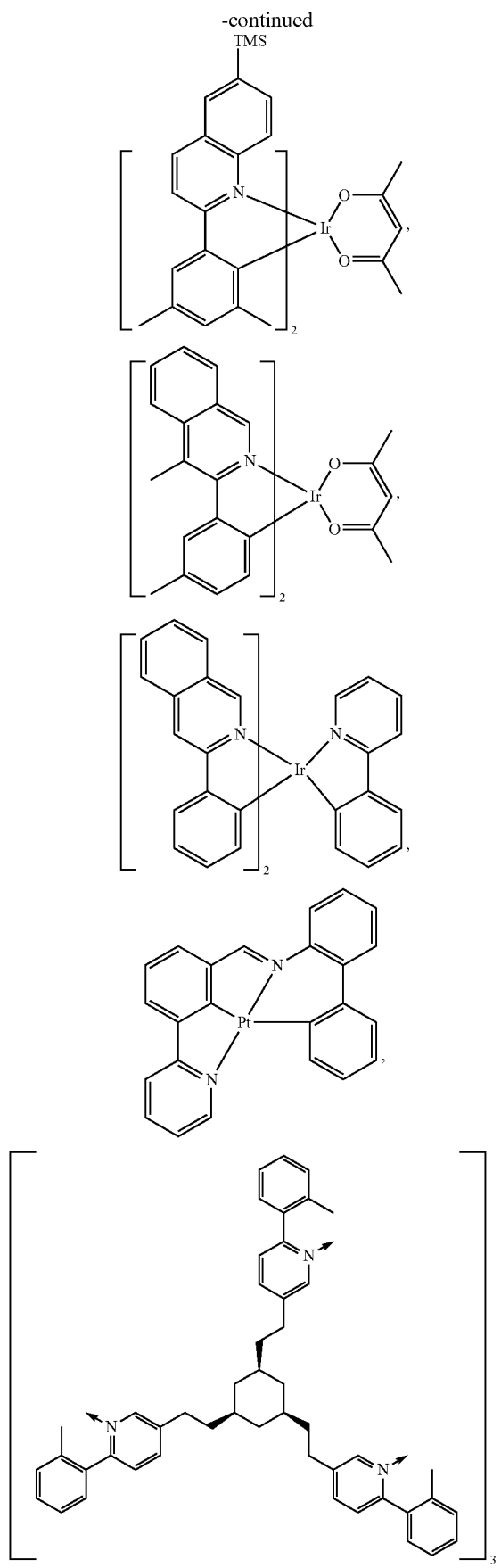

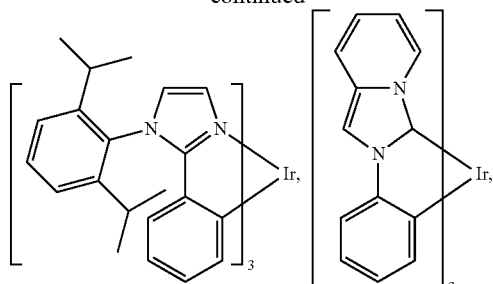
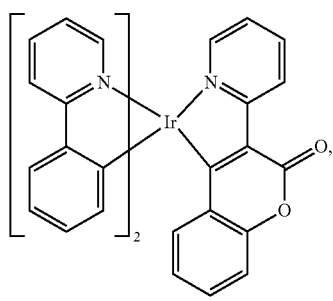
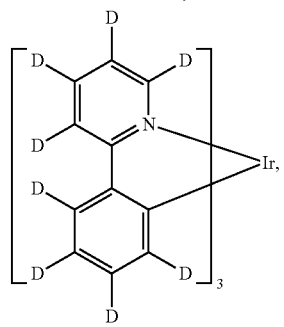
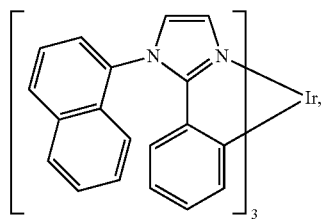
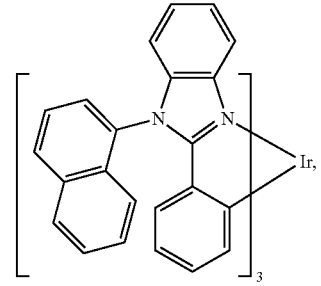
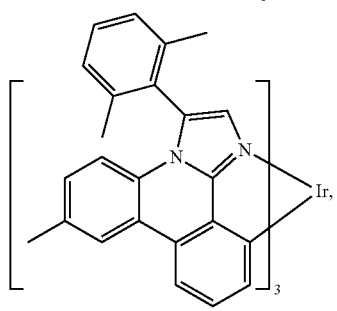

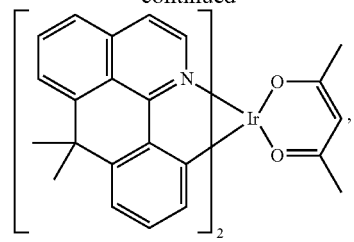
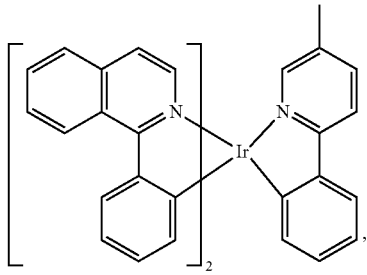
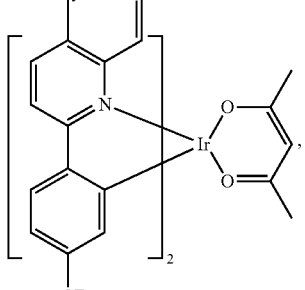
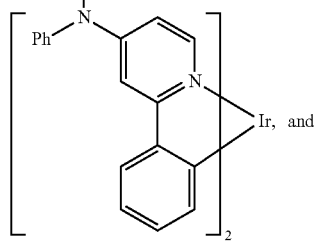
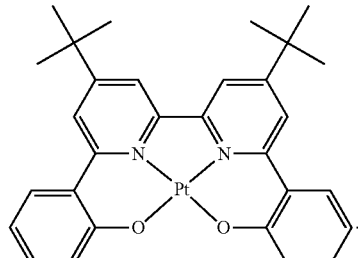

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

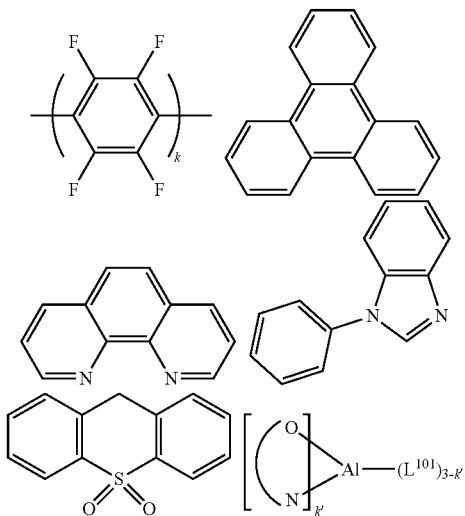

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

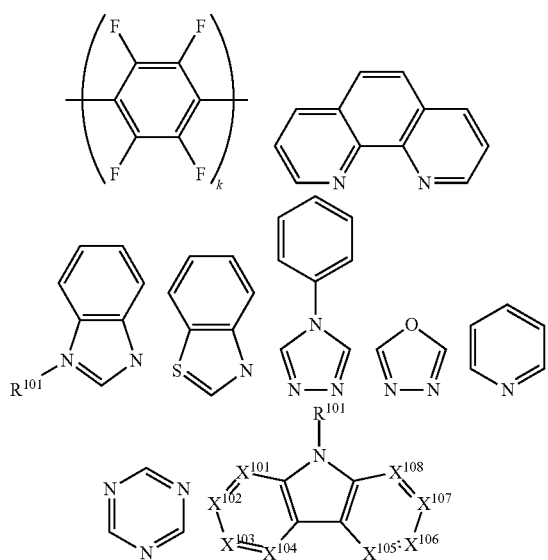

-continued

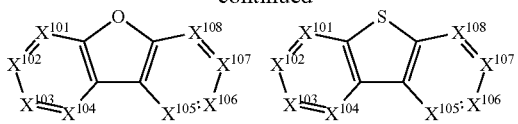

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

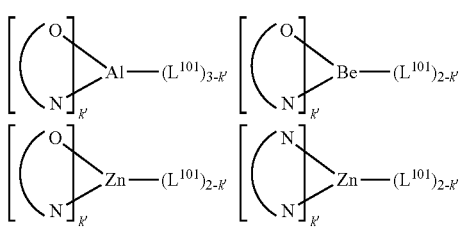

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

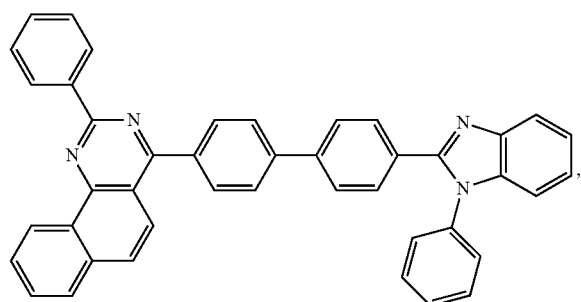
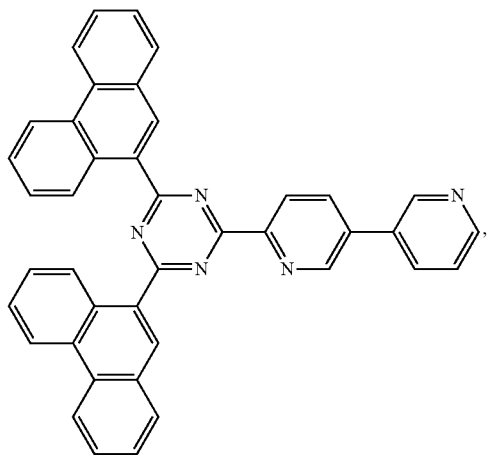
-continued
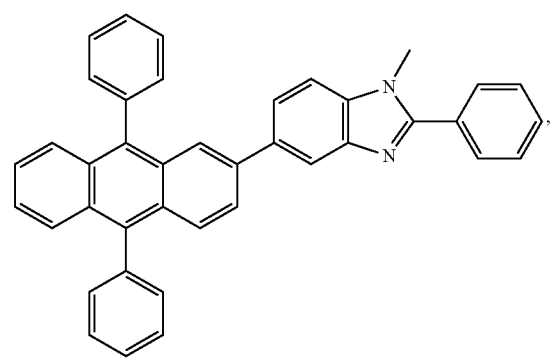
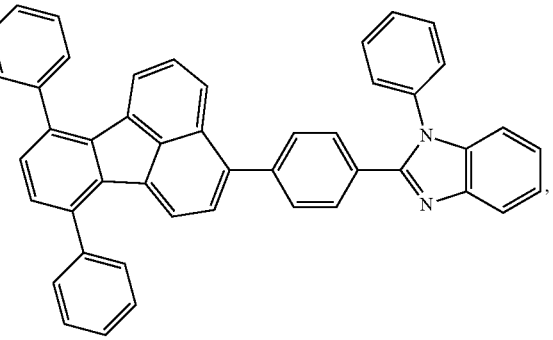
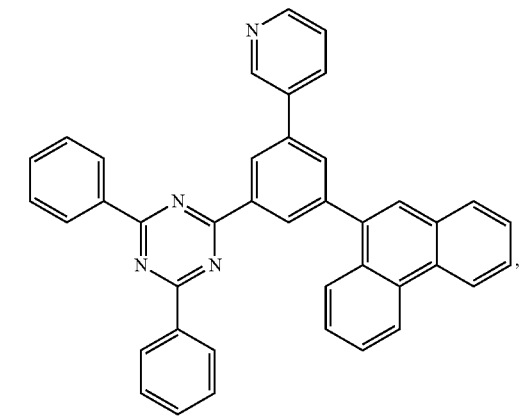
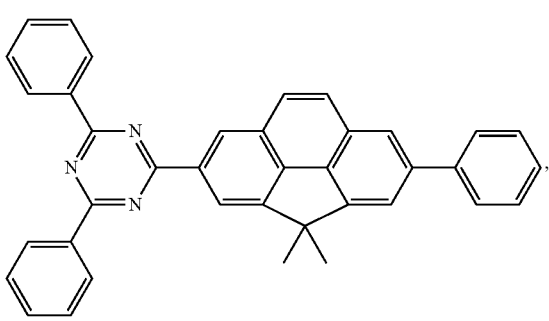
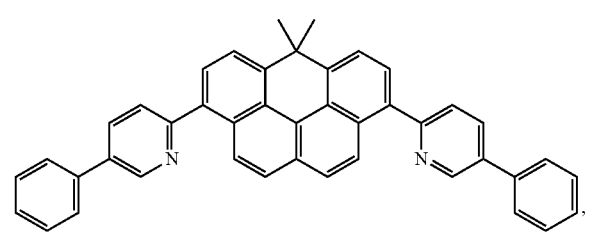

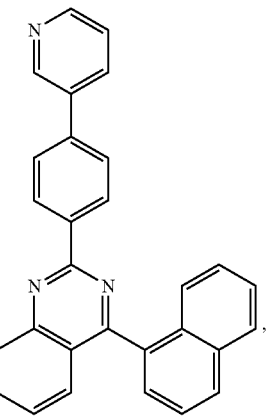
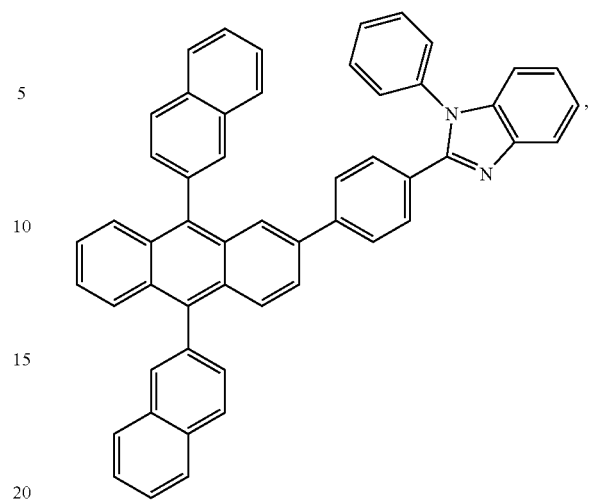
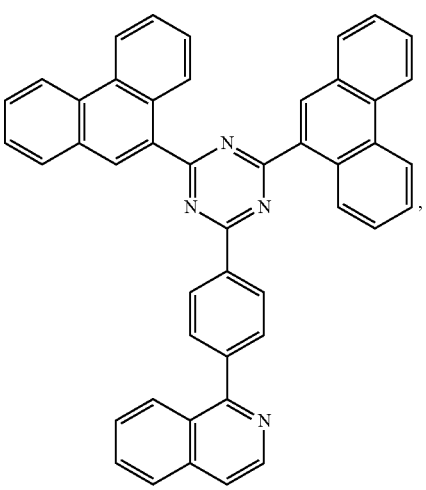
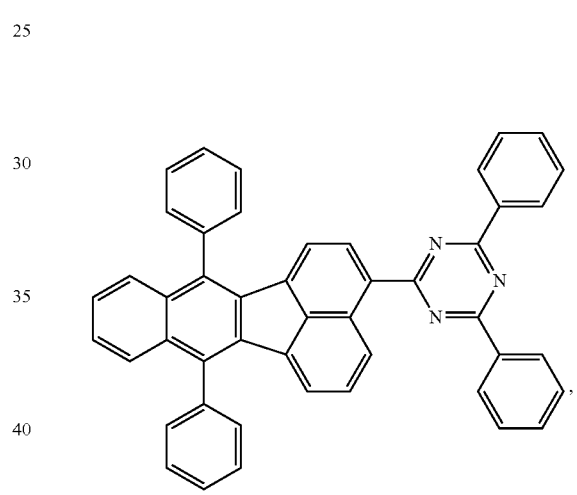
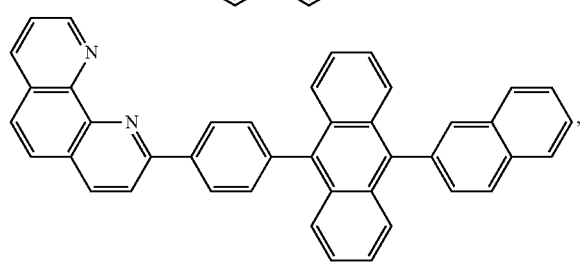
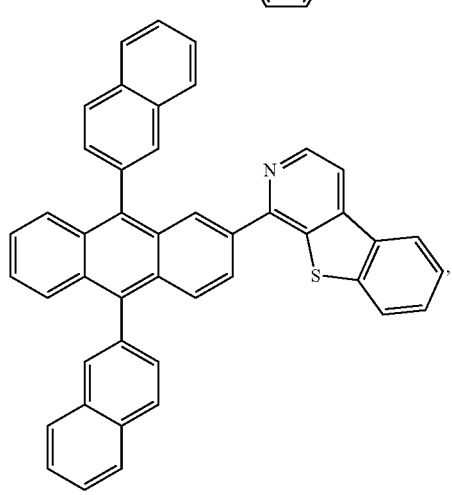
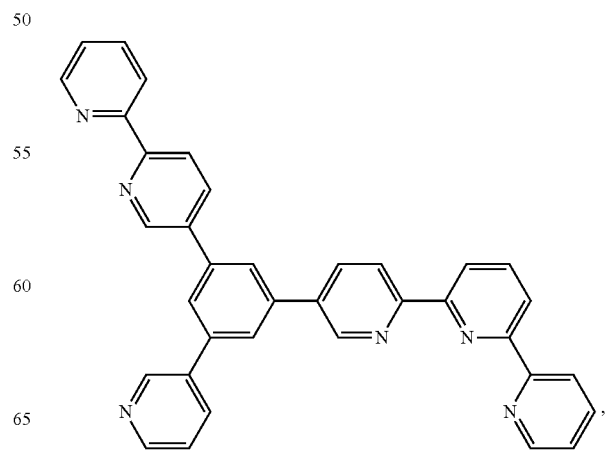

-continued
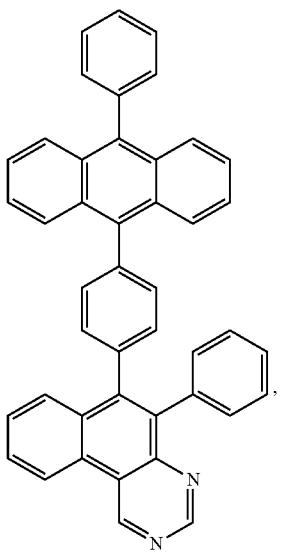
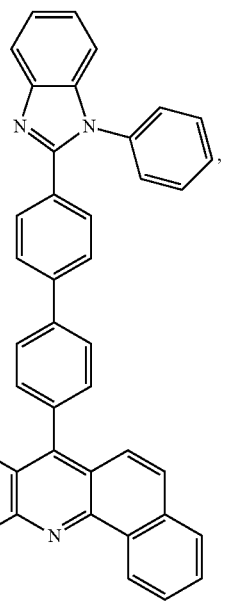
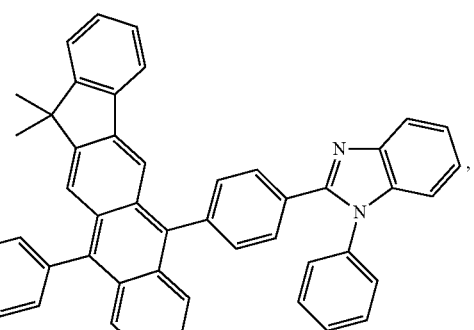
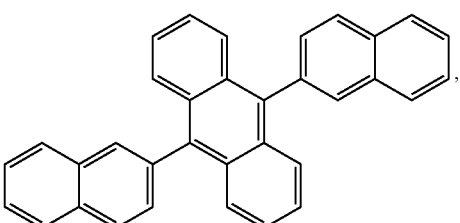
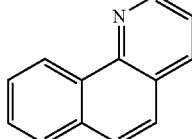
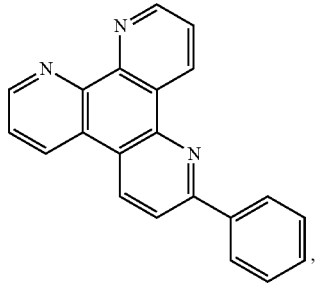

139
-continued
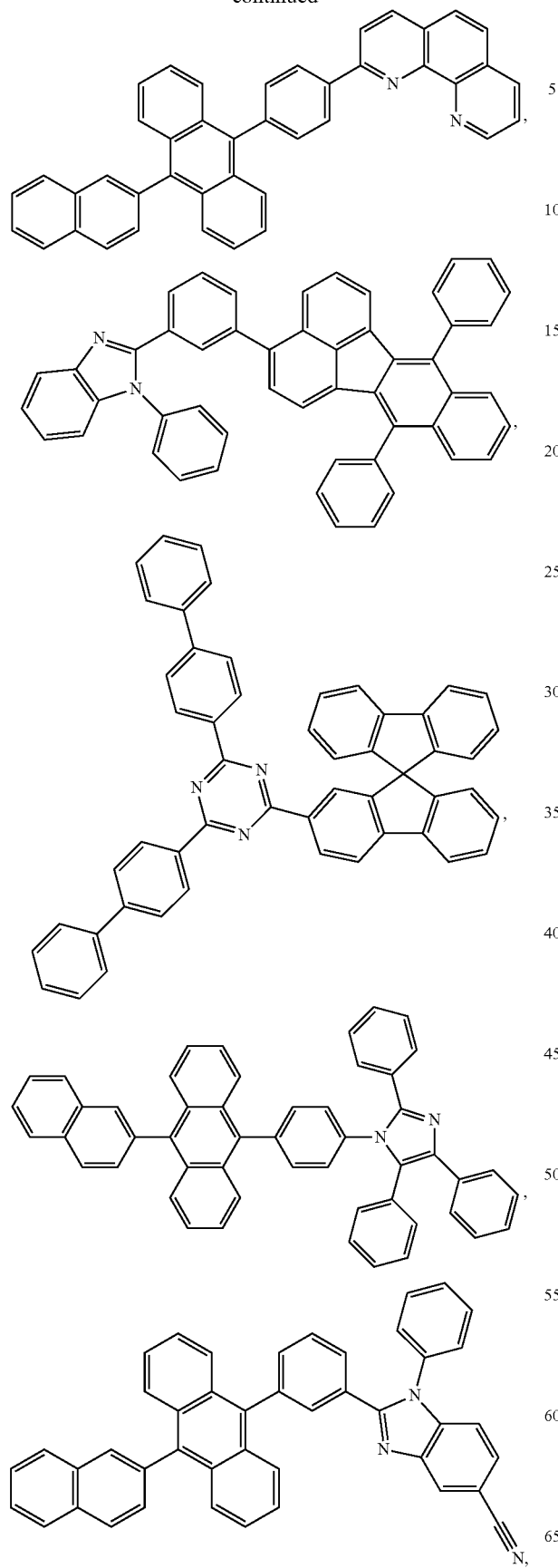
140
-continued
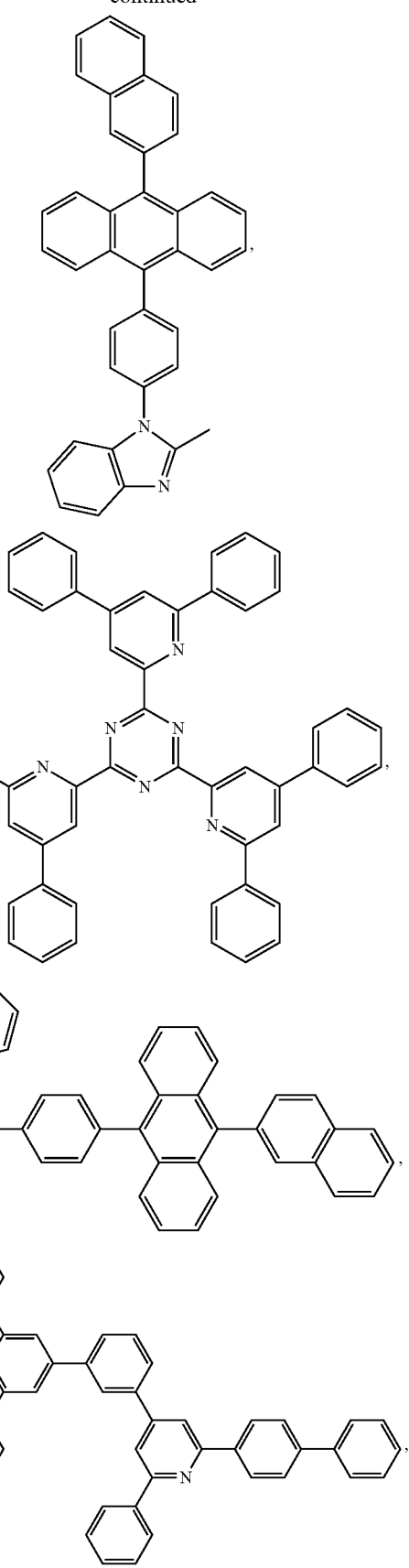

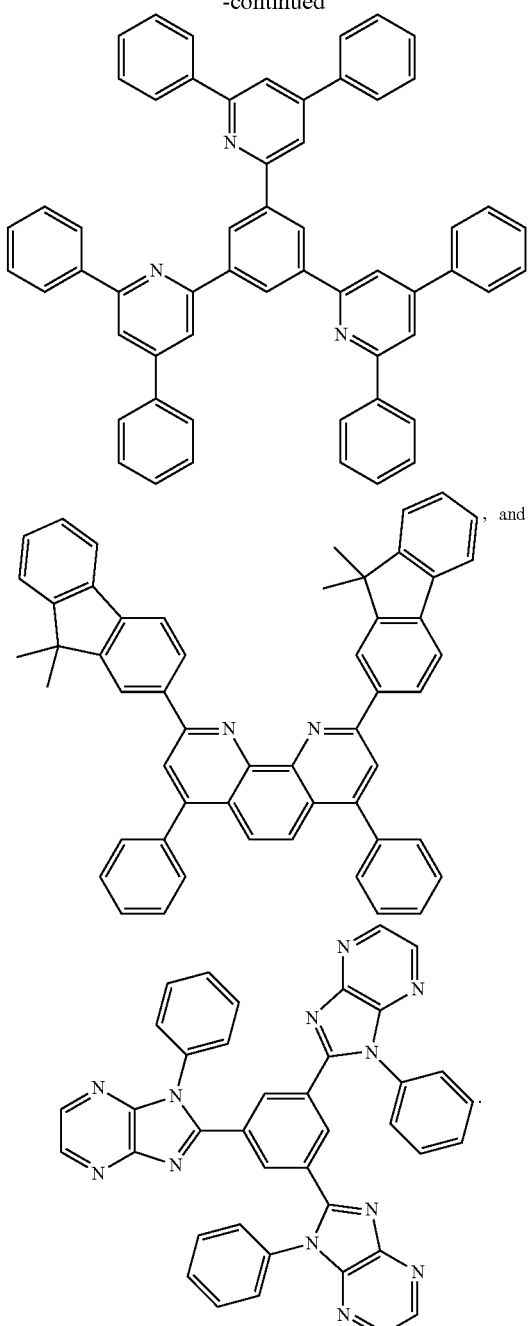

, and

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:
1. An organic light emitting device (OLED) comprising:
   an anode;
   a cathode;
   a first organic layer, disposed between the anode and the cathode;
   wherein the first organic layer comprises a primary phosphorescent emitter and a first host;
   wherein one of the following conditions is true:
      (1) the first organic layer further comprises a secondary emitter; or
      (2) the OLED further comprises a second organic layer disposed between the anode and the cathode, wherein the second organic layer comprises a secondary emitter;
   wherein the primary phosphorescent emitter has a peak emission wavelength λmax that is ≥600 nm and ≤750 nm;
   wherein the secondary emitter has a peak emission wavelength λmax that is ≥750 nm;
   wherein the primary phosphorescent emitter is capable of transferring energy to the secondary emitter;
   wherein the first host has a lowest excited state triplet energy T1 that is at least 0.1 eV higher than that of the primary phosphorescent emitter;
   wherein the primary phosphorescent emitter has the formula $Pt(L^1)_m$;
   wherein $L^1$ can represent one or more ligands that are the same or different;
   wherein each $L^1$ is independently monodentate or multidentate;
   wherein m represents a maximum possible number of ligands $L^1$ that can coordinate to Pt.
2. The OLED of claim 1, wherein the condition (1) is true, and the first organic layer is the only layer containing the secondary emitter.
3. The OLED of claim 1, wherein the condition (2) is true, and the second organic layer is the only layer containing the secondary emitter.
4. The OLED of claim 1, wherein the secondary emitter has a peak absorption wavelength and the difference between the peak emission wavelength $\lambda_{max}$ of the primary phosphorescent emitter and the peak absorption wavelength $\lambda_{max}$ of the secondary emitter is less than 200 nm.
5. The OLED of claim 1, wherein the first organic layer and the second organic layer are separated by one or more additional organic layers.
6. The OLED of claim 5, wherein the separation between the first organic layer and the second organic layer is ≥1 nm.

7. The OLED of claim 1, wherein the condition (1) is true, and the concentration of the primary phosphorescent emitter and concentration of the secondary emitter in the first organic layer are different.

8. The OLED of claim 1, wherein the condition (1) is true, and the concentration of the primary phosphorescent emitter and the concentration of the secondary emitter in the first organic layer are each ≤10 wt. %.

9. The OLED of claim 1, wherein the condition (1) is true, and an average intermolecular distance between the primary phosphorescent emitter and the secondary emitter is ≥8 Å.

10. The OLED of claim 1, wherein the secondary emitter has the formula $M^2L^2_n$;
wherein $M^2$ is selected from the group consisting of the lanthanide metals;
wherein $L^2$ represents one or more ligands that are the same or different;
wherein each $L^2$ is independently monodentate or multidentate; and
wherein n represents a maximum possible number of $L^2$ ligands that can coordinate to $M^2$.

11. The OLED of claim 10, wherein the primary phosphorescent emitter has a lowest triplet energy T1 that is the same or higher than the energy of the emissive f-f transition Eff of the secondary emitter.

12. The OLED of claim 10, wherein $M^2$ is selected from the group consisting of Eu, Nd, Yb, and Er.

13. The OLED of claim 10, wherein the secondary emitter $M^2L^2_n$ is selected from the group consisting of:

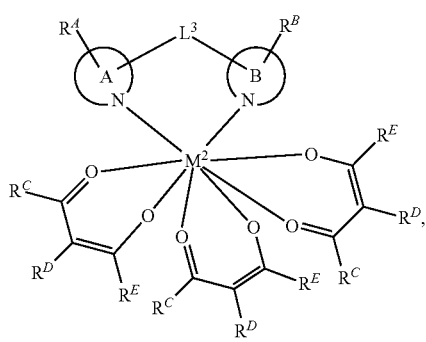

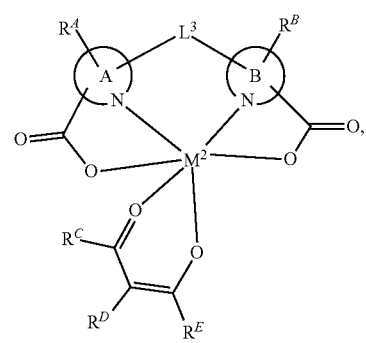

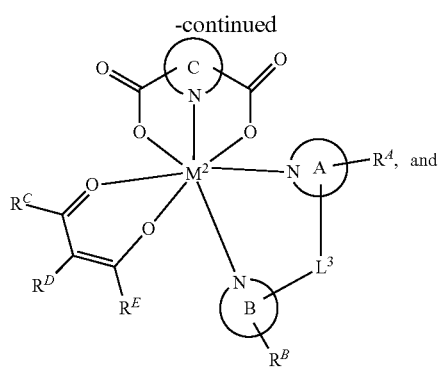

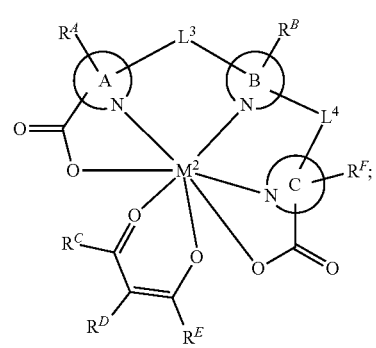

wherein rings A, B, and C are each independently a 5-membered or 6-membered carbocyclic or heterocyclic ring;
wherein $R^A$, $R^B$, $R^C$, $R^D$, $R^E$, and $R^F$ can represent mono to the maximum possible substitution, or no substitution;
wherein $R^A$, $R^B$, $R^C$, $R^D$, $R^E$, and $R^F$ are each independently a hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, benzonitrile, isonitrile, sulfanyl, sulfinyl, sulfonyl, phosphino, and combinations thereof; and
wherein $L^3$ and $L^4$ are each independently selected from direct bond, BR, NR, PR, O, S, Se, C=O, S=O, SO2, CRR', SiRR', GeRR', alkyl, cycloalkyl, and combinations thereof.

14. The OLED of claim 1, wherein the secondary emitter is selected from a group consisting of a fluorescent emitter, a thermally activated delayed fluorescence emitter, and an emitter containing an unpaired electron in its ground state.

15. The OLED of claim 1, wherein the primary phosphorescent emitter has a formula of $Pt(L_A)_x(L_B)_y(L_C)_z$;
wherein $L_A$, $L_B$ and $L_C$ are each a bidentate ligand; and
wherein x is 1, 2, or 3; y is 0, 1, or 2; z is 0, 1, or 2; and x+y+z is the oxidation state of Pt.

16. The OLED of claim 15, wherein $L_A$, $L_B$, and $L_C$ are each independently selected from the group consisting of:
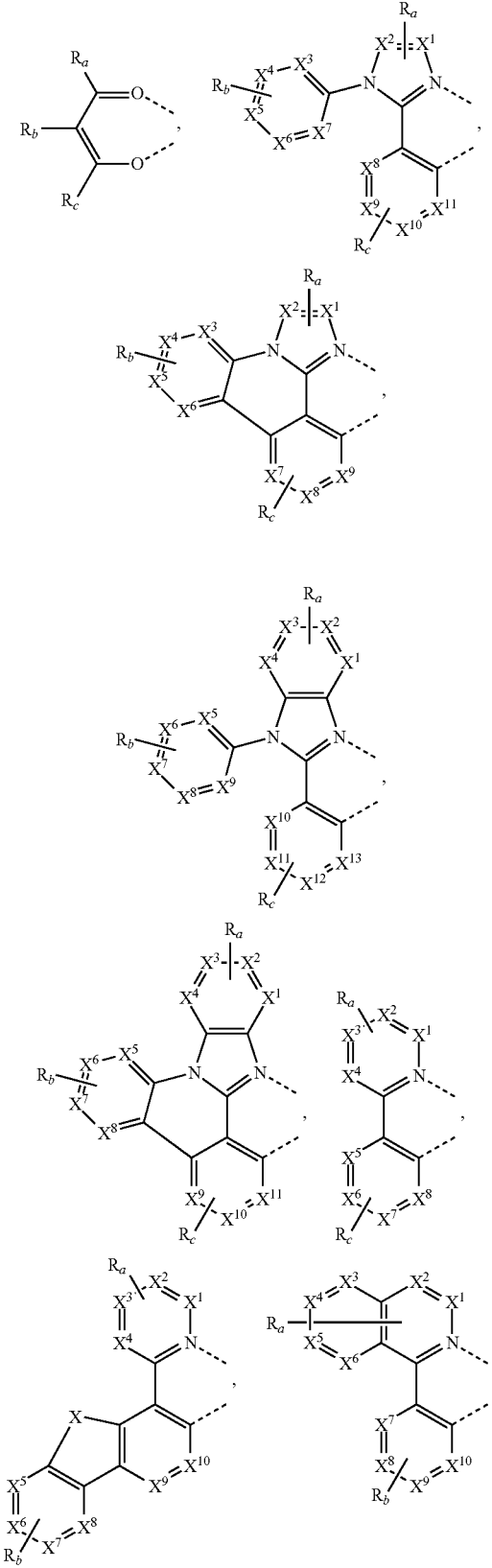
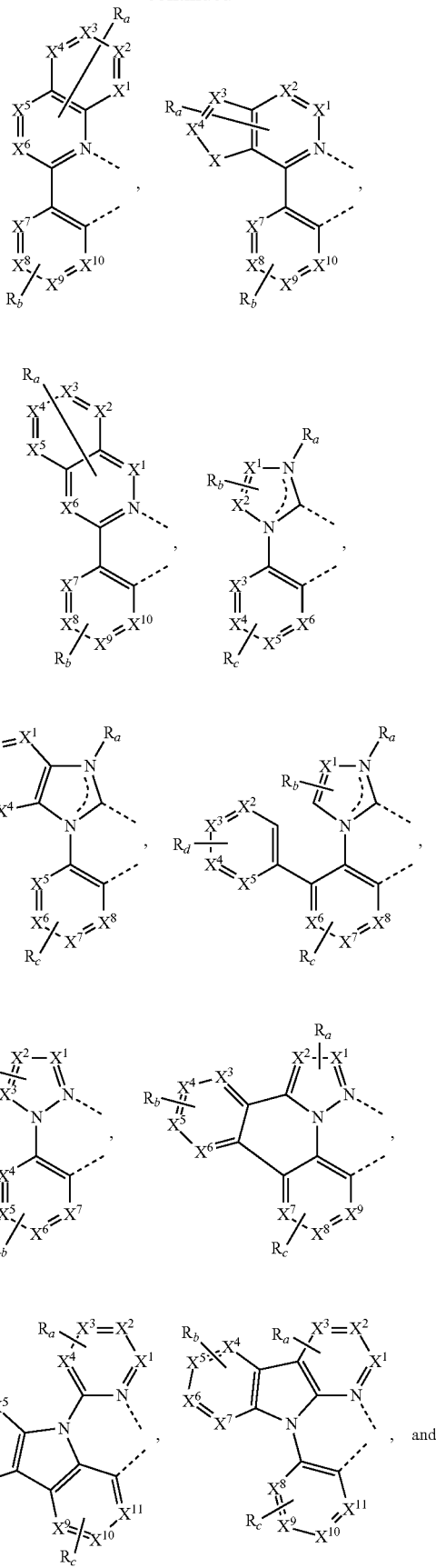

-continued

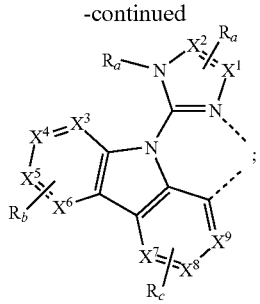

wherein each $X^1$ to $X^{13}$ are independently selected from the group consisting of carbon and nitrogen;

wherein X is selected from the group consisting of BR', NR', PR', O, S, Se, C=O, S=O, $SO_2$, CR'R", SiR'R", and GeR'R";

wherein R' and R" are optionally fused or joined to form a ring;

wherein each $R_a$, $R_b$, $R_c$, and $R_d$ can represent from mono substitution to the possible maximum number of substitution, or no substitution;

wherein R', R", $R_a$, $R_b$, $R_c$, and $R_d$ are each independently a hydrogen or a substitutent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, benzonitrile, isonitrile, sulfanyl, sulfinyl, sulfonyl, phosphino, and combinations thereof; and wherein any two adjacent substitutents of $R_a$, $R_b$, $R_c$, and $R_d$ are optionally fused or joined to form a ring or form a multidentate ligand.

17. The OLED of claim 1, wherein the first host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

18. A consumer product comprising an OLED comprising:
an anode;
a cathode; and
a first organic layer disposed between the anode and the cathode;
wherein the first organic layer comprises a primary phosphorescent emitter and a first host;
wherein one of the following conditions is true:
(1) the first organic layer further comprises a secondary emitter; or
(2) the OLED further comprises a second organic layer disposed between the anode and the cathode, wherein the second organic layer comprises a secondary emitter;
wherein the primary phosphorescent emitter has a peak emission wavelength λmax that is ≥600 nm and ≤750 nm;
wherein the secondary emitter has a peak emission wavelength λmax that is ≥750 nm;
wherein the primary phosphorescent emitter is capable of transferring energy to the secondary emitter;
wherein the first host has a lowest excited state triplet energy T1 that is at least 0.1 eV higher than that of the primary phosphorescent emitter;
wherein the primary phosphorescent emitter has the formula $Pt(L^1)_m$;
wherein $L^1$ can represent one or more ligands that are the same or different;
wherein each $L^1$ is independently monodentate or multidentate;
wherein m represents a maximum possible number of ligands $L^1$ that can coordinate to Pt;
wherein the consumer product is one of a flat panel display, a computer monitor, a medical monitors television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable OLED, a laptop computer, a digital camera, a camcorder, a viewfinder, a micro-display, a 3-D display, a virtual reality or augmented reality display, a vehicle, a large area wall, a theater or stadium screen, a light therapy device, or a sign.

* * * * *

UNITED STATES PATENT AND TRADEMARK OFFICE
CERTIFICATE OF CORRECTION

| | | |
|---|---|---|
| PATENT NO. | : 12,239,013 B2 | Page 1 of 1 |
| APPLICATION NO. | : 18/364552 | |
| DATED | : February 25, 2025 | |
| INVENTOR(S) | : Eric A. Margulies et al. | |

It is certified that error appears in the above-identified patent and that said Letters Patent is hereby corrected as shown below:

In the Claims

In Claim 13, Column 144, Lines 1-19, please delete the chemical structure

"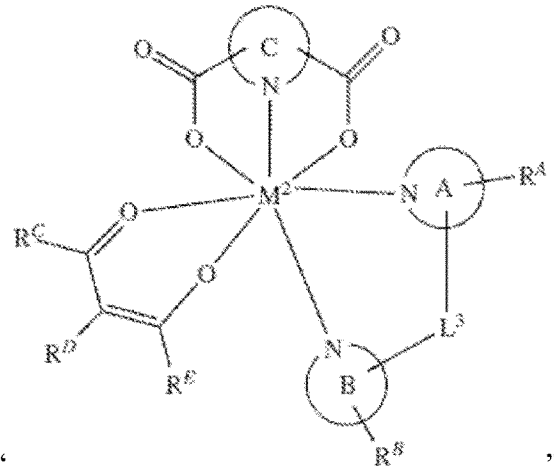" and insert

--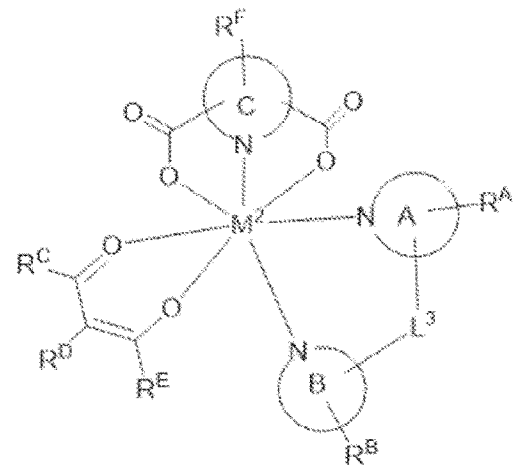--

Signed and Sealed this
Twenty-fifth Day of March, 2025

Coke Morgan Stewart
*Acting Director of the United States Patent and Trademark Office*